(12) United States Patent
Otake et al.

(10) Patent No.: US 12,745,437 B2
(45) Date of Patent: Sep. 22, 2026

(54) NITRIDE SEMICONDUCTOR DEVICE AND MANUFACTURING METHOD THEREFOR

(71) Applicant: ROHM CO., LTD., Kyoto (JP)

(72) Inventors: Hirotaka Otake, Kyoto (JP); Manabu Yanagihara, Kyoto (JP); Kazuya Nagase, Kyoto (JP); Shinya Takado, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 640 days.

(21) Appl. No.: 18/036,893

(22) PCT Filed: Oct. 7, 2021

(86) PCT No.: PCT/JP2021/037182
§ 371 (c)(1),
(2) Date: May 15, 2023

(87) PCT Pub. No.: WO2022/113536
PCT Pub. Date: Jun. 2, 2022

(65) Prior Publication Data

US 2023/0420517 A1 Dec. 28, 2023

(30) Foreign Application Priority Data

Nov. 26, 2020 (JP) ................................ 2020-196201
Mar. 12, 2021 (JP) ................................ 2021-039959
Aug. 30, 2021 (JP) ................................ 2021-140470

(51) Int. Cl.
*H10D 62/10* (2025.01)
*H10D 30/01* (2025.01)
(Continued)

(52) U.S. Cl.
CPC ......... *H10D 62/125* (2025.01); *H10D 30/015* (2025.01); *H10D 30/4755* (2025.01);
(Continued)

(58) Field of Classification Search
CPC ............... H10D 62/125; H10D 62/102; H10D 62/8503; H10D 62/258; H10D 62/343;
(Continued)

(56) References Cited

U.S. PATENT DOCUMENTS

2007/0254419 A1* 11/2007 Kanda ................ H10F 39/1865
257/E29.253
2009/0121775 A1* 5/2009 Ueda ...................... H10D 12/00
257/E29.093
(Continued)

FOREIGN PATENT DOCUMENTS

CN 110137253 A 8/2019
CN 111682066 A 9/2020
(Continued)

OTHER PUBLICATIONS

Office Action dated Jan. 15, 2025 in corresponding German patent application No. 112021005668.9 (15 pages; with English translation).

(Continued)

*Primary Examiner* — Marc-Anthony Armand
(74) *Attorney, Agent, or Firm* — XSENSUS LLP

(57) ABSTRACT

A nitride semiconductor device includes a source electrode that is in contact with a second nitride semiconductor layer via a first opening portion and with which a portion is formed above a passivation film and a drain electrode that is in contact with the second nitride semiconductor layer via a second opening portion and with which a portion is formed above the passivation film such as to oppose the source electrode across a ridge portion, and the third nitride semiconductor layer has, between a ridge portion side end of the first opening portion and a first opening portion end of the ridge portion and/or between a ridge portion side end of the drain electrode and a second opening portion end of the ridge portion, an extension portion that extends outward
(Continued)

from a portion below a thickness intermediate position of at least one side surface of the ridge portion.

37 Claims, 34 Drawing Sheets

(51) Int. Cl.
*H10D 30/47* (2025.01)
*H10D 62/85* (2025.01)
*H10D 64/23* (2025.01)

(52) U.S. Cl.
CPC ....... *H10D 62/102* (2025.01); *H10D 62/8503* (2025.01); *H10D 64/258* (2025.01)

(58) Field of Classification Search
CPC .. H10D 62/126; H10D 62/117; H10D 62/106; H10D 30/015; H10D 30/4755
See application file for complete search history.

(56) References Cited

U.S. PATENT DOCUMENTS

2012/0274402 A1 11/2012 Kocon
2020/0176595 A1* 6/2020 Otake .................. H10D 30/015

FOREIGN PATENT DOCUMENTS

JP 2011-109131 A 6/2011
JP 2015115371 A 6/2015
JP 2017-073506 A 4/2017
WO 2020/213291 A1 10/2020

OTHER PUBLICATIONS

International Search Report and Written Opinion mailed on Dec. 21, 2021, received for PCT Application PCT/JP2021/037182, filed on Oct. 7, 2021, 13 pages including English Translation.
Japanese Office Action issued Apr. 11, 2024 in corresponding Japanese Patent Application No. 2023-134033, 8 pages.
Office Action dated Mar. 27, 2025 in corresponding Taiwanese patent application No. 110144179 (28 pages; with English machine translation).
Office Action dated Mar. 26, 2026 in corresponding German patent application No. 112021005668.9 (8 pages; with 1 English translation).

* cited by examiner 11
9
11A
62
62B
62A
20
(6)
61
7
6
63
63A
63B
11B
11C
8
12
10
5
13
4
3
2
1

71
5
4
3
2
74
7(72)
73

5
4
3
2
63
63B
63A
74
73
20
7
(6)
61
6
62
62A
62B 5
4
3
2
8
63
63A
63B
20
7
(6)
61
6
62
62A
62B 5
4
3
2
10
8
63
63A
63B
20
7
(6)
61
6
62
62A
62B
9

5
4
3
2
10
8
76
63
63A
63B
20
(6)
61
7
6
62
62B
62A
9

Time to Breakdown [sec]
1×10^9
1×10^8
1×10^7
1×10^6
1×10^5
1×10^4
1×10^3
1×10^2
Room temperature
50% Failure
6
7
8
9
10
11
12
Vgs (V)

Vds, Vgs
Vds
Vgs = 5V
T3
time
T1
T2

Collapse Facotor
Vds (V)
0
1
2
3
4
0
20
40
60
80
100

1A
2
3
4
5
13
6
7
61
(6)
20
8
9
10
11
11A
11B
11C
12
62
62C
62D
63
63C
63D 71
5
4
3
2
92
74
91
73
7

5
4
3
2
63
63D
63C
20
7
(6)
61
62
62C
62D 11
9
11A
68(6)
62
62B
62A
20
(6)
61
7
6
63
63A
63B
11B
11C
8
12
68(6)
10
5
13
4
3
2
1B 11
9
11A
62
62B 62A
20
(6) 61
7
63
63A 63B
11B
11C
8
12
10
5
13
4
3
2
68(6)
6
1C 13
4
3
2
10
12
t2
8
52(5)
11C
11B
63
63A 63B
51(5)
1D
20
(6) 61
7
6
t1
62
62B 62A
52(5)
11A
9
11

1
2
3
4
5
6
61
62(6)
63(6)
(6)
7
8
9
10
11
11A
11B
12
13
20

63
63
7B
102
9
10
12
7A
101
61
9
61
61
61
61
62
62
7
(7)
(7)
7B
7B
11
11
64
64
102
64
64
XIX
XIX
65(6)
9
61
9
61
10
12
7A
101
XVI
XVI
61
61
62
62
102
63
6
6
63
7B
1

11B(11)
7B(7)
64(6)
63(6)
65(6)
8
13
5
4
3
2
1

12
10
11
9
7A
63E
61
62
7
63
7B
62E
6
1E
101
102

102
101
102
63
7B
62E
63
61
7A
63F
11
9
7A
63F
61
62
7
12
10
62E
6
1F
7B 12
10
11
9
7A
63E
61
62
63F
7
63
7B
62E
6
1G
61
7A
63F
63E
102
101
102

12
10
11
63E
9
7A
63E
61
62
7
63
7B
6
1H
7B
63
63E
61
63E
7A
102
101
102

11
9
11A
66
61
(6)
20
7
67
11B
11C
8
12
10
5
13
4
3
2
6
201

11
9
11A
68A
20
(6)
61
7
6
68B
11B
11C
8
12
10
5
13
4
3
2
202

20
62
63
(6)
7
62G 62B 62A
61
11
63A 63B 63G
11A
11B
8
5
6
13
4

11
9
11A
62
62B
62A
20
(106)
61
7
63
63A
63B
11B
11C
8
12
10
5
13
4
3
2
106A
106B
106
11

NITRIDE SEMICONDUCTOR DEVICE AND MANUFACTURING METHOD THEREFOR

CROSS-REFERENCE TO RELATED APPLICATIONS

The present application is based on PCT filing PCT/JP2021/037182, filed Oct. 7, 2021, which claims priority to Japanese Patent Application No. 2020-196201 filed on Nov. 26, 2020, in the Japan Patent Office, Japanese Patent Application No. 2021-039959 filed on Mar. 12, 2021, in the Japan Patent Office, and Japanese Patent Application No. 2021-140470 filed on Aug. 30, 2021, in the Japan Patent Office, the entire disclosures of these applications are incorporated herein by reference.

TECHNICAL FIELD

The present disclosure relates to a nitride semiconductor device that is constituted of a group III nitride semiconductor (hereinafter referred to at times simply as "nitride semiconductor") and to a method for manufacturing the same.

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \le x \le 1$, $0 \le y \le 1$, $0 \le x+y \le 1$).

An HEMT (high electron mobility transistor) using such a nitride semiconductor has been proposed. Such an HEMT includes, for example, an electron transit layer constituted of GaN and an electron supply layer constituted of AlGaN epitaxially grown on the electron transit layer. A pair of source electrode and drain electrode are formed such as to contact the electron supply layer and a gate electrode is disposed therebetween.

Due to polarization caused by lattice mismatch of GaN and AlGaN, a two-dimensional electron gas (2DEG) is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and applications to power devices are thus being proposed, for example, in Patent Literature 1.

Patent Literature 1 discloses an arrangement where a p type GaN gate layer of a ridge shape is laminated on an AlGaN electron supply layer, a gate electrode is disposed thereon, and a channel is eliminated by a depletion layer spreading from the p type GaN gate layer to achieve a normally-off operation.

CITATION LIST

Patent Literature

Patent Literature 1: Japanese Patent Application Publication No. 2017-73506

Patent Literature 2: Japanese Patent Application Publication No. 2011-109131

SUMMARY OF INVENTION

Technical Problem

With a normally-off type HEMT that uses a p type GaN layer of a ridge shape, two components, namely, a semiconductor junction diode that is formed between the p type GaN layer and the electron supply layer/electron transit layer and a Schottky barrier diode that is formed between the p type GaN layer and the gate electrode are present between the gate and the source or between the gate and the drain and a gate withstand voltage is maintained thereby. However, when an excessive gate bias of positive direction as viewed from the gate is applied, holes are injected into the p type GaN layer from the Schottky barrier diode and due to accumulation of the holes between the electron supply layer and the p type GaN layer, band bending of the electron supply layer occurs and electron leakage increases. The normally-off type HEMT that uses the p type GaN layer of the ridge shape thus has a problem of being low in maximum rating of the gate voltage.

Also, with the normally-off type HEMT that uses the p type GaN layer of the ridge shape, the p type GaN layer of the ridge shape is basically formed by removing the p type GaN layer other than that of the gate portion by dry etching. A trap level of the etched surface thus increases due to the dry etching. Also, due to stopping the etching at an intermediate thickness of the AlGaN electron supply layer, the AlGaN electron supply layer diminishes in a vicinity of the gate electrode and a distance between the etched surface and the two-dimensional electron gas is shortened. Current collapse is thereby promoted.

An object of the present disclosure is to provide a nitride semiconductor device and a method for manufacturing the same with which improvement of gate withstand voltage and suppression of current collapse can be achieved.

Solution to Problem

A preferred embodiment of the present disclosure provides a nitride semiconductor device including a first nitride semiconductor layer that constitutes an electron transit layer, a second nitride semiconductor layer that is formed above the first nitride semiconductor layer, is greater in bandgap than the first nitride semiconductor layer, and constitutes an electron supply layer, a third nitride semiconductor layer that is formed selectively above the second nitride semiconductor layer, includes a ridge portion of a ridge shape, and contains an acceptor type impurity, a gate electrode that is formed above the ridge portion, a passivation film that is disposed on the second nitride semiconductor layer, the third nitride semiconductor layer, and the gate electrode and has a first opening portion and a second opening portion that are disposed across the ridge portion from each other, a source electrode that is in contact with the second nitride semiconductor layer via the first opening portion and with which a portion is formed above the passivation film, and a drain electrode that is in contact with the second nitride semiconductor layer via the second opening portion and with which a portion is formed above the passivation film such as to oppose the source electrode across the ridge portion, and where the third nitride semiconductor layer has, between the ridge portion side end of the first opening portion and the first opening portion end of the ridge portion and/or between the ridge portion side end of the drain electrode and the second opening portion end of the ridge portion, an extension portion that extends outward from a portion below a thickness intermediate position of at least one side surface of the ridge portion.

With this arrangement, a nitride semiconductor device with which improvement of gate withstand voltage and suppression of current collapse can be achieved can be realized.

In the preferred embodiment of the present disclosure, the source electrode is formed above the passivation film such as to cover a portion of the gate electrode, the second opening portion side end of the source electrode is positioned between the ridge portion and the second opening portion in plan view, and the third nitride semiconductor layer has, between the ridge portion side end of the first opening portion and the second opening portion end of the source electrode, the extension portion that extends outward from the portion below the thickness intermediate position of at least one side surface of the ridge portion.

In the preferred embodiment of the present disclosure, the extension portion includes a first extension portion that extends toward the first opening portion from a side surface of the ridge portion at the first opening portion side.

In the preferred embodiment of the present disclosure, the extension portion includes a second extension portion that extends toward the second opening portion from a side surface of the ridge portion at the second opening portion side.

In the preferred embodiment of the present disclosure, the extension portion includes a first extension portion that extends toward the first opening portion from a side surface of the ridge portion at the first opening portion side and a second extension portion that extends toward the second opening portion from a side surface of the ridge portion at the second opening portion side.

In the preferred embodiment of the present disclosure, the third nitride semiconductor layer includes a pair of the ridge portions that are disposed opposite each other across the first opening portion and a coupling portion that couples corresponding end portions of the pair of ridge portions to each other and the extension portion includes, in a nonactive region, a nonactive extension portion that extends outward from a portion below a thickness intermediate position of a side surface of the pair of ridge portions or the coupling portion.

In the preferred embodiment of the present disclosure, a length of the first extension portion is not less than 0.3 times and not more than 0.9 times a width of the ridge portion.

In the preferred embodiment of the present disclosure, a length of the second extension portion is not less than 0.7 times and not more than 2.0 times a width of the ridge portion.

In the preferred embodiment of the present disclosure, a length of the second extension portion is not less than 0.7 times and not more than 1.5 times a width of the ridge portion.

In the preferred embodiment of the present disclosure, a length of the first extension portion is not less than 0.3 times and not more than 0.9 times a width of the ridge portion and a length of the second extension portion is not less than 0.7 times and not more than 2.0 times the width of the ridge portion.

In the preferred embodiment of the present disclosure, lengths, in a width direction of a cross section of the ridge portion, of the first extension portion and the second extension portion differ from each other.

In the preferred embodiment of the present disclosure, a length, in a width direction of a cross section of the ridge portion, of the second extension portion is longer than a length, in a width direction of a cross section of the ridge portion, of the first extension portion.

In the preferred embodiment of the present disclosure, an average concentration of the acceptor type impurity in the extension portion is lower than an average concentration of the acceptor type impurity in the ridge portion.

In the preferred embodiment of the present disclosure, the acceptor type impurity is practically not contained in the extension portion.

In the preferred embodiment of the present disclosure, a film thickness of the extension portion is not more than 25 nm.

In the preferred embodiment of the present disclosure, a film thickness of the extension portion is not more than 15 nm.

In the preferred embodiment of the present disclosure, a film thickness of the extension portion is not less than 3 nm.

In the preferred embodiment of the present disclosure, a film thickness of the extension portion is not more than ⅕ of a film thickness of the ridge portion.

In the preferred embodiment of the present disclosure, a film thickness of the extension portion is not more than ⅐ of a film thickness of the ridge portion.

In the preferred embodiment of the present disclosure, the first extension portion or the second extension portion has a first tapered portion at a junction portion with the ridge portion and a taper angle of the first tapered portion with respect to a front surface of the second nitride semiconductor layer is not more than 45 degrees.

In the preferred embodiment of the present disclosure, the first extension portion or the second extension portion has a second tapered portion at a tip portion and a taper angle of the second tapered portion with respect to the front surface of the second nitride semiconductor layer is not less than 30 degrees and not more than 80 degrees.

In the preferred embodiment of the present disclosure, the first extension portion or the second extension portion has a thick film portion that extends outward from a region below a thickness intermediate portion of a side surface of the ridge portion and a thin film portion that extends outward from a region below a thickness intermediate portion of a side surface of the thick film portion.

In the preferred embodiment of the present disclosure, the third nitride semiconductor layer has a separated portion that is not in contact with the ridge portion and the extension portion and is substantially equal in film thickness to the extension portion.

In the preferred embodiment of the present disclosure, the third nitride semiconductor layer has a separated portion that is not in contact with the ridge portion and the extension portion and is substantially equal in film thickness to the extension portion and the separated portion is present at least between the second extension portion and the second opening portion.

In the preferred embodiment of the present disclosure, the separated portion includes a source side separated portion in contact with the source electrode and a drain side separated portion in contact with the drain electrode.

In the preferred embodiment of the present disclosure, in comparison to a film thickness of a first portion that is a portion of the second nitride semiconductor layer above which the third nitride semiconductor layer is present, a film thickness of a second portion of the second nitride semiconductor layer above which the third nitride semiconductor layer is not present is thinner.

In the preferred embodiment of the present disclosure, a difference between the film thickness of the first portion and the film thickness of the second portion is not more than 3 nm.

In the preferred embodiment of the present disclosure, a third opening portion that exposes a front surface of the second nitride semiconductor layer is formed in the extension portion.

In the preferred embodiment of the present disclosure, the first nitride semiconductor layer is constituted of a GaN layer, the second nitride semiconductor layer is constituted of an $Al_xGa_{(1-x)}N$ (0.1>x>0.3) layer, the third nitride semiconductor layer is constituted of a p type GaN layer, and the acceptor type impurity is constituted of Mg or Zn.

In the preferred embodiment of the present disclosure, if a region up to X nm upward from a lower surface of the third nitride semiconductor layer is a lower layer portion, a region from an upper surface of the third nitride semiconductor layer to an upper surface of the lower layer portion is an upper layer portion, and a thickness of the upper layer portion is Y nm, a first condition that an average acceptor concentration of the lower layer portion is not more than $1\times10^{19}$ $cm^{-3}$ and an average acceptor concentration of the upper layer portion is greater than $1\times10^{19}$ $cm^{-3}$ and a second condition that 5 nm≤X≤40 nm and 70 nm≤Y≤145 nm and 100 nm≤X+Y≤150 nm are satisfied.

In the preferred embodiment of the present disclosure, the third nitride semiconductor layer is constituted of at least a first semiconductor region and a second semiconductor region that differ in bandgap and the extension portion includes the first semiconductor region.

In the preferred embodiment of the present disclosure, the third nitride semiconductor layer is constituted of at least a first semiconductor region and a second semiconductor region that differ in bandgap and the extension portion is constituted of the first semiconductor region.

In the preferred embodiment of the present disclosure, the third nitride semiconductor layer is constituted of at least a first semiconductor region and a second semiconductor region that differ in bandgap and the separated portion is constituted of the first semiconductor region.

In the preferred embodiment of the present disclosure, the bandgap of the first semiconductor region is greater than the bandgap of the second semiconductor region.

In the preferred embodiment of the present disclosure, the first semiconductor region is constituted of $Al_\nu Ga_{1-\nu}N$, the second semiconductor region is constituted of $Al_\nu Ga_{1-\nu}N$, and v>w≥0.

A preferred embodiment of the present disclosure provides a method for manufacturing nitride semiconductor device including a step of forming a first nitride semiconductor layer, constituting an electron transit layer, a second nitride semiconductor layer, constituting an electron supply layer, and a third nitride semiconductor material film, constituted of a nitride semiconductor containing an acceptor type impurity, in that order on a substrate, a step of forming a gate electrode film on the third nitride semiconductor material film, a step of selectively etching the gate electrode film to form a gate electrode on the third nitride semiconductor material film, a first etching step of etching the third nitride semiconductor material film by a predetermined first depth in a predetermined first designated region, a second etching step of etching the third nitride semiconductor material film after the first etching step by a predetermined second depth in a predetermined second designated region to form a third nitride semiconductor layer that includes a ridge portion disposed below the gate electrode and an extension portion extending outward from a portion below a thickness intermediate position of at least one side surface of the ridge portion, a step of forming a passivation film on the second nitride semiconductor layer such as to cover an exposed surface of the second nitride semiconductor layer upper surface and exposed surfaces of the third nitride semiconductor layer and the gate electrode, a step of forming, in the passivation film, a first opening portion and a second opening portion that are disposed opposite each other across the ridge portion, and a step of forming a source electrode that penetrates through the first opening portion to contact the second nitride semiconductor layer and covers the gate electrode and a drain electrode that penetrates through the second opening portion to contact the second nitride semiconductor layer, and where a first side edge of the first or second designated region is positioned between the ridge portion and the first opening portion and a second side edge of the first or second designated region is positioned between the ridge portion and the drain electrode side end of the source electrode.

In the preferred embodiment of the present disclosure, the first designated region demarcates a width of the ridge portion, the first side edge of the second designated region is positioned between the ridge portion and the first opening portion and the second side edge of the second designated region is positioned between the ridge portion and the drain electrode side end of the source electrode.

In the preferred embodiment of the present disclosure, the second designated region demarcates a width of the ridge portion, the first side edge of the first designated region is positioned between the ridge portion and the first opening portion and the second side edge of the first designated region is positioned between the ridge portion and the drain electrode side end of the source electrode.

In the preferred embodiment of the present disclosure, a step of performing, between the first etching step and the second etching step, etching of the third nitride semiconductor material film by a predetermined third depth in a predetermined third designated region is included, the third designated region is smaller in etched region than the first designated region and larger in etched region than the second designated region, and a sum of the first depth and the third depth is less than a thickness of the third nitride semiconductor material film.

The aforementioned as well as yet other objects, features, and effects of the present disclosure will be made clear by the following description of the preferred embodiments made with reference to the accompanying drawings.

DESCRIPTION OF EMBODIMENTS

Figure 1:
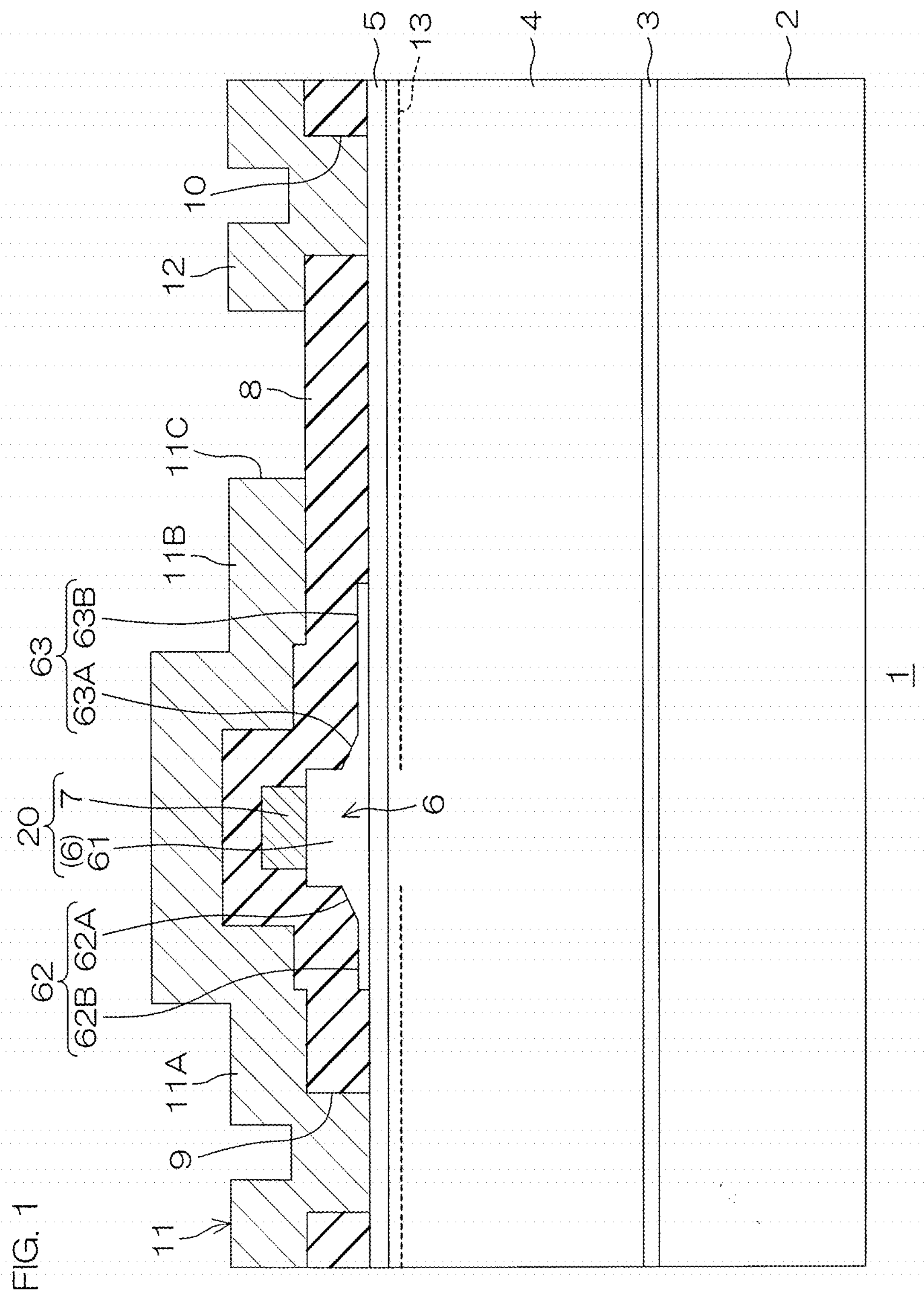
FIG. 1 is a sectional view for describing the arrangement of a nitride semiconductor device according to a first preferred embodiment of the present disclosure.

FIG. 1 is a sectional view for describing the arrangement of a nitride semiconductor device according to a first preferred embodiment of the present disclosure.

The nitride semiconductor device 1 includes a substrate 2, a buffer layer 3 that is formed on a front surface of the substrate 2, a first nitride semiconductor layer 4 that is epitaxially grown on the buffer layer 3, and a second nitride semiconductor layer 5 that is epitaxially grown on the first nitride semiconductor layer 4. The nitride semiconductor device 1 further includes a third nitride semiconductor layer 6 that is formed selectively on the second nitride semiconductor layer 5 and a gate electrode 7 that is formed on the third nitride semiconductor layer 6.

Further, the nitride semiconductor device 1 includes a passivation film 8 that covers the second nitride semiconductor layer 5, the third nitride semiconductor layer 6, and the gate electrode 7. Further, the nitride semiconductor device 1 includes a source electrode 11 and a drain electrode 12 that pass through a source contact hole (first opening portion) 9 and a drain contact hole (second opening portion) 10 formed in the passivation film 8 and are in contact with the second nitride semiconductor layer 5. The source electrode 11 and the drain electrode 12 are disposed opposite each other across the gate electrode 7.

The source electrode 11 is constituted of a source main electrode portion 11A and a source field plate portion 11B that covers a gate portion 20. In this preferred embodiment, the source main electrode portion 11A shall refer to a region that, among an entire region of the source electrode 11, is constituted of a region surrounded by a contour of the source contact hole 9 and a peripheral region thereof in plan view. The source field plate portion 11B refers to a portion of the entire region of the source electrode 11 other than the source main electrode portion 11A. The source field plate portion 11B has a portion that is disposed between the gate electrode 7 and the drain electrode 12 to be described later. A drain electrode side end 11C of the source field plate portion 11B is disposed between the drain contact hole 10 and the gate electrode 7 (a ridge portion 61 of the third nitride semiconductor layer 6 to be described later) in plan view. In a state where a gate voltage is not applied (transistor-off state), the source field plate portion 11B spreads a depletion layer to a two-dimensional electron gas 13 between the gate electrode 7 and the drain electrode 12 to relax electric field concentration at an end portion of the gate electrode 7.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be an SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 11.

In this preferred embodiment, the buffer layer 3 is constituted of a multilayer buffer layer in which a plurality of nitride semiconductor films are laminated. In this preferred embodiment, the buffer layer 3 is constituted of a first buffer layer (not shown) constituted of an AlN film in contact with the front surface of the substrate 2 and a second buffer layer (not shown) constituted of graded AlGaN layers laminated on a front surface of the first buffer layer (front surface at an opposite side to the substrate 2). A film thickness of the first buffer layer is approximately 100 nm to 500 nm. A film thickness of the second buffer layer, as a total thickness of three AlGaN layers of the same film thickness respectively having an Al composition of 75%, 50%, and 25% in that order from the first buffer layer side, is approximately 300 nm to 1 μm. The number of graded AlGaN layers that constitute the second buffer layer and respective film thickness ratios may differ. The buffer layer 3 may instead be constituted, for example, of a single film of AlGaN, an AlGaN/GaN superlattice film, an AlN/AlGaN superlattice film, a film having an AlN/GaN superlattice structure, etc. Here, in order to suppress a leak current flowing via the buffer layer 3, an impurity may be introduced into a portion of the buffer layer 3 to make the portion of the buffer layer 3 semi-insulating. In this case, preferably, the impurity is C or Fe and an impurity concentration is, for example, not less than $4\times10^{16}$ $cm^{-3}$.

The first nitride semiconductor layer 4 constitutes an electron transit layer. In this preferred embodiment, the first nitride semiconductor layer 4 is constituted of a GaN layer and a thickness thereof is approximately 0.5 μm to 2 μm. Also, an impurity by which a region other than a front surface region is made semi-insulating may be introduced for a purpose of suppressing a leak current that flows through the first nitride semiconductor layer 4. In this case, a concentration of the impurity is preferably not less than $4\times10^{16}$ $cm^{-3}$. Also, the impurity is, for example, C.

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the band gap. In this preferred embodiment, the second nitride semiconductor layer 5 is constituted of an $Al_xGa_{1-x}N$ layer ($0.1<x\leq0.3$). The Al composition of the second nitride semiconductor layer 5 is preferably not less than 20% and not more than 30% and more preferably not less than 24% and not more than 25%. That is, x is preferably 0.2 to 0.3 and more preferably 0.24 to 0.25. A thickness of the second nitride semiconductor layer 5 is preferably 8 nm to 20 nm and more preferably 10.5 nm to 11.5 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. Thereby, inside the first nitride semiconductor layer 4, the two-dimensional electron gas 13 spreads at a position close to the interface between the first nitride semiconductor layer 4 and the second nitride semiconductor layer 5 (for example, at a distance of approximately several Å from the interface).

The third nitride semiconductor layer 6 is constituted of a nitride semiconductor that is doped with an acceptor type impurity. More specifically, the third nitride semiconductor layer 6 is constituted of an $Al_yGa_{1-y}N$ ($0\leq y<1$, $y<x$) layer that is doped with the acceptor type impurity. In this preferred embodiment, the third nitride semiconductor layer 6 is constituted of a GaN layer (p type GaN layer) that is doped with the acceptor type impurity. In manufacturing the third nitride semiconductor layer 6, it is preferable not to perform a p type conversion/activation processing (for example, heat processing in a nitrogen atmosphere) after film formation of the GaN layer doped with the acceptor type impurity.

In this preferred embodiment, the acceptor type impurity is Mg (magnesium). The acceptor type impurity may instead be Zn (zinc) or other acceptor type impurity besides Mg.

The third nitride semiconductor layer 6 includes the ridge portion 61 and extension portions 62 and 63. The ridge portion 61 has a lateral cross section of quadrilateral shape, the gate electrode is formed on at least a width central portion of its upper surface, and at least an upper portion of each of both of its side surfaces is exposed. The extension portions 62 and 63 extend outward of the ridge portion 61 along a front surface of the second nitride semiconductor layer 5 from portions below thickness intermediate positions of the side surfaces of the ridge portion 61.

A portion of each of both side surfaces of the ridge portion 61 at which the extension portion 62 or 63 is formed is not exposed. In other words, a portion (the upper portion) of each of both side surfaces of the ridge portion 61 at which the extension portion 62 or 63 is not formed is exposed. In plan view, the extension portions 62 and 63 are disposed between the source contact hole 9 and the drain electrode side end 11C of the source field plate portion 11B. A film thickness of the extension portions 62 and 63 is thinner than a film thickness of the ridge portion 61. In this preferred embodiment, the extension portions 62 and 63 include the source side extension portion (first extension portion) 62 and the drain side extension portion (second extension portion) 63.

The source side extension portion 62 is disposed between the ridge portion 61 and the source contact hole 9. The source side extension portion 62 is constituted of a tapered portion 62A that extends toward the source contact hole 9 from the portion below the thickness intermediate position of the side surface of the ridge portion 61 at the source electrode 11 side and a flat portion 62B that extends toward the source contact hole 9 from a source electrode side end of the tapered portion 62A. A front surface of the tapered portion 62A is formed to an inclined surface such that a film thickness decreases gradually toward the source contact hole 9. An inclination angle (taper angle) of the front surface of the tapered portion 62A with respect to the front surface of the second nitride semiconductor layer 5 is preferably not more than 45 degrees. A front surface of the flat portion 62B is substantially parallel to the front surface of the second nitride semiconductor layer 5 and a film thickness thereof is substantially equal to the film thickness at the source electrode side end of the tapered portion 62A. The tapered portion 62A is an example of a "first tapered portion" of the present disclosure.

The drain side extension portion 63 is disposed between the ridge portion 61 and the drain electrode side end 11C of the source field plate portion 11B. The drain side extension portion 63 is constituted of a tapered portion 63A that extends toward the drain contact hole 10 from the portion below the thickness intermediate position of the side surface of the ridge portion 61 at the drain electrode 12 side and a flat portion 63B that extends toward the drain contact hole 10 from a drain electrode side end of the tapered portion 63A. A front surface of the tapered portion 63A is formed to an inclined surface such that a film thickness decreases gradually toward the drain contact hole 10. An inclination angle (taper angle) of the front surface of the tapered portion 63A with respect to the front surface of the second nitride semiconductor layer 5 is preferably not more than 45 degrees. A front surface of the flat portion 63B is substantially parallel to the front surface of the second nitride semiconductor layer 5 and a film thickness thereof is substantially equal to the film thickness at the drain electrode side end of the tapered portion 63A. The tapered portion 63A is an example of the "first tapered portion" of the present disclosure.

The film thickness of the ridge portion 61 is preferably not less than 100 nm. The film thickness of the ridge portion 61 is more preferably not less than 100 nm and not more than 140 nm and even more preferably not less than 110 nm and not more than 125 nm. This is because if the film thickness of the ridge portion 61 is not less than 100 nm and not more than 140 nm, a maximum rated gate voltage of positive direction can be made high. In this preferred embodiment, the film thickness of the ridge portion 61 is approximately 110 nm.

The film thickness of the extension portions 62 and 63 (in detail, the film thickness of the flat portions 62B and 63B) is preferably not more than 25 nm and more preferably not more than 15 nm. The film thickness of the extension portions 62 and 63 is preferably not more than ⅕ of the film thickness of the ridge portion 61 and more preferably not more than ⅐ of the film thickness of the ridge portion 61.

A length of the source side extension portion 62 in a width direction of the ridge portion 61 and a length of the drain side extension portion 63 in the width direction of the ridge portion 61 may differ from each other. For example, the length of the drain side extension portion 63 in the width direction of the ridge portion 61 may be longer than the length of the source side extension portion 62 in the width direction of the ridge portion 61.

A length of a width of the ridge portion 61 is, for example, approximately 500 nm and the length of the source side extension portion 62 is approximately the same as the width of the ridge portion 61 and is, for example, 150 nm to 450 nm (0.3 times to 0.9 times the width of the ridge portion 61). The length of the drain side extension portion 63 is approximately the same as or is preferably not less than the width of the ridge portion 61. The length of the drain side extension portion 63 is, for example, 350 nm to 1000 nm (0.7 times to 2.0 times the width of the ridge portion 61) and preferably 350 nm to 750 nm (0.7 times to 1.5 times the width of the ridge portion 61).

Also, the length of the width of the ridge portion 61 is substantially the same or slightly greater than a width of the gate electrode 7.

If average concentrations of the acceptor type impurity (Mg) in the extension portions 62 and 63 are too high, an on resistance increases. An acceptor type impurity concentration directly above the third nitride semiconductor layer 6 therefore cannot be made high. If an average concentration of the acceptor type impurity in the third nitride semiconductor layer 6 is then decreased, a threshold $V_{th}$ decreases. In order to increase the threshold $V_{th}$ without increasing the on resistance, an upper layer region of the third nitride semiconductor layer 6 higher than the extension portions 62 and 63 must be made high in average concentration of the acceptor type impurity or made thick in film thickness.

From such a standpoint, the average concentrations of the acceptor type impurity (Mg) in the extension portions 62 and 63 are made lower than the average concentration of the acceptor type impurity (Mg) in the ridge portion 61. This is because a third semiconductor material film 71 (see FIG. 2A) that is a material film of the third nitride semiconductor layer 6 that is epitaxially grown on the second nitride semiconductor layer 5 has a concentration profile such that an acceptor type impurity concentration decreases gradually from a central portion, in a direction from an upper surface toward a lower surface, to the lower surface.

Also, if a region up to X nm upward from the lower surface of the third nitride semiconductor layer 6 is a lower layer portion, a region from the upper surface of the third nitride semiconductor layer 6 to an upper surface of the lower layer portion is an upper layer portion, and a thickness of the upper layer portion is Y nm, it is preferable for a first condition and a second condition described below to be satisfied.

First condition: A condition that an average acceptor concentration of the lower layer portion is not more than $1\times10^{19}$ cm$^{-3}$ and an average acceptor concentration of the upper layer portion is greater than $1\times10^{19}$ cm$^{-3}$.

Second condition: A condition that 5 nm$\leq$X$\leq$40 nm and 70 nm$\leq$Y$\leq$145 nm and 100 nm$\leq$X+Y$\leq$150 nm.

Also, it is preferable that an acceptor type impurity is practically not contained in the extension portions 62 and 63. That an acceptor type impurity is practically not contained means a level such that an acceptor type impurity is not detected by an elemental analysis such as secondary ion mass spectrometry (SIMS), etc., and means, for example, that an acceptor type impurity concentration is not more than $2\times10^{15}$ cm$^{-3}$.

If an acceptor type impurity is practically contained in the extension portions 62 and 63, the acceptor type impurity pushes up the conduction band of the first nitride semiconductor layer 4 directly below the extension portions 62 and 63 and therefore, sheet carrier densities of the two-dimensional electron gas directly below the extension portions 62 and 63 decrease. The on resistance is thereby increased. If an acceptor type impurity is practically not contained, the decrease in the sheet carrier densities of the two-dimensional electron gas directly below the extension portions 62 and 63 can be suppressed and therefore, the threshold $V_{th}$ can be increased and gate resistance can be increased without increasing the on resistance.

In order to make an acceptor type impurity be practically not contained in the extension portions 62 and 63 in a case where the acceptor type impurity is Mg or Zn, an acceptor type impurity flow rate condition in film formation of the third nitride semiconductor layer (p type GaN layer) 6 should be changed as follows. That is, in the film formation of the third nitride semiconductor layer 6, the acceptor type impurity flow rate condition should be changed such that an acceptor type impurity concentration of a lower layer portion that includes the extension portions 62 and 63 becomes substantially zero, an acceptor type impurity concentration of a middle layer portion above the lower layer portion becomes comparatively low, and the acceptor type impurity concentration of an upper layer portion above the middle layer portion becomes comparatively high.

Here, since Zn is low in downward diffusion, if the acceptor type impurity is Zn, the acceptor type impurity flow rate condition may be set such that the acceptor type impurity concentration of the middle layer portion becomes as high as the acceptor type impurity concentration of the upper layer portion.

Also, an arrangement may be made such that an acceptor type impurity is practically not contained in regions of lower half portions of the extension portions 62 and 63. Even in this case, the same effects as those in the case where an acceptor type impurity is practically not contained in entireties of the extension portions 62 and 63 can be anticipated.

The gate portion 20 is constituted of the ridge portion 61 and the gate electrode 7 formed on the ridge portion 61. In between the source contact hole 9 and the drain contact hole 10, the gate portion 20 is disposed biasedly toward the source contact hole 9.

The ridge portion 61 is provided to change a conduction band of an interface formed by the first nitride semiconductor layer 4 (electron transit layer) and the second nitride semiconductor layer 5 (electron supply layer) in a region directly below the gate portion 20 such that the two-dimensional electron gas 13 is not formed in the region directly below the gate portion 20 in a state where the gate voltage is not applied.

A lateral cross section of the gate electrode 7 is of a rectangular shape. The width of the gate electrode 7 is narrower than the width of the ridge portion 61. The gate electrode 7 is formed on a width intermediate portion of an upper surface of the ridge portion 61. Therefore, a step is formed between an upper surface of the gate electrode 7 and an upper surface of one side portion of the ridge portion 61 and a step is formed between the upper surface of the gate electrode 7 and an upper surface of another side portion of the ridge portion 61. Also, in plan view, both side edges of the gate electrode 7 are receded further inward than corresponding side edges of the ridge portion 61.

In this preferred embodiment, the gate electrode 7 is in Schottky contact with the upper surface of the ridge portion 61. The gate electrode 7 is constituted, for example, of TiN. A film thickness of the gate electrode 7 is preferably not less than 60 nm and not more than 200 nm and more preferably not less than 140 nm and not more than 150 nm. The gate electrode 7 may be constituted of a single film that is any one of a Ti film, a TiN film, and a TiW film or of a composite film constituted of any combination of two or more of the films.

The passivation film 8 covers exposed surfaces of the second nitride semiconductor layer 5 (with the exception of regions facing the contact holes 9 and 10), exposed surfaces of the third nitride semiconductor layer 6, and exposed surfaces of the gate electrode 7. Consequently, side surfaces and a front surface of the gate portion 20 are covered by the passivation film 8. A film thickness of the passivation film 8 is preferably not less than 50 nm and not more than 200 nm and more preferably not less than 85 nm and not more than 105 nm. In this preferred embodiment, the passivation film 8 is constituted of an SiN film. The passivation film 8 may instead be constituted of a single film that is any one of an SiN film, an $SiO_2$ film, an SiON film, an $Al_2O_3$ film, an AlN film, and an AlON film or of a composite film constituted of any combination of two or more of the films.

The source electrode 11 and the drain electrode 12 are constituted, for example, of first metal layers (ohmic metal layers) that are in contact with the second nitride semiconductor layer 5, second metal layers (main electrode metal layers) that are laminated on the first metal layers, third metal layers (adhesion layers) that are laminated on the second metal layers, and fourth metal layers (barrier metal layers) that are laminated on the third metal layers. The first metal layers are, for example, Ti layers with thicknesses of approximately 10 nm to 20 nm. The second metal layers are, for example, Al layers with thicknesses of approximately 100 nm to 300 nm. The third metal layers are, for example, Ti layers with thicknesses of approximately 10 nm to 20 nm. The fourth metal layers are, for example, TiN layers with thicknesses of approximately 10 nm to 50 nm.

With the nitride semiconductor device 1, a heterojunction is formed by there being formed on the first nitride semiconductor layer 4 (electron transit layer), the second nitride semiconductor layer 5 (electron supply layer) that differs in bandgap (Al composition). The two-dimensional electron gas 13 is thereby formed inside the first nitride semiconductor layer 4 near the interface between the first nitride semiconductor layer 4 and the second nitride semiconductor layer 5, and an HEMT (transistor) making use of the two-dimensional electron gas 13 as a channel is formed. The gate electrode 7 opposes the second nitride semiconductor layer 5 across the third nitride semiconductor layer 6 (in detail, the ridge portion 61).

Below the gate electrode 7, energy levels of the first nitride semiconductor layer 4 and the second nitride semiconductor layer 5 are pulled up by acceptors contained in the ridge portion 61 that is constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 13 formed by the spontaneous polarizations of the first nitride semiconductor layer 4 and the second nitride semiconductor layer 5 and the piezo polarization due to the lattice mismatch of the two layers is not formed directly below the gate electrode 7 (gate portion 20).

Therefore, when a bias is not applied to the gate electrode 7 (zero bias state), the channel due to the two-dimensional electron gas 13 is interrupted directly below the gate electrode 7. A normally-off type HEMT is thus realized. When an appropriate on voltage (for example, of 5 V) is applied to the gate electrode 7, a channel is induced inside the first nitride semiconductor layer 4 directly below the gate electrode 7 and the two-dimensional electron gas 13 at both sides of the gate electrode 7 becomes connected. The source and the drain are thereby made continuous to each other.

For use, for example, a predetermined voltage (for example, of 50 V to 100 V) with which the drain electrode 12 side becomes positive is applied between the source electrode 11 and the drain electrode 12. In this state, an off voltage (0 V) or the on voltage (5 V) is applied to the gate electrode 7 with the source electrode 11 being at a reference potential (0 V).

Figure 26:
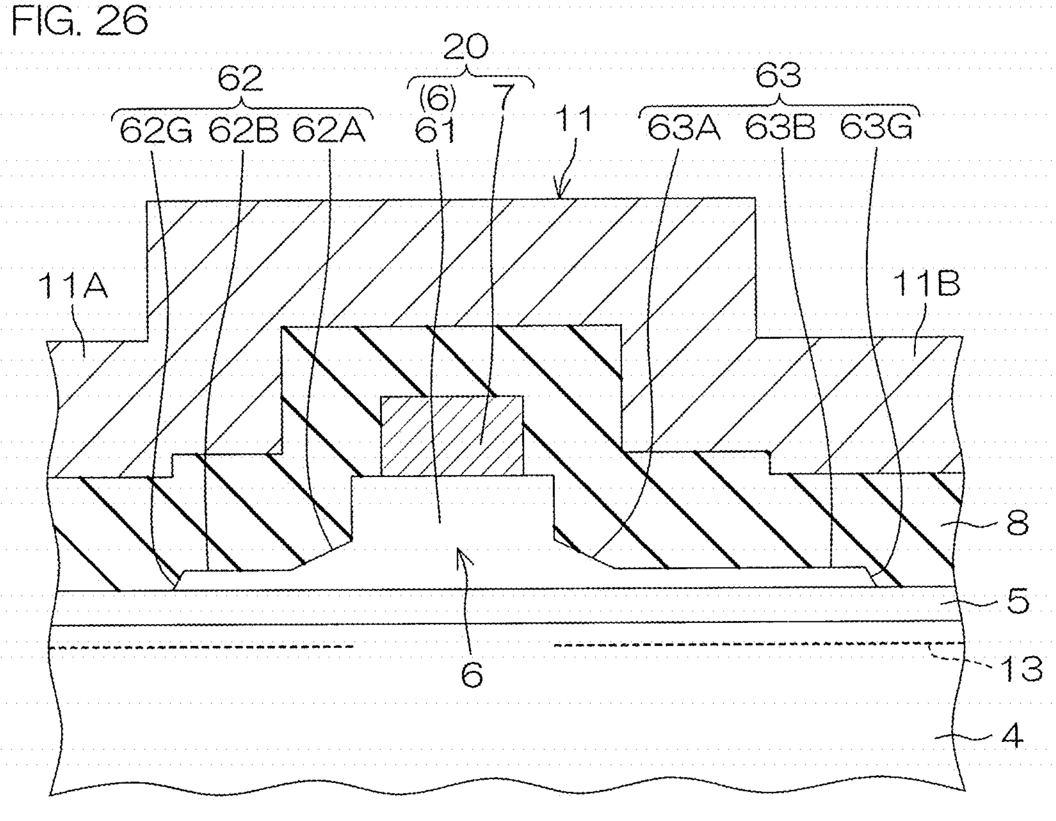
FIG. 26 is a partially enlarged sectional view of a modification example of the third nitride semiconductor layer that is a modification example with which a tapered portion is provided at a tip portion of an extension portion.

In addition, as shown in FIG. 26, the respective extension portions 62 and 63 may have tapered portions 62G and 63G at tips thereof. In the example of FIG. 26, the source side extension portion 62 is constituted of the tapered portion 62A at a base end side of the extension portion 62, the tapered portion 62G at a tip side of the extension portion 62, and the flat portion 62B between the two. Similarly, the drain side extension portion 63 is constituted of the tapered portion 63A at a base end side of the extension portion 63, the tapered portion 63G at a tip side of the extension portion 63, and the flat portion 63B between the two.

Front surfaces of the tapered portions 62G and 63G are formed to inclined surfaces such that a film thickness decreases gradually toward the tips of the source side extension portion 62 and the drain side extension portion 63, respectively. An inclination angle (taper angle) of the front surfaces of the tapered portions 62G and 63G with respect to the front surface of the second nitride semiconductor layer 5 is preferably not less than 30 degrees and not more than 80 degrees. The tapered portions 62G and 63G are examples of a "second tapered portion" of the present disclosure.

With such an arrangement, the passivation film 8 does not have steeply angled portions at corner portions between the tip portions (lower edges of the tapered portions 62G and 63G) of the extension portions 62 and 63 and the second nitride semiconductor layer 5 and therefore, concentration of stress at the angled portions is suppressed and lowering of withstand voltage due to localized increase in the two-dimensional electron gas can be suppressed.

Also, if an acceptor type impurity is contained in the extension portions 62 and 63, the structure becomes that with which sheet carrier densities of the two-dimensional electron gas inside the tip portions of the extension portions 62 and 63 change continuously in a lateral direction (width direction of the ridge portion 61) such that the electric field concentration relaxation in the transistor-off state is relaxed and the withstand voltage is improved.

FIG. 2A to FIG. 2H are sectional views for describing an example of a method for manufacturing the nitride semiconductor device 1 described above and show a cross-sectional structure at a plurality of stages of the manufacturing method.

Figure 2A:
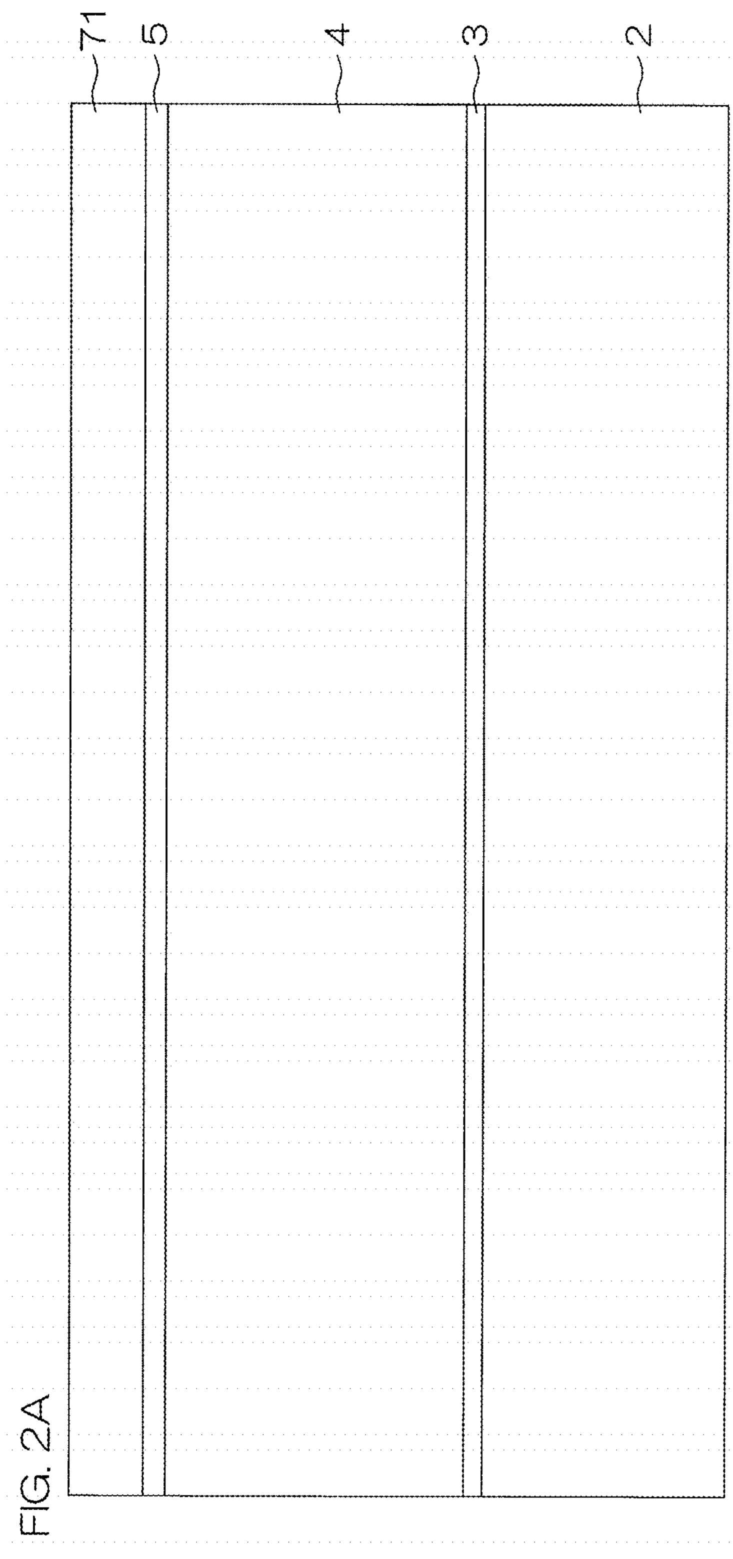
FIG. 2A is a sectional view of an example of a manufacturing process of the nitride semiconductor device of FIG. 1.

First, as shown in FIG. 2A, the buffer layer 3, the first nitride semiconductor layer (electron transit layer) 4, the second nitride semiconductor layer (electron supply layer) 5, and the third semiconductor material film 71 that is the material film of the third nitride semiconductor layer 6 are epitaxially grown on the substrate 2 by an MOCVD (metal organic chemical vapor deposition) method.

Figure 2B:
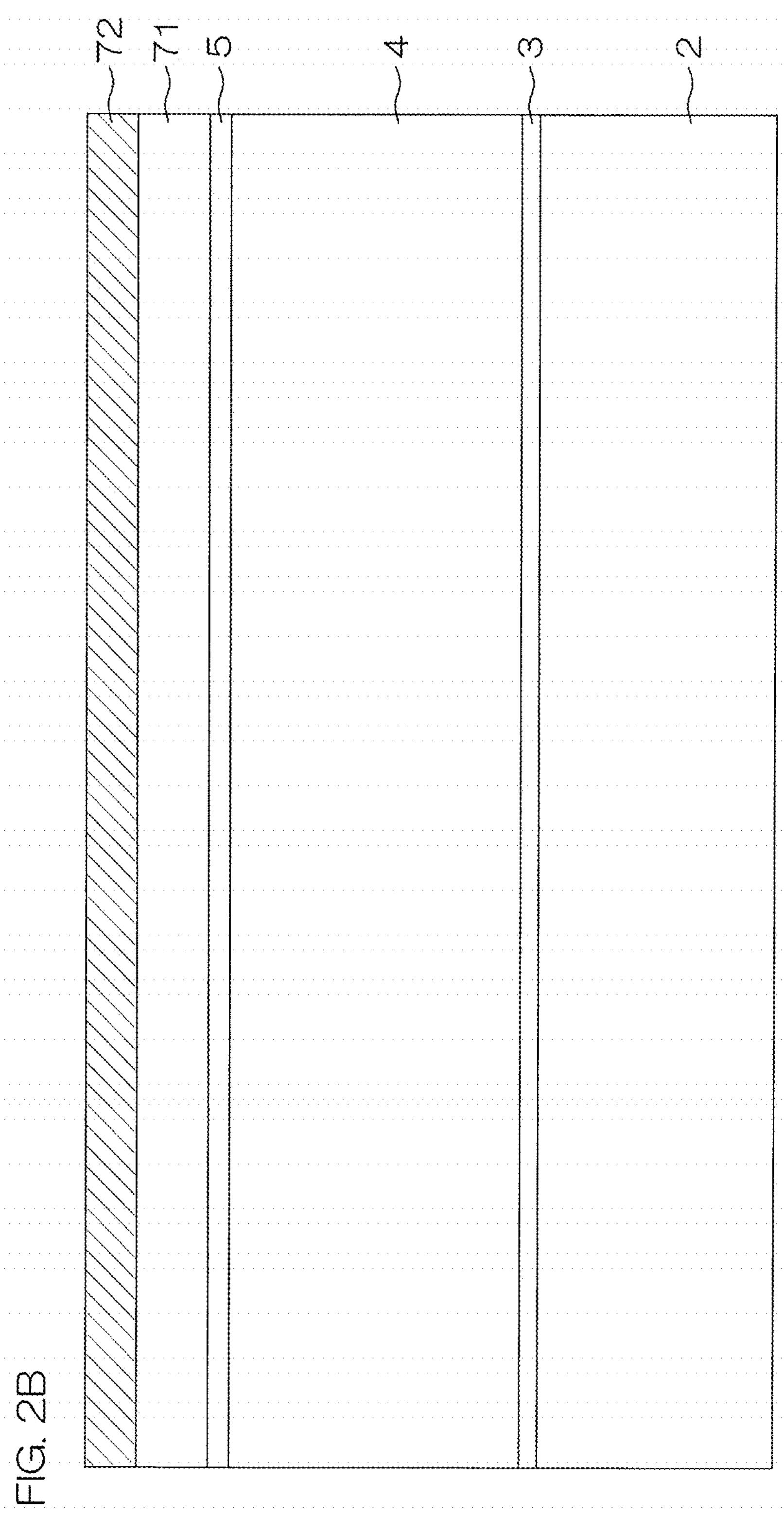
FIG. 2B is a sectional view of a step subsequent to that of FIG. 2A.

Next, as shown in FIG. 2B, a gate electrode film 72 that is a material film of the gate electrode 7 is formed, for example, by a sputtering method such as to cover an entire front surface that is exposed.

Figure 2C:
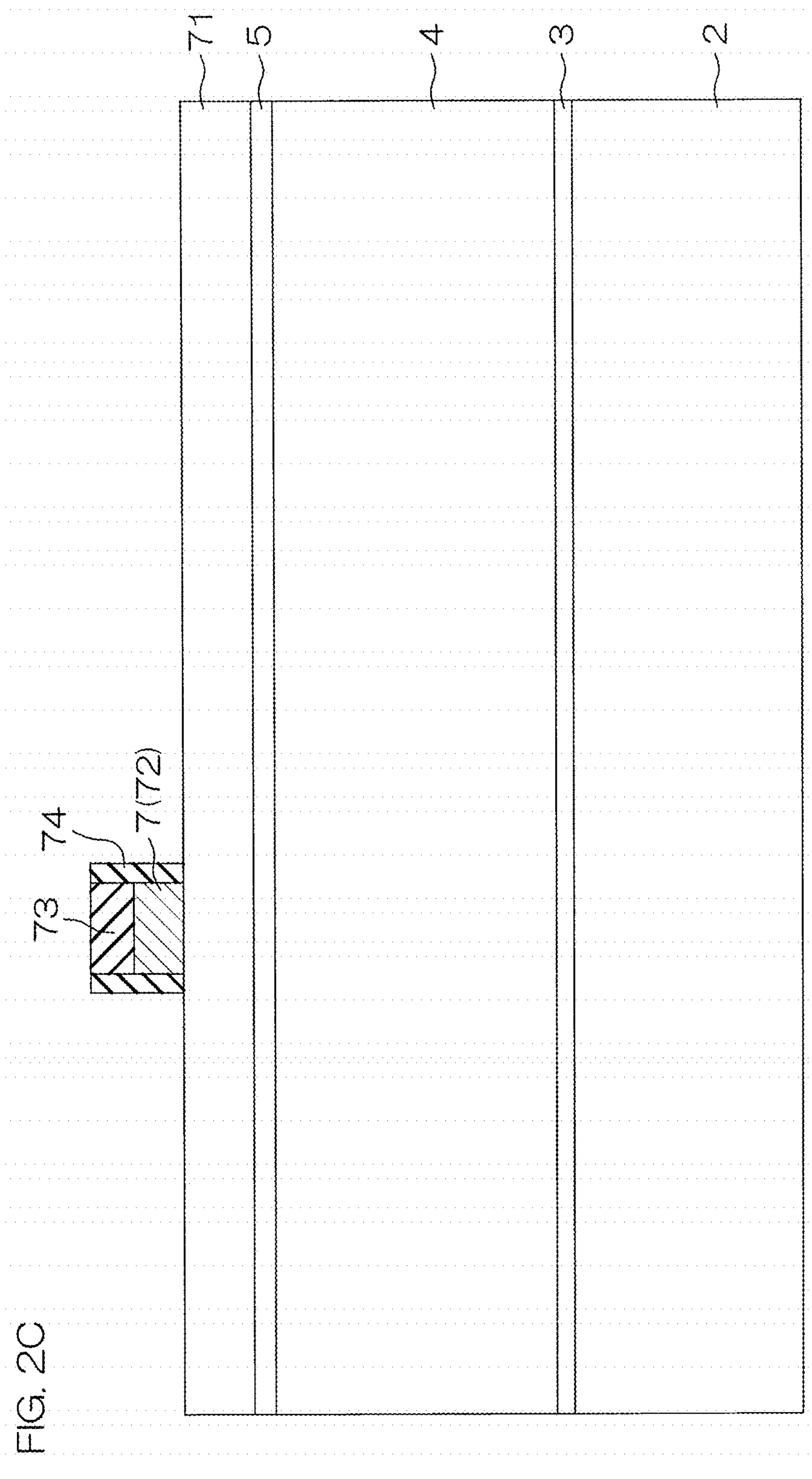
FIG. 2C is a sectional view of a step subsequent to that of FIG. 2B.

Next, as shown in FIG. 2C, a first insulating film (for example, an $SiO_2$ film) 73 is formed on the gate electrode film 72. Then, for example, by dry etching, the first insulating film 73 is selectively removed while leaving the first insulating film 73 on a gate electrode preparation planned region of the gate electrode film 72 front surface. The gate electrode film 72 is then patterned by dry etching using the first insulating film 73 as a mask. The gate electrode 7 is thereby formed.

Thereafter, a second insulating film (for example, an $SiO_2$ film) 74 is formed, for example, by a plasma-enhanced chemical vapor deposition method (PECVD method) such as to cover entire surfaces that are exposed. Then, for example, by dry etching, the second insulating film 74 is etched back such as to form the second insulating film 74 that covers side surfaces of the gate electrode 7 and the first insulating film 73.

Figure 2D:
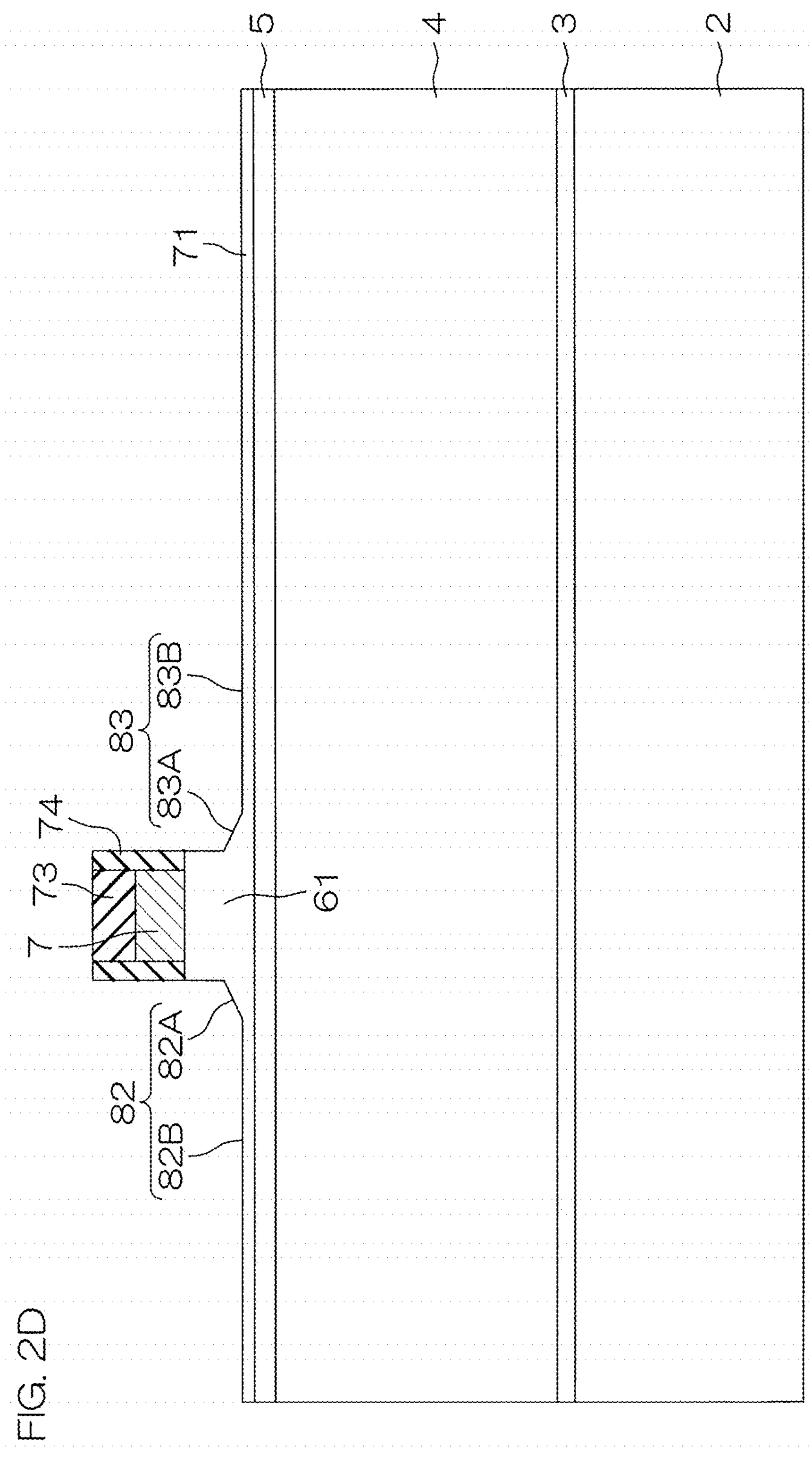
FIG. 2D is a sectional view of a step subsequent to that of FIG. 2C.

Next, as shown in FIG. 2D, the third semiconductor material film 71 is etched by a predetermined first depth in a predetermined first designated region by a first dry etching step using the first insulating film 73 and the second insulating film 74 as masks. Specifically, a region (the first designated region) of the third semiconductor material film 71 that is not covered by the first and second insulating films 73 and 74 is etched by the predetermined first depth. The first depth is substantially equal to a thickness obtained by subtracting the thickness of the flat portions 62B and 63B of the extension portions 62 and 63 from a thickness of the third semiconductor material film 71.

The third semiconductor material film 71 after the first dry etching step is constituted of the ridge portion 61 directly below the first and second insulating films 73 and 74 and thin film portions 82 and 83 besides the ridge portion 61. The thin film portions 82 and 83 are constituted of the source side thin film portion 82 that projects outward from a portion below a thickness intermediate position of one side surface of the ridge portion 61 and the drain side thin film portion 83 that projects outward from a portion below a thickness intermediate position of another side surface of the ridge portion 61.

The source side thin film portion 82 is constituted of a tapered portion 82A that extends outward from the portion below the thickness intermediate position of the one side surface of the ridge portion 61 and decreases gradually in thickness outward and a flat portion 82B that extends outward from a projection end of the tapered portion 82A and is substantially fixed in thickness. The drain side thin film portion 83 is constituted of a tapered portion 83A that extends outward from the portion below the thickness intermediate position of the other side surface of the ridge portion 61 and decreases gradually in thickness outward and a flat portion 83B that extends outward from a projection end of the tapered portion 83A and is substantially fixed in thickness.

In the first dry etching step, one-step formation while applying etching film thickness control by an endpoint monitor using interference light may be performed under a condition that an etching rate is slow in a vicinity of a structure (for example, with a bias applied to an etched object side being not more than 30 W in etching using ICP). Also, the first dry etching step may instead be constituted of a pre-process of etching the third semiconductor material film 71 from a front surface of the third semiconductor material film 71 to upper end positions of the tapered portions 82A and 83A and a post-process of etching the third semiconductor material film 71 from the upper end positions of the tapered portions 82A and 83A to upper surfaces of the flat portions 82B and 83B. In this case, the etching rate is changed between the pre-process and post-process, for example, by changing an amount of an etching gas and an electric power of plasma. Specifically, the etching rate in the post-process is made slower than the etching rate of the pre-process.

Figure 2E:
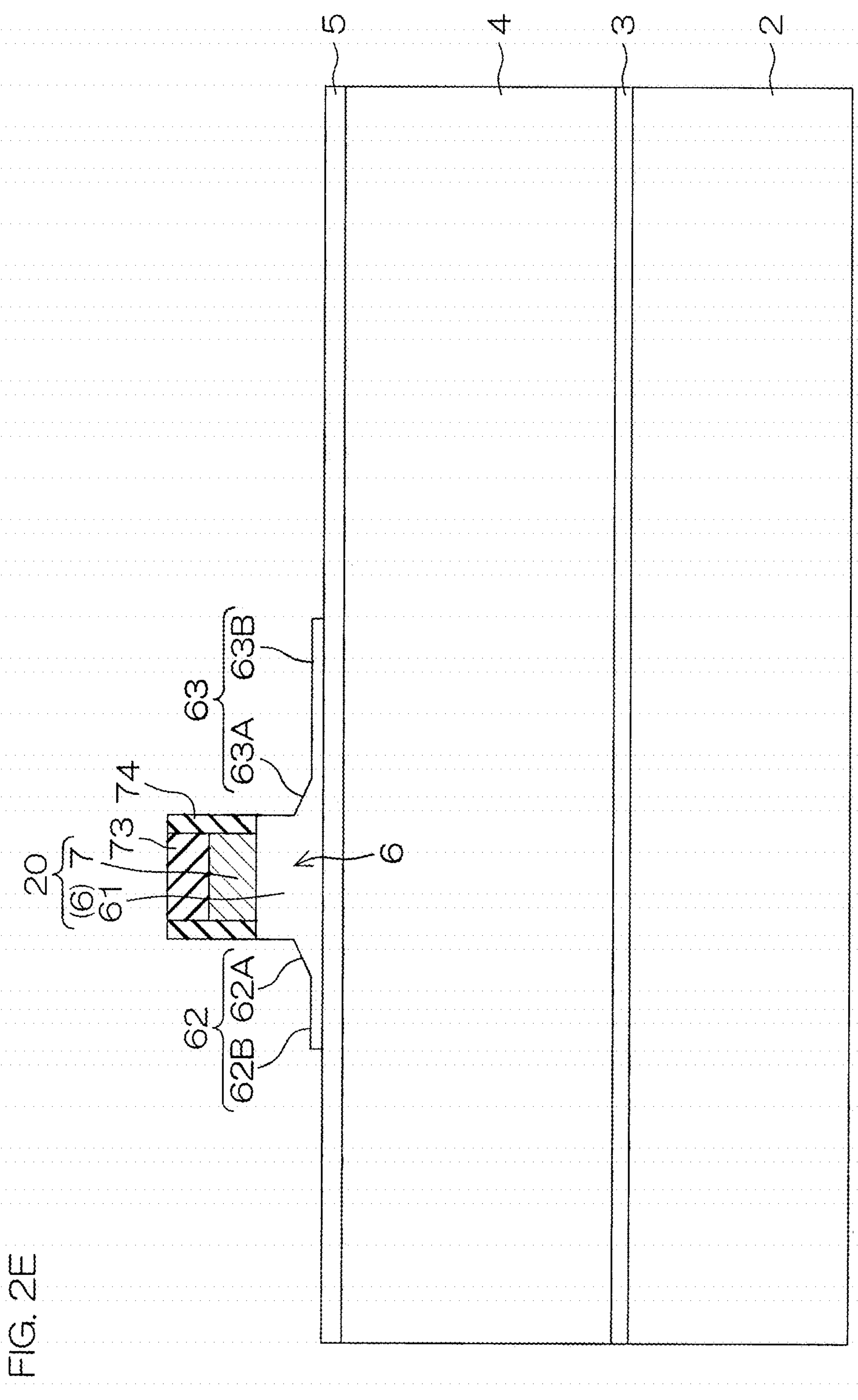
FIG. 2E is a sectional view of a step subsequent to that of FIG. 2D.

Next, as shown in FIG. 2E, the third semiconductor material film 71 is etched by a predetermined second depth in a predetermined second designated region by a second dry etching step using a resist (not shown), covering a formation planned region of the third nitride semiconductor layer 6, as a mask. Specifically, a region (the second designated region) of the third semiconductor material film 71 that is not covered by the resist mask is etched by the predetermined second depth. In the second dry etching step, the third semiconductor material film 71 is etched under a condition that a selectivity between the third semiconductor material film 71 and the second nitride semiconductor layer 5 is not less than 10 (for example, by use of a gas in which $O_2$ or $CF_4$, etc., is mixed in $Cl_2$). The second depth is substantially equal to the thickness of the flat portions 62B and 63B of the extension portions 62 and 63.

The third semiconductor material film 71 after the second dry etching step is constituted of the ridge portion 61 directly below the first and second insulating films 73 and 74 and the extension portions 62 and 63 besides the ridge portion 61. As mentioned above, the extension portions 62 and 63 include the source side extension portion 62 and the drain side extension portion 63. The source side extension portion 62 is constituted of the tapered portion 62A and the flat portion 62B. The drain side extension portion 63 is constituted of the tapered portion 63A and the flat portion 63B.

The third nitride semiconductor layer 6 constituted of the ridge portion 61 and the extension portions 62 and 63 is thereby obtained. Also, the gate portion 20 constituted of the ridge portion 61 and the gate electrode 7 that is formed on the width intermediate portion of the ridge portion 61 upper surface is obtained.

Figure 2F:
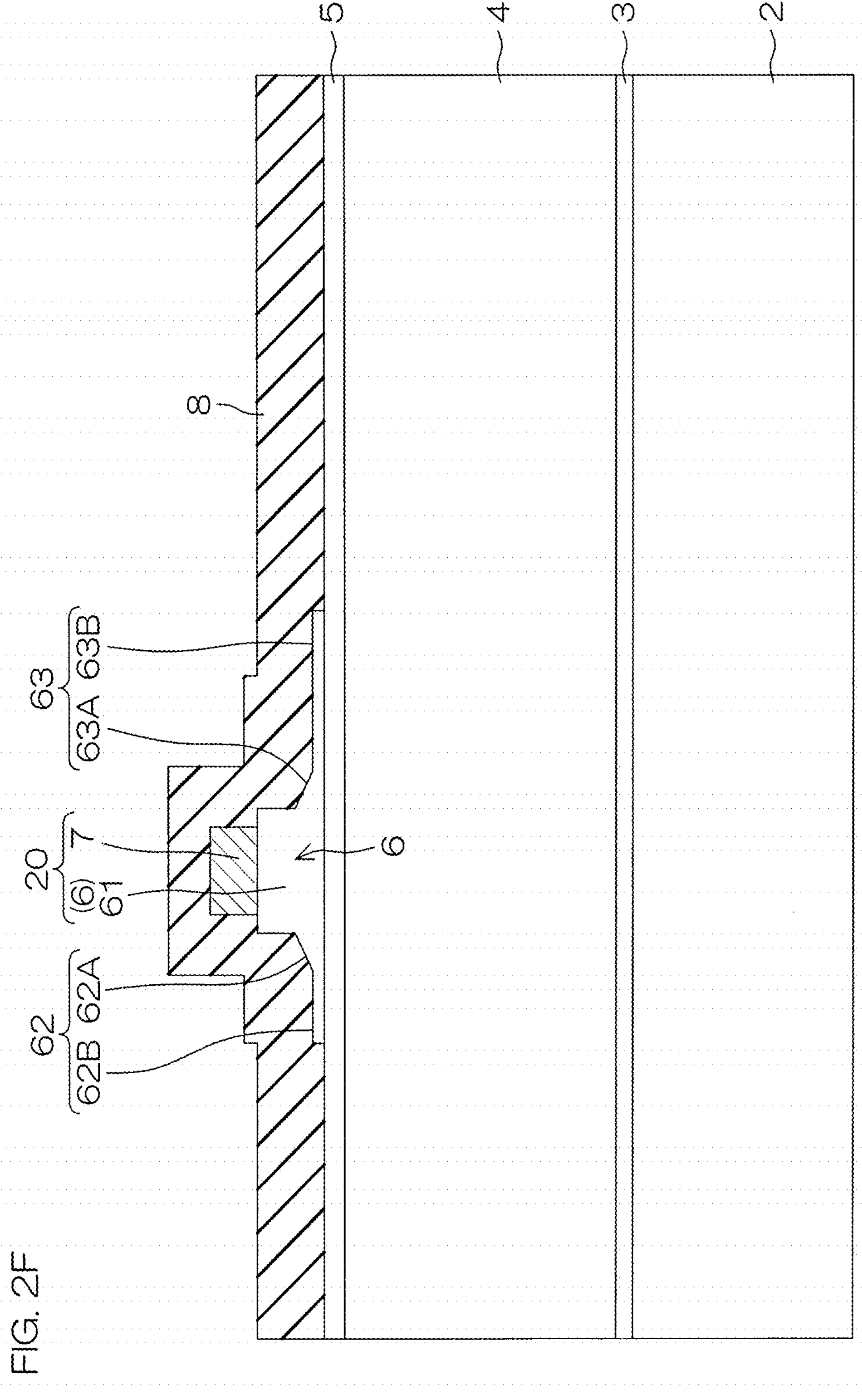
FIG. 2F is a sectional view of a step subsequent to that of FIG. 2E.

Next, as shown in FIG. 2F, the first and second insulating films 73 and 74 are removed by wet etching. Thereafter, the passivation film 8 is formed such as to cover entire surfaces that are exposed. The passivation film 8 is constituted, for example, of SiN.

Figure 2G:
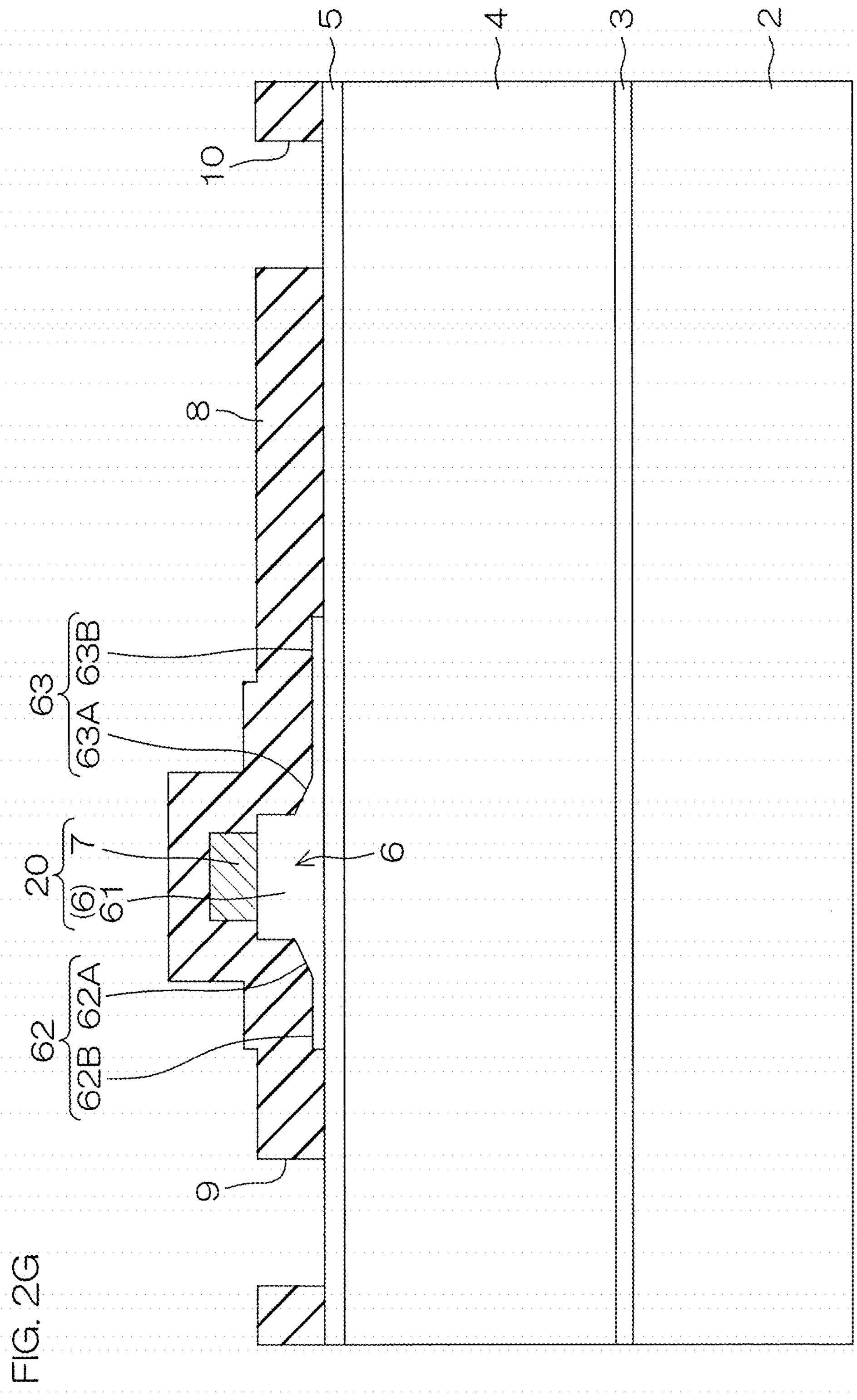
FIG. 2G is a sectional view of a step subsequent to that of FIG. 2F.

Next, as shown in FIG. 2G, the source contact hole 9 and the drain contact hole 10 are formed in the passivation film 8.

Figure 2H:
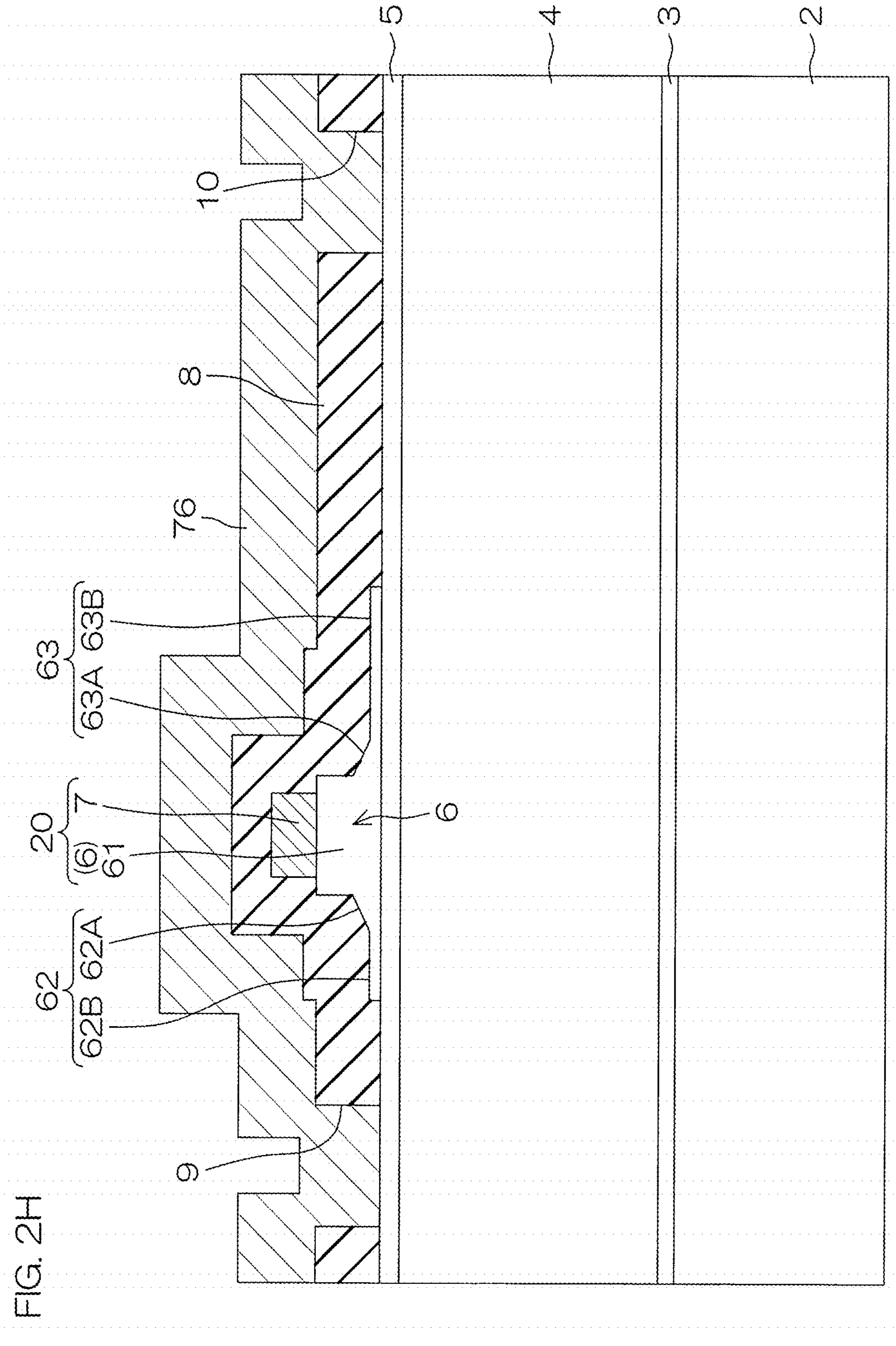
FIG. 2H is a sectional view of a step subsequent to that of FIG. 2G.

Next, as shown in FIG. 2H, a source/drain electrode film 76 is formed such as to cover entire surfaces that are exposed.

Lastly, the source/drain electrode film 76 is patterned by photolithography and etching to form the source electrode 11 and the drain electrode 12 that are in contact with the second nitride semiconductor layer 5. The nitride semiconductor device 1 with the structure such as shown in FIG. 1 is thereby obtained.

Figure 3:
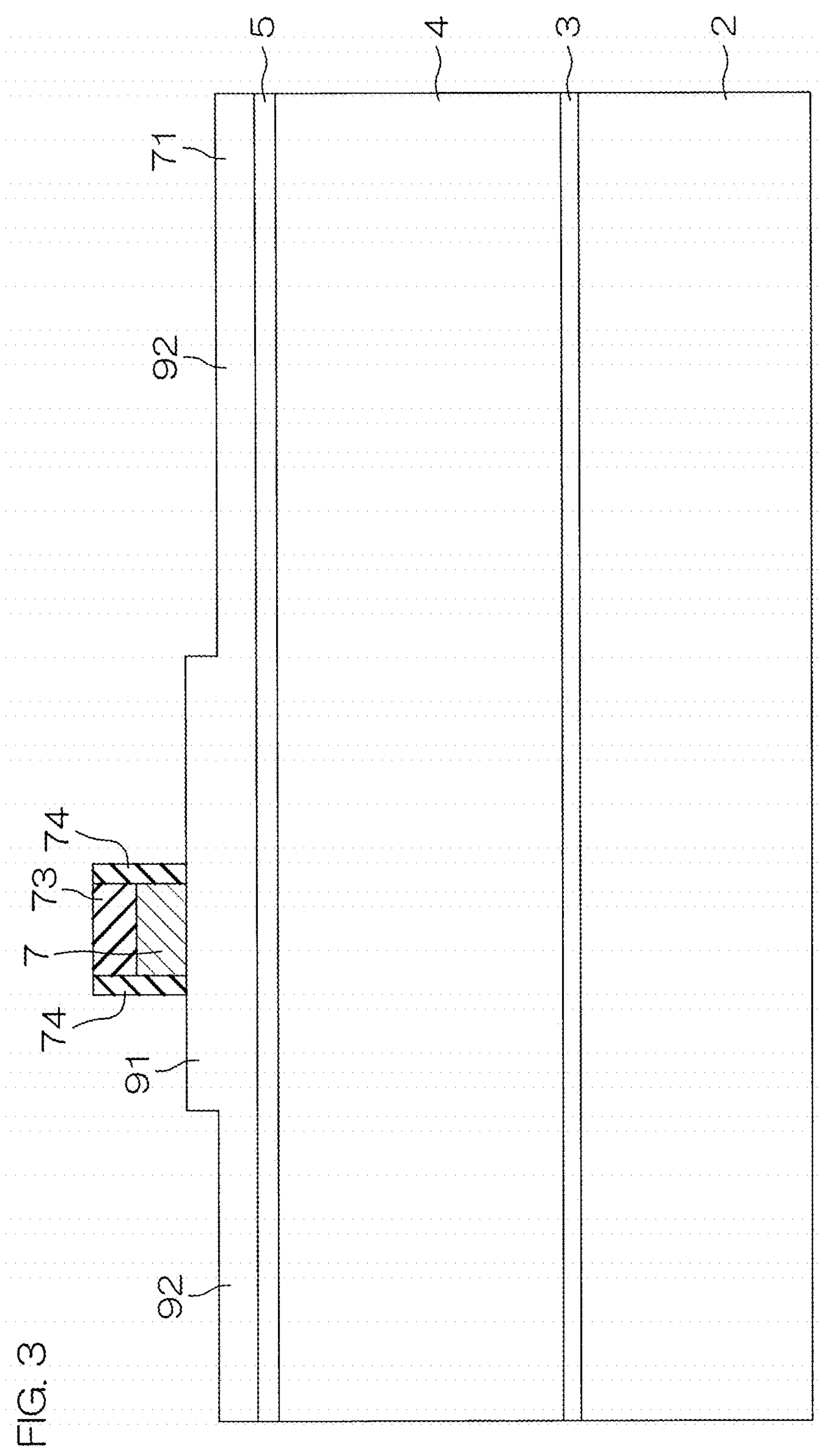
FIG. 3 is a sectional view of a modification example of the step of FIG. 2D.

Here, a step shown in FIG. 3 may be used in place of the step of FIG. 2D.

That is, when the step of FIG. 2C ends, the third semiconductor material film 71 is etched by a predetermined first depth in a predetermined first designated region by a first dry etching step using a resist (not shown), covering a formation planned region of the third nitride semiconductor layer 6, as a mask as shown in FIG. 3. Specifically, a region (the first designated region) that is not covered by the resist mask is etched by the predetermined first depth. The first depth is, for example, a depth of approximately ⅓ the thickness of the third semiconductor material film 71 (thickness of the ridge portion 61).

The third nitride semiconductor layer 71 after the first dry etching step is constituted of a thick film portion 91 directly below the first insulating film 73 and the second insulating film 74 and a thin film portion 92 besides the thick film portion 91.

Thereafter, the third semiconductor material film 71 is etched by a predetermined second depth in a predetermined second designated region by a second dry etching step using the first insulating film 73 and the second insulating film 74 as masks. Specifically, a region (the second designated region) of the third semiconductor material film 71 that is not covered by the first and second insulating films 73 and 74 is etched by the predetermined second depth. The second depth is a depth that is substantially equal to the thickness of the thick film portion 91 of FIG. 3.

The third semiconductor material film 71 after the second dry etching step is constituted of the ridge portion 61 directly below the first and second insulating films 73 and 74 and the extension portions 62 and 63 besides the ridge portion 61 as shown in FIG. 2E described above. As mentioned above, the extension portions 62 and 63 include the source side extension portion 62 and the drain side extension portion 63. The source side extension portion 62 is constituted of the tapered portion 62A and the flat portion 62B. The drain side extension portion 63 is constituted of the tapered portion 63A and the flat portion 63B.

The third nitride semiconductor layer 6 constituted of the ridge portion 61 and the extension portions 62 and 63 is thereby obtained. Also, the gate portion 20 constituted of the ridge portion 61 and the gate electrode 7 that is formed on the width intermediate portion of the ridge portion 61 upper surface is obtained.

In the second dry etching step, one step formation may be performed under a condition that the etching rate is slow in the vicinity of a structure (for example, with the bias applied to the etched object side being not more than 30 W in etching using ICP). Also, the second dry etching step may instead be constituted of a pre-process of etching the third semiconductor material film 71 from the front surface of the third semiconductor material film 71 to upper ends of the tapered portions 62A and 63A and a post-process of etching the third semiconductor material film 71 from the upper ends of the tapered portions 62A and 63A to the front surface of the second nitride semiconductor layer 5. In this case, the etching rate is changed between the pre-process and post-process, for example, by changing the amount of the etching gas and the electric power of plasma. Specifically, the etching rate in the post-process is made slower than the etching rate of the pre-process. When the step of FIG. 3 ends, the step of FIG. 2F described above is performed.

Figure 4:
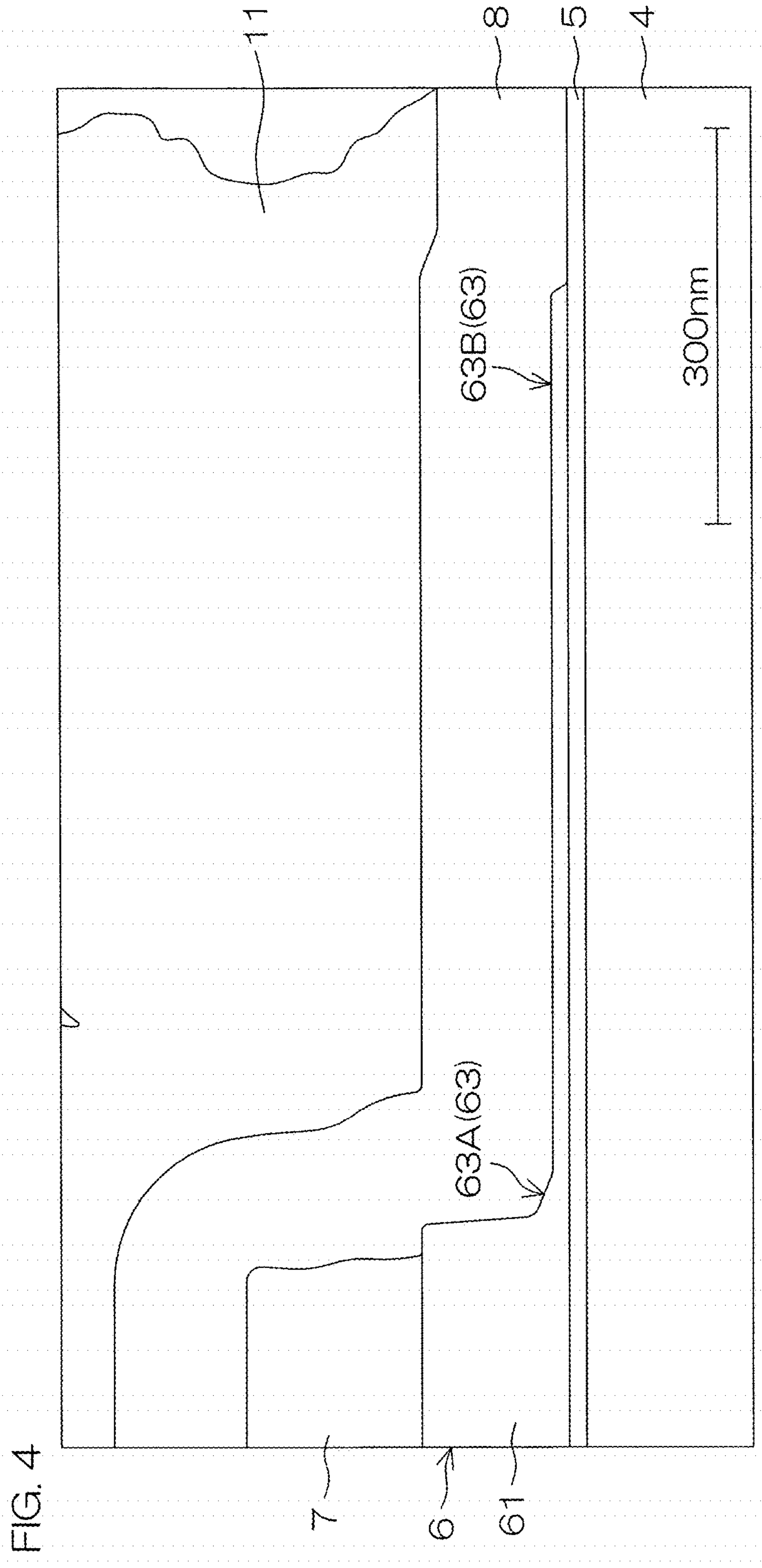
FIG. 4 is a sectional view replicating a STEM micrograph of a drain side extension portion and a vicinity thereof in the nitride semiconductor device of FIG. 1.

FIG. 4 is a sectional view replicating a STEM (scanning tunneling electron microscopy) micrograph of the drain side extension portion 63 and a vicinity thereof in the nitride semiconductor device of FIG. 1. From FIG. 4, it can be confirmed that the drain side extension portion 63 (in more detail, the flat portion 63B) is formed at a film thickness of approximately 10 nm.

Figure 8:
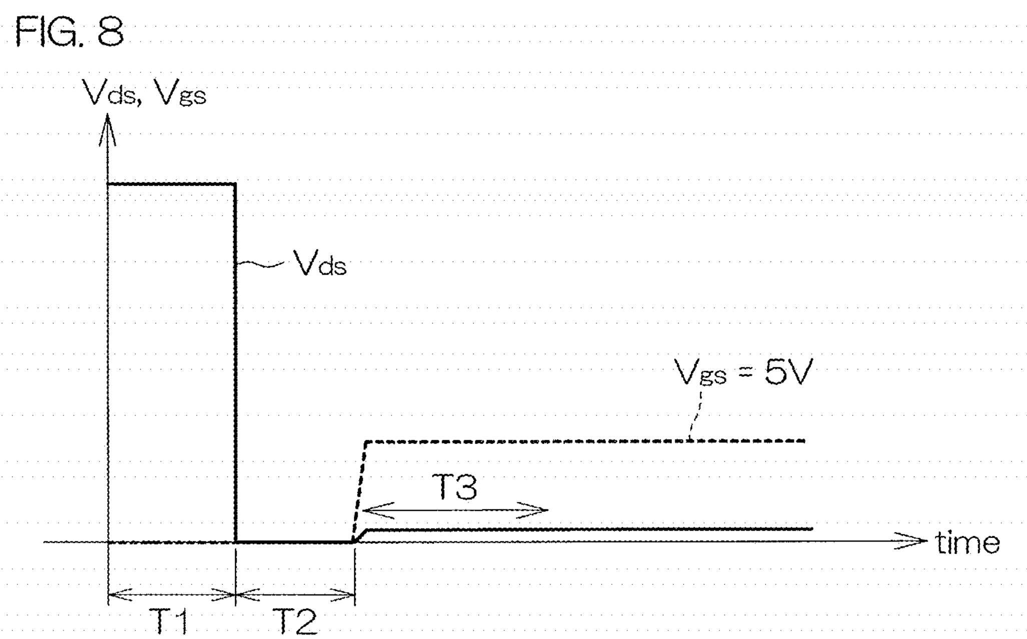
FIG. 8 is a graph for describing a method for measuring an on resistance after application of a drain voltage stress.

In the following, an arrangement where the extension portions 62 and 63 are omitted in the nitride semiconductor device 1 of FIG. 1 shall be referred to as a first comparative example. Also, a structure, where, as shown in FIG. 8 of Patent Literature 2, on an AlGaN electron supply layer, a thin-film p type GaN layer is formed across an entirety of a region besides a region in which thick-film p type GaN layer with a ridge shape is formed, shall be referred to as a second comparative example.

With the nitride semiconductor device 1 shown in FIG. 1, the third nitride semiconductor layer 6 has the extension portions 62 and 63 that extend outward from the portions below the thickness intermediate positions of the side surfaces of the ridge portion 61. Thereby, with the nitride semiconductor device 1 according to the first preferred embodiment, electron collapse can be suppressed and decrease in withstand voltage can be suppressed in comparison to the second comparative example while reducing gate leak current and increasing gate withstand voltage in comparison to the first comparative example. These effects shall be described in detail below.

Figure 5:
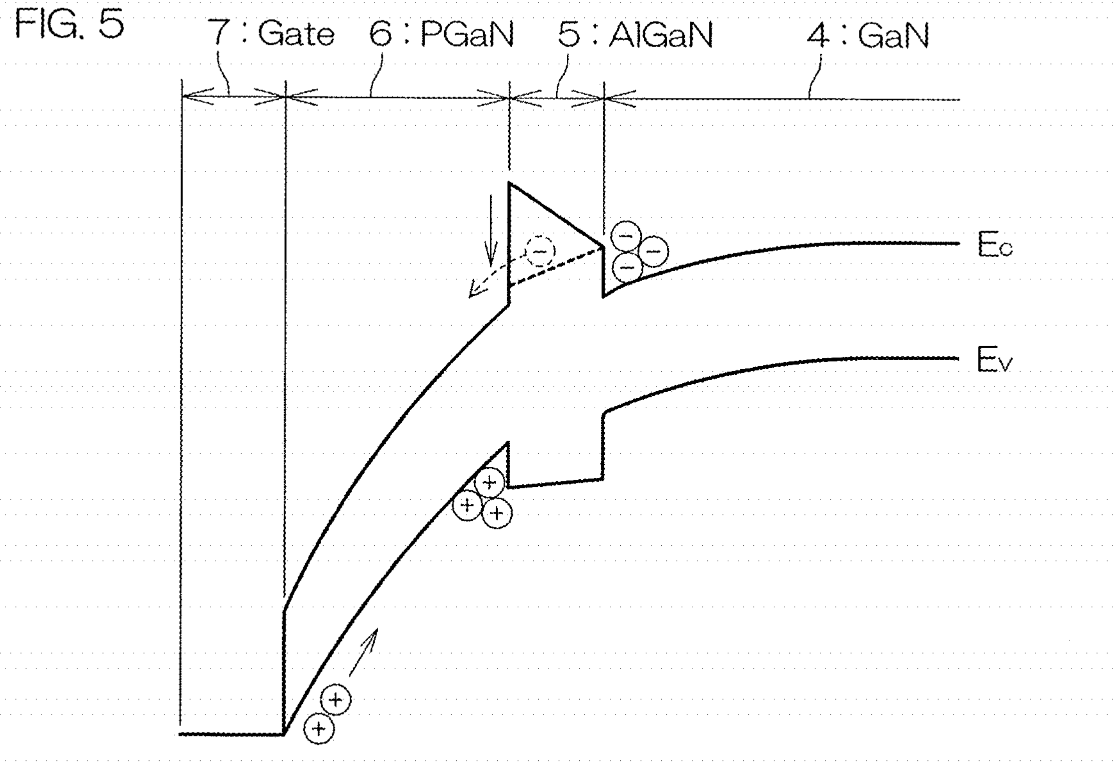
FIG. 5 is an energy band diagram for describing a mechanism by which gate leak current increases.

First, with reference to FIG. 5, a mechanism by which the gate leak current increases shall be described. FIG. 5 is an energy band diagram showing an energy distribution of the first comparative example. In FIG. 5, Ec is an energy level of a conduction band and Ev is an energy level of a valence band.

In the transistor-off state, as can be understood from the energy level Ec of the conduction band shown in FIG. 5, a barrier against electrons is formed inside the conduction band at the interface between the first nitride semiconductor layer 4 constituted of GaN and the second nitride semiconductor layer 5 constituted of AlGaN. Movement of electrons from the first nitride semiconductor layer 4 to the third nitride semiconductor layer 6 constituted of p type GaN is thereby suppressed and therefore, the gate leak current does not become large.

When a gate-source voltage $V_{gs}$ is applied between the gate electrode 7 and the source electrode 11, holes are injected from the gate electrode 7 into the third nitride semiconductor layer 6 constituted of p type GaN. As can be understood from the energy level Ev of the valence band, a barrier (valence band barrier) against holes is formed at an interface between the third nitride semiconductor layer 6 and the second nitride semiconductor layer 5 and therefore, the holes injected into the third nitride semiconductor layer 6 accumulate at the interface. The barrier (conductive band barrier) against electrons of the second nitride semiconductor layer 5 is then lowered as indicated by a broken line in FIG. 5 and it therefore becomes easy for electrons to move from the first nitride semiconductor layer 4 to the third nitride semiconductor layer 6. The gate leak current is thereby increased.

In the present preferred embodiment, the third nitride semiconductor layer 6 has the extension portions 62 and 63 and therefore, an area of the interface between the third nitride semiconductor layer 6 and the second nitride semiconductor layer 5 is increased in comparison to the first comparative example. Thereby, with the present preferred embodiment, a density of the holes that accumulate at the interface between the third nitride semiconductor layer 6 and the second nitride semiconductor layer 5 is decreased in comparison to the first comparative example. Thereby, with the present preferred embodiment, the lowering of the conductive band barrier of the second nitride semiconductor layer 5 is suppressed in comparison to the first comparative example and therefore, the gate leak current can be reduced in comparison to the first comparative example.

Figure 6:
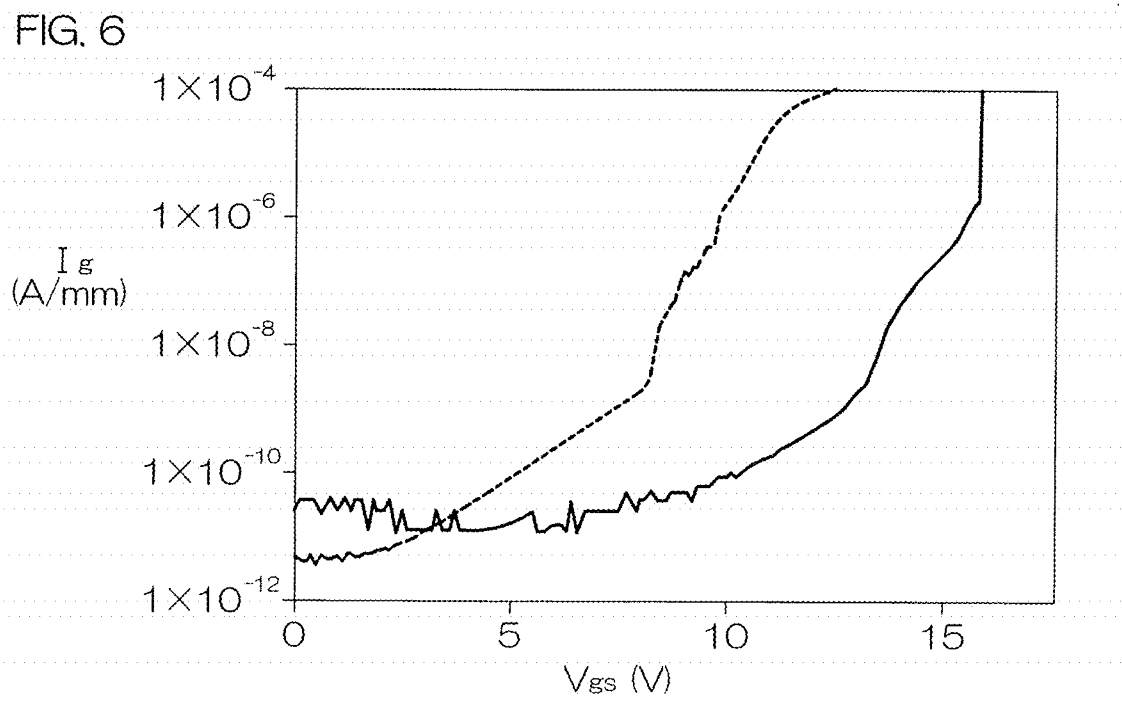
FIG. 6 is a graph of measurement results of gate leak current $I_g$ versus gate-source voltage $V_{gs}$ for each of the present preferred embodiment and a first comparative example.

FIG. 6 is a graph of measurement results of gate leak current $I_g$ versus gate-source voltage $V_{gs}$ for each of the present preferred embodiment and a first comparative example. In FIG. 6, a solid line represents the measurement results for the present preferred embodiment and a broken line represents the measurement results for the first comparative example.

From the graph of FIG. 6, it can be understood that, with the present preferred embodiment, the gate leak current $I_g$ is decreased in comparison to the first comparative example in a range in which the gate-source voltage $V_{gs}$ is not less than 3 V.

Figure 7:
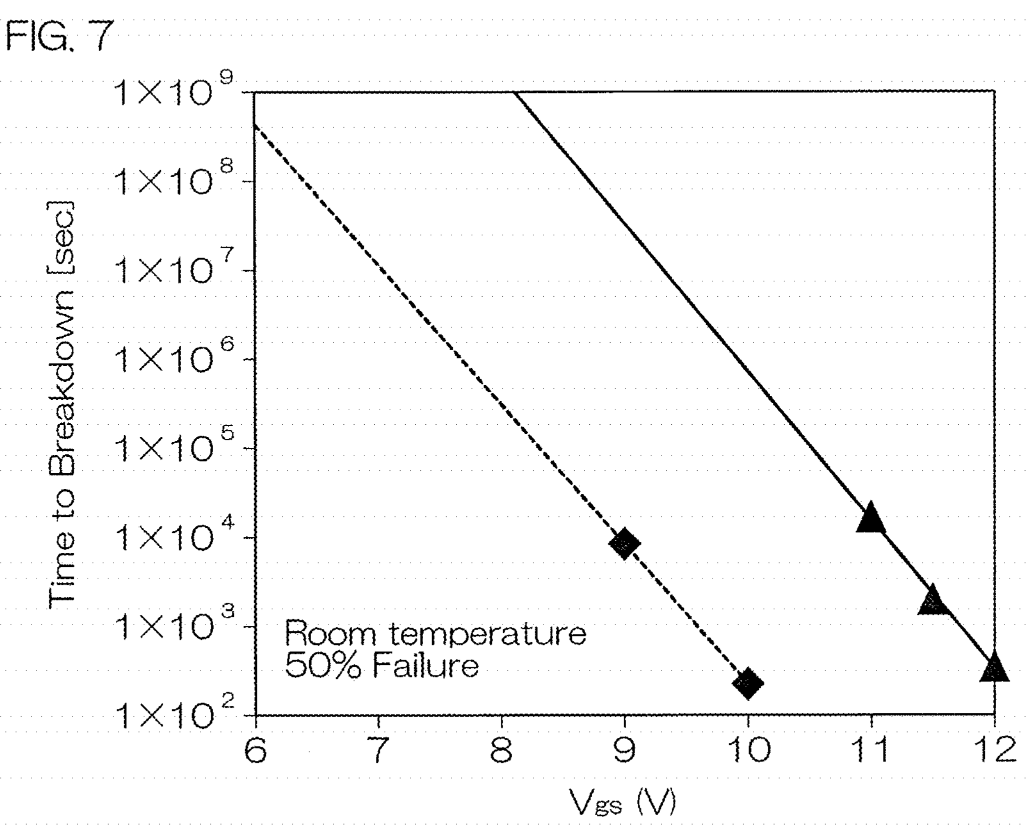
FIG. 7 is a graph of measurement results of time to breakdown obtained by a TDDB test versus gate-source voltage $V_{gs}$ for each of the present preferred embodiment and the first comparative example.

FIG. 7 is a graph of measurement results of time to breakdown obtained by a TDDB (time dependent dielectric breakdown) test versus gate-source voltage $V_{gs}$ for each of the present preferred embodiment and the first comparative example. In FIG. 7, a solid line represents the measurement results for the present preferred embodiment and a broken line represents the measurement results for the first comparative example.

From the graph of FIG. 7, it can be understood that with the present preferred embodiment, durability from a standpoint of lifetime with respect to the gate-source voltage $V_{gs}$ is also improved by approximately 2 V in comparison to the first comparative example.

On the other hand, current collapse is a phenomenon where, in the transistor-off state, electrons trapped at an AlGaN electron supply layer surface or within a GaN electron transit layer due to a voltage applied between the drain and the source obstructs the two-dimensional electron gas 13 and increases the on resistance.

With the present preferred embodiment, since the third nitride semiconductor layer 6 has the extension portions 62 and 63, a physical distance between an etched surface in a vicinity of a gate portion (in the present preferred embodiment, front surfaces of the extension portions 62 and 63) and the two-dimensional electron gas 13 can be made large in comparison to the first comparative example. Meanwhile, an etched surface in a vicinity of a gate portion in the first comparative example is the front surface of the second nitride semiconductor layer 5. Electrons trapped at the etched surface in the vicinity of the gate portion can thereby be suppressed from obstructing the two-dimensional electron gas 13 and therefore, current collapse is suppressed.

For the present preferred embodiment and the first comparative example, a collapse factor CF that is an index of a magnitude of current collapse was measured for each of a plurality of drain-source voltages $V_{ds}$. If $R_{on(initial)}$ is an on resistance before stress application and $R_{on(after\ stress)}$ is an on resistance after stress application, the collapse factor CF for a predetermined drain-source voltage $V_{ds}$ is expressed by formula (1) given below.

$$CF = R_{on(after\ stress)}/R_{on(initial)} \quad (1)$$

The collapse factor CF is an index such that a smaller CF indicates a smaller current collapse.

The on resistance after drain stress application for a predetermined drain-source voltage $V_{ds}$ is measured as follows. That is, referring to FIG. 8, after applying the predetermined drain-source voltage $V_{ds}$ between the source electrode 11 and the drain electrode 12 for just a predetermined first time T1 (for example, of 1 sec to 2 sec), the drain-source voltage $V_{ds}$ is set to zero. Then, when a predetermined time T2 (for example, of 100 μsec) elapses, the predetermined drain-source voltage $V_{ds}$ is applied between the source electrode 11 and the drain electrode 12 and, at the same time, a predetermined gate-source voltage $V_{gs}$ is applied between the source electrode 11 and the gate electrode 7. The on resistance $R_{on(after\ stress)}$ after stress application is measured within a period T3 thereafter. The on resistance $R_{on(after\ stress)}$ before stress application is measured before the stress application.

Figure 9:
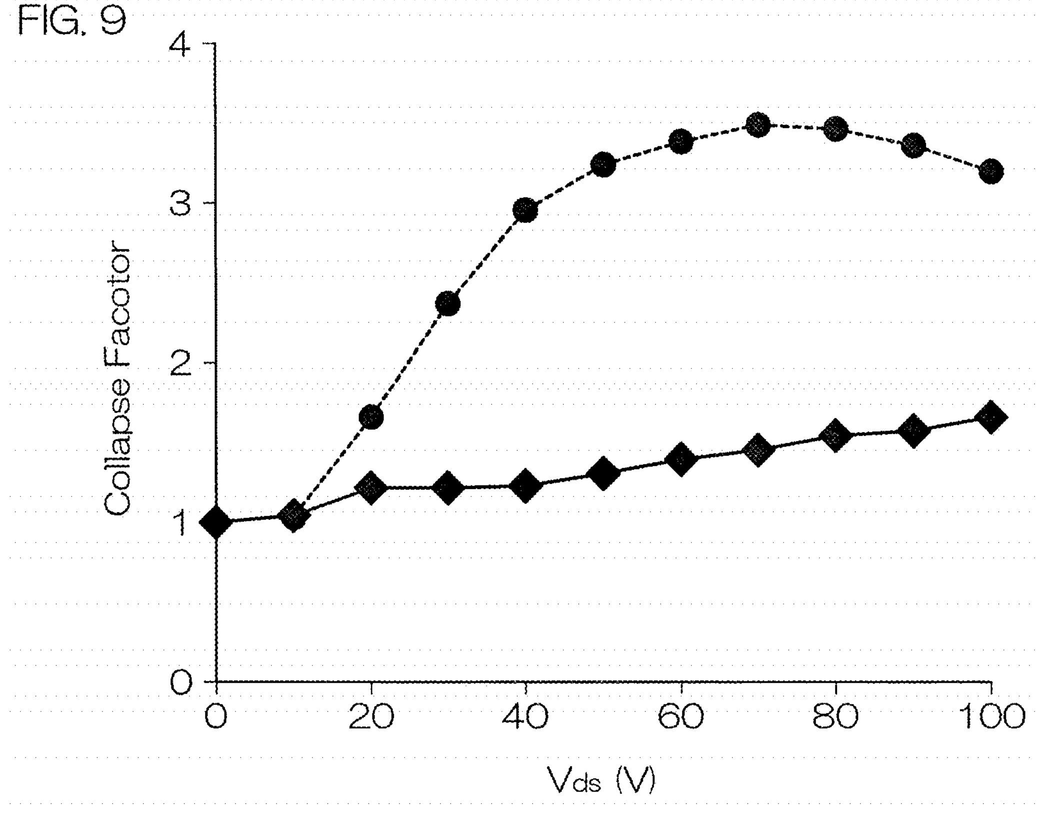
FIG. 9 is a graph of measurement results of collapse factor CF versus gate-source voltage $V_{gs}$ for each of the present preferred embodiment and the first comparative example.

FIG. 9 is a graph of measurement results of collapse factor CF versus drain-source voltage $V_{ds}$ for each of the present preferred embodiment and the first comparative example. In FIG. 9, a solid line represents the measurement results for the present preferred embodiment and a broken line represents the measurement results for the first comparative example.

From the graph of FIG. 9, it can be understood that with the present preferred embodiment, the collapse factor CF is decreased in comparison to the first comparative example. That is, it can be understood that with the present preferred embodiment, current collapse is suppressed in comparison to the first comparative example.

With the second comparative example, if the two-dimensional electron gas between the gate and the drain is to be depleted by a source field plate, the following problem occurs. That is, since the thin-film p type GaN layer is present between a drain electrode side end of the source field plate and the two-dimensional electron gas, a depletion layer cannot be spread effectively to the two-dimensional electron gas by the source field plate and a withstand voltage decreases.

On the other hand, with the present preferred embodiment, a drain electrode side end of the drain side extension portion 63 is formed between the side face of the ridge portion 61 at the drain electrode 12 side and a drain electrode side end 11C of the source field plate portion 11B in plan view. In other words, the extension portions 62 and 63 are not present directly below the drain electrode side end 12C of the source field plate portion 11B. Thereby, a depletion layer can be spread effectively to the two-dimensional electron gas by the source field plate portion 11B and therefore, decrease in withstand voltage can be suppressed in comparison to the second comparative example.

Figure 10:
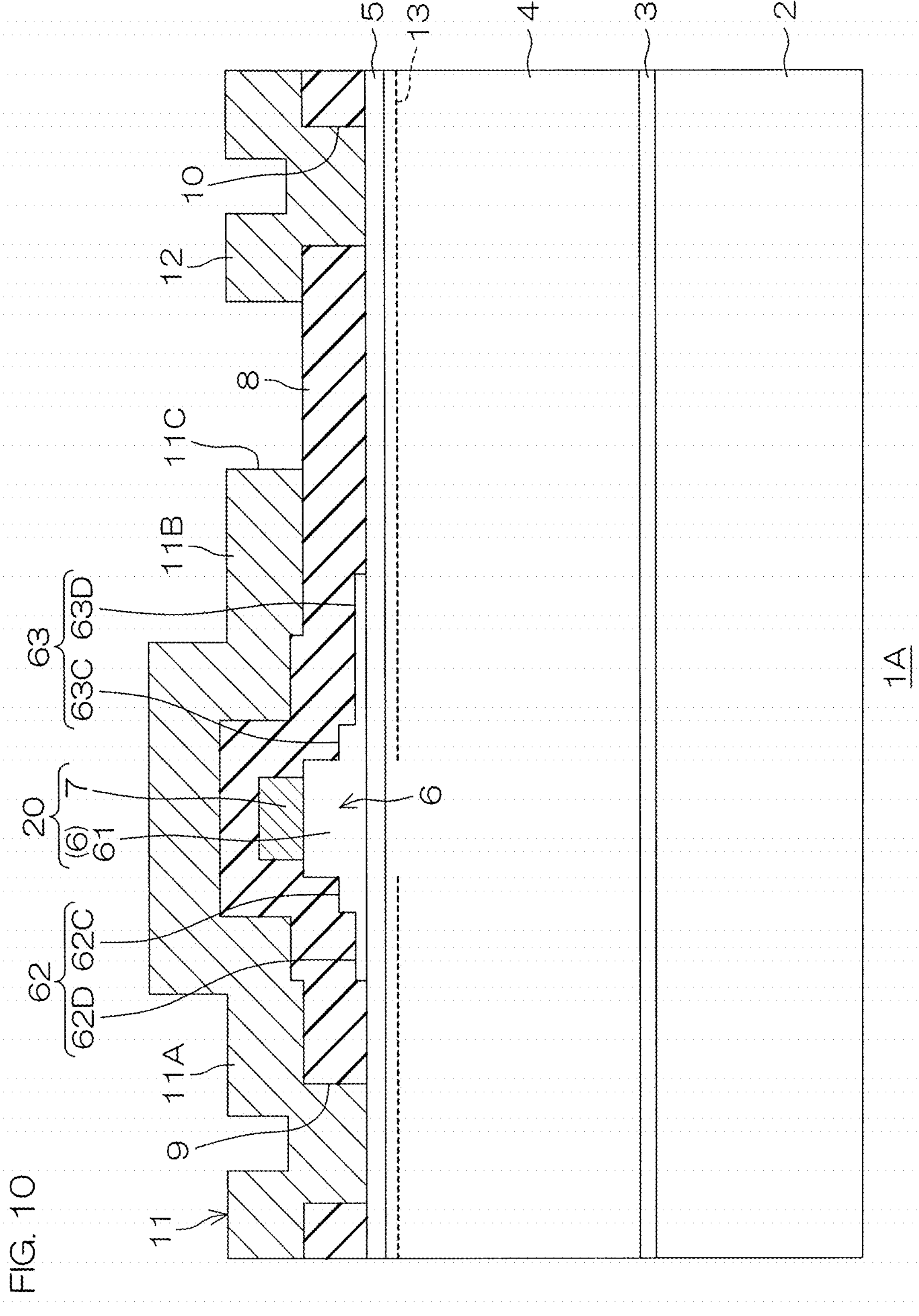
FIG. 10 is a sectional view for describing the arrangement of a nitride semiconductor device according to a second preferred embodiment of the present disclosure.

FIG. 10 is a sectional view for describing the arrangement of a nitride semiconductor device according to a second preferred embodiment of the present disclosure. In FIG. 10, portions corresponding to respective portions in FIG. 1 described above are indicated with the same reference signs attached as in FIG. 1.

The nitride semiconductor device 1A according to the second preferred embodiment differs from the first preferred embodiment in that portions 62C and 63C corresponding to the tapered portions 62A and 63A of the nitride semiconductor device 1 of FIG. 1 are respectively formed to first flat portions 62C and 63C that are thicker in film thickness than portions 62D and 63D corresponding to the flat portions 62B and 63B of the nitride semiconductor device 1 of FIG. 1.

That is, with the nitride semiconductor device 1A according to the second preferred embodiment, the source side extension portion 62 is constituted of the first flat portion (thick film portion) 62C of rectangular shape in cross section that extends towards the source contact hole 9 from a portion below a thickness intermediate position of the side surface of the ridge portion 61 at the source electrode 11 side and the second flat portion (thin film portion) 62D of rectangular shape in cross section that extends towards the source contact hole 9 from a portion below a thickness intermediate position of a side surface of the first flat portion 62C at the source electrode 11 side.

Also, the drain side extension portion 63 is constituted of the first flat portion (thick film portion) 63C of rectangular shape in cross section that extends towards the drain contact hole 10 from a portion below a thickness intermediate position of the side surface of the ridge portion 61 at the drain electrode 12 side and a second flat portion (thin film portion) 63D of rectangular shape in cross section that extends towards the drain contact hole 10 from a portion below a thickness intermediate position of a side surface of the first flat portion 63C at the drain electrode 12 side.

Figure 11A:
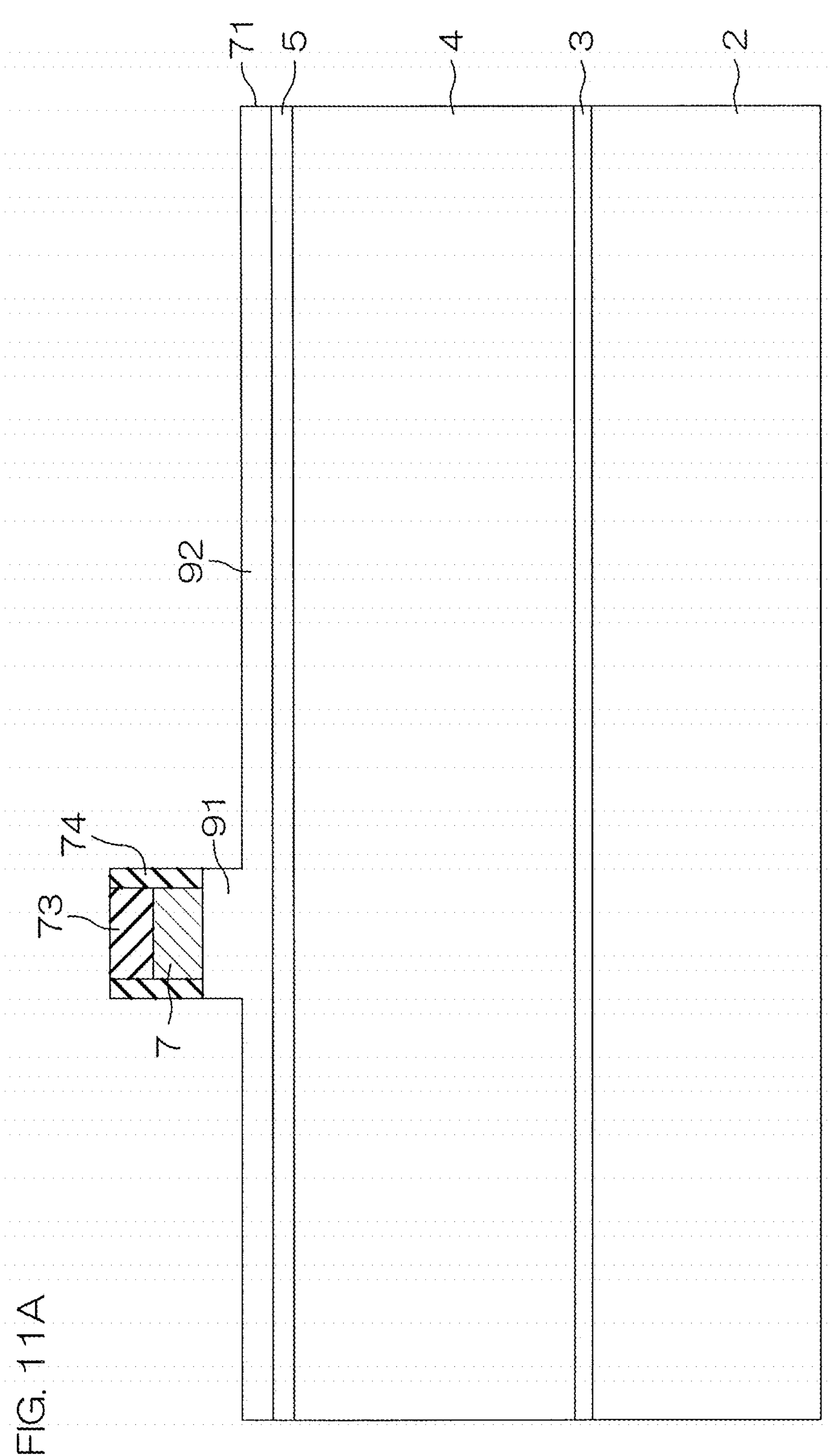
FIG. 11A is a sectional view of an example of a manufacturing process of the nitride semiconductor device of FIG. 10.
Figure 11B:
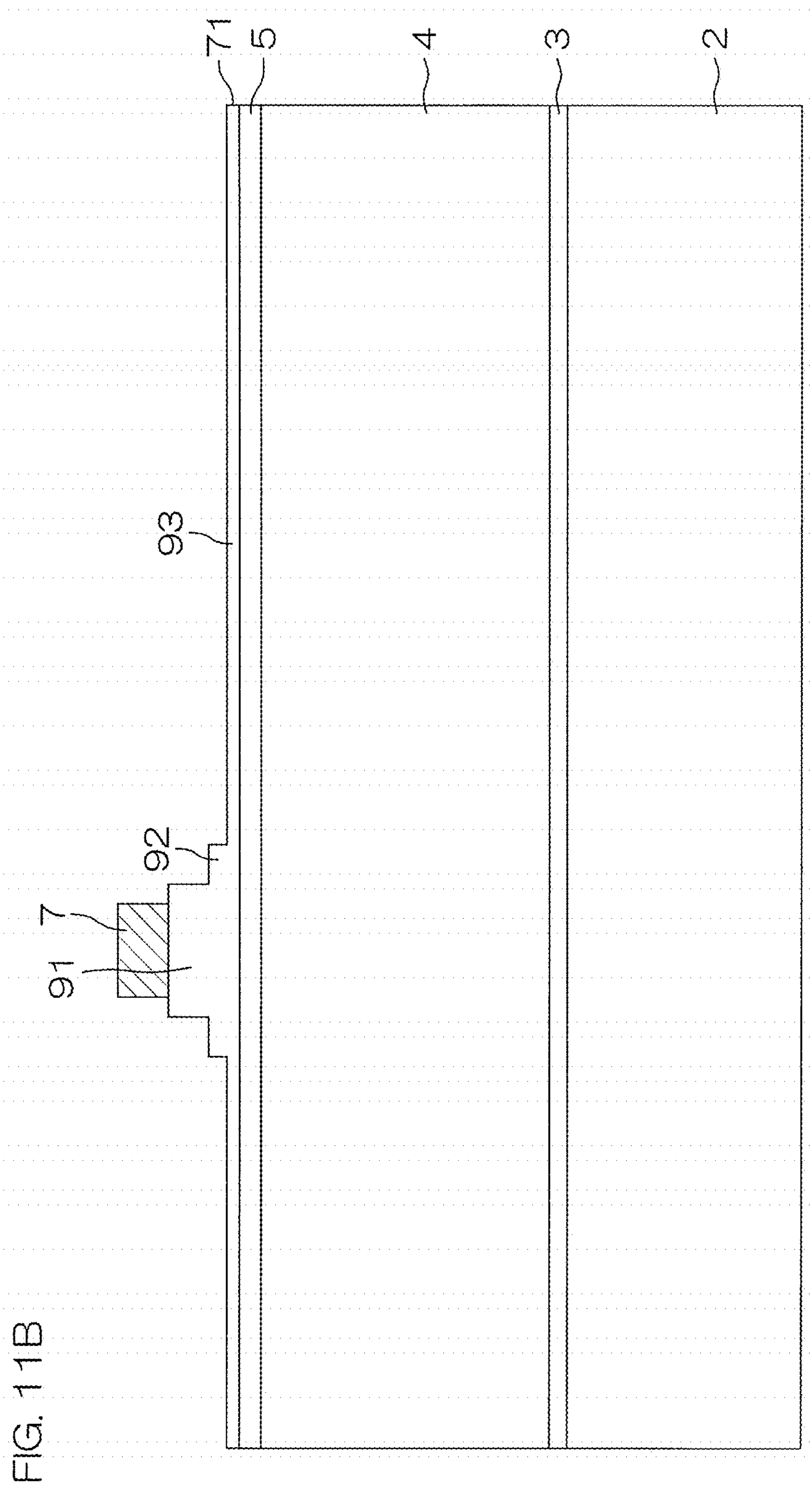
FIG. 11B is a sectional view of a step subsequent to that of FIG. 11A.
Figure 11C:
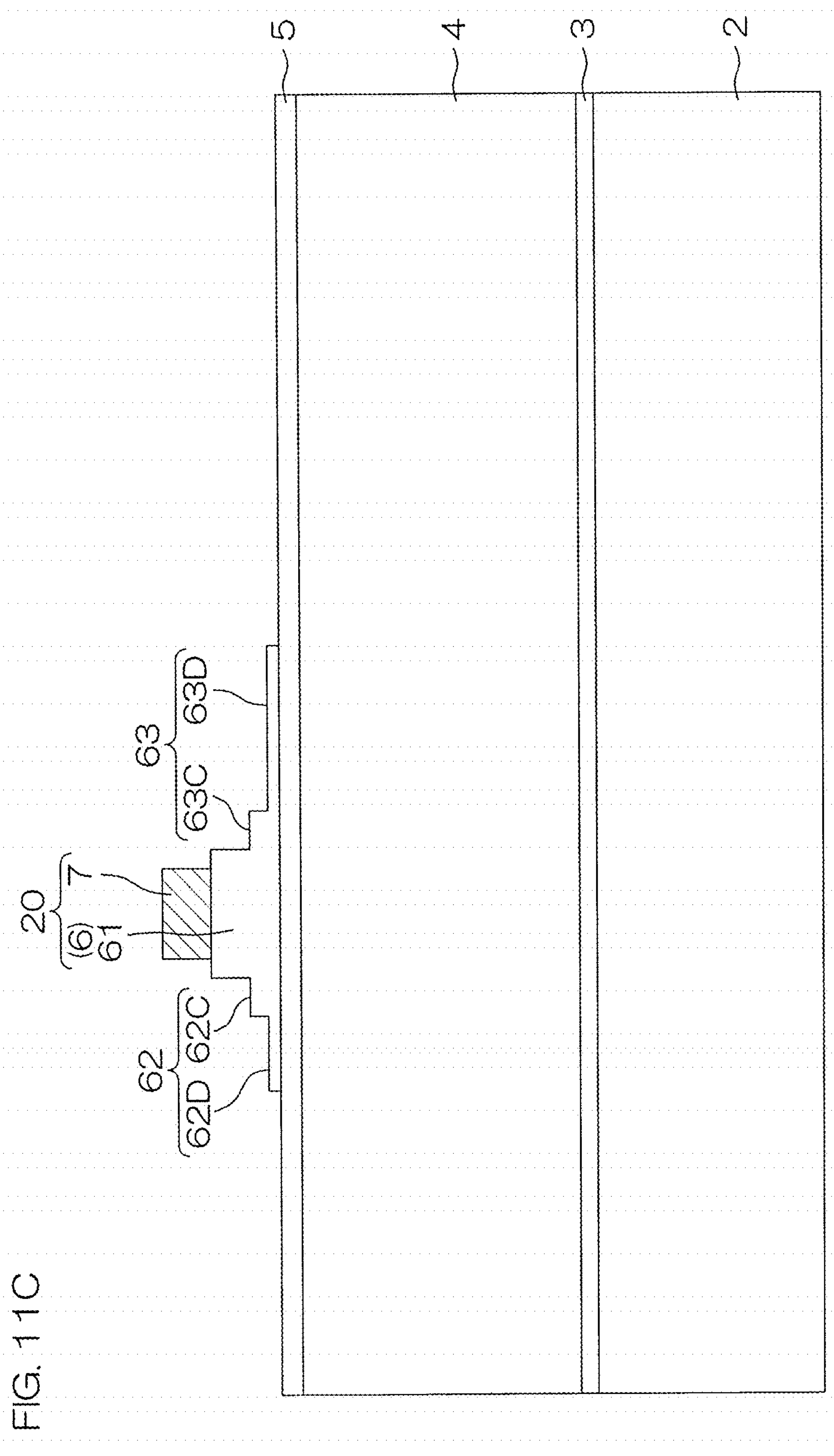
FIG. 11C is a sectional view of a step subsequent to that of FIG. 11B.

FIG. 11A to FIG. 11C are sectional views for describing an example of a method for manufacturing the nitride semiconductor device 1A according to the second preferred embodiment and show a cross-sectional structure at a plurality of stages of the manufacturing method.

To manufacture the nitride semiconductor device 1A according to the second preferred embodiment, first, the steps shown in FIG. 2A to FIG. 2C described above are performed. Here, it shall be deemed that the thickness of the third semiconductor material film 71 shall be deemed to be approximately 110 nm. When the step of FIG. 2C ends, the third semiconductor material film 71 is etched by a first dry etching step using the first insulating film 73 and the second insulating film 74 as masks until a thickness of a region (first designated region) of the third semiconductor material film 71 that is not covered by the masks becomes approximately 30 nm as shown in FIG. 11A. In other words, the first designated region is etched by just a predetermined first depth. The first depth is approximately 80 nm (=110 nm−30 nm). The third semiconductor material film 71 after the first dry etching step is constituted of the thick film portion 91 directly below the first insulating film 73 and the second insulating film 74 and the thin film portion 92 besides the thick film portion 91.

Next, after the first insulating film 73 and the second insulating film 74 are removed, a thickness of the first designated region is calculated from a result of etched step measurement by an atomic force microscope (AFM).

Next, as shown in FIG. 11B, the third semiconductor material film 71 is etched by a dry etching step (hereinafter referred to as the "third etching step") using a resist (not shown), covering a formation planned region of the ridge portion 61 and the first flat portions 62C and 63C, as a mask until a region (third designated region) of the third semiconductor material film 71 that is not covered by the resist mask becomes approximately 10 nm. In other words, the third designated region is etched by just a predetermined third depth. The third depth is approximately 20 nm (=30 nm−10 nm). The third semiconductor material film 71 after the third etching step is constituted of the thick film portion 91 directly below the first insulating film 73 and the second insulating film 74, the first thin film portions 92 at both sides of the thick film portion 91, and second thin film portions 93 at outer sides of both first thin film portions 92.

Next, as shown in FIG. 11C, the third semiconductor material film 71 is etched by a dry etching step (hereinafter referred to as the "second etching step") using a resist (not shown), covering a formation planned region of the third nitride semiconductor layer 6, as a mask, until a region (second designated region) of the third semiconductor material film 71 that is not covered by the resist mask is removed. In other words, the second designated region is etched by just a predetermined second depth. The second depth is, for example, substantially equal to the thickness of the second flat portions 62D and 63D. The third semiconductor material film 71 after the second etching step is constituted of the ridge portion 61 and the extension portions 62 and 63 besides the ridge portion 61.

Thereafter, by the same steps as those of FIG. 2F described above and onward being performed, the nitride semiconductor device 1A with the structure such as shown in FIG. 10 is obtained.

Figure 12:
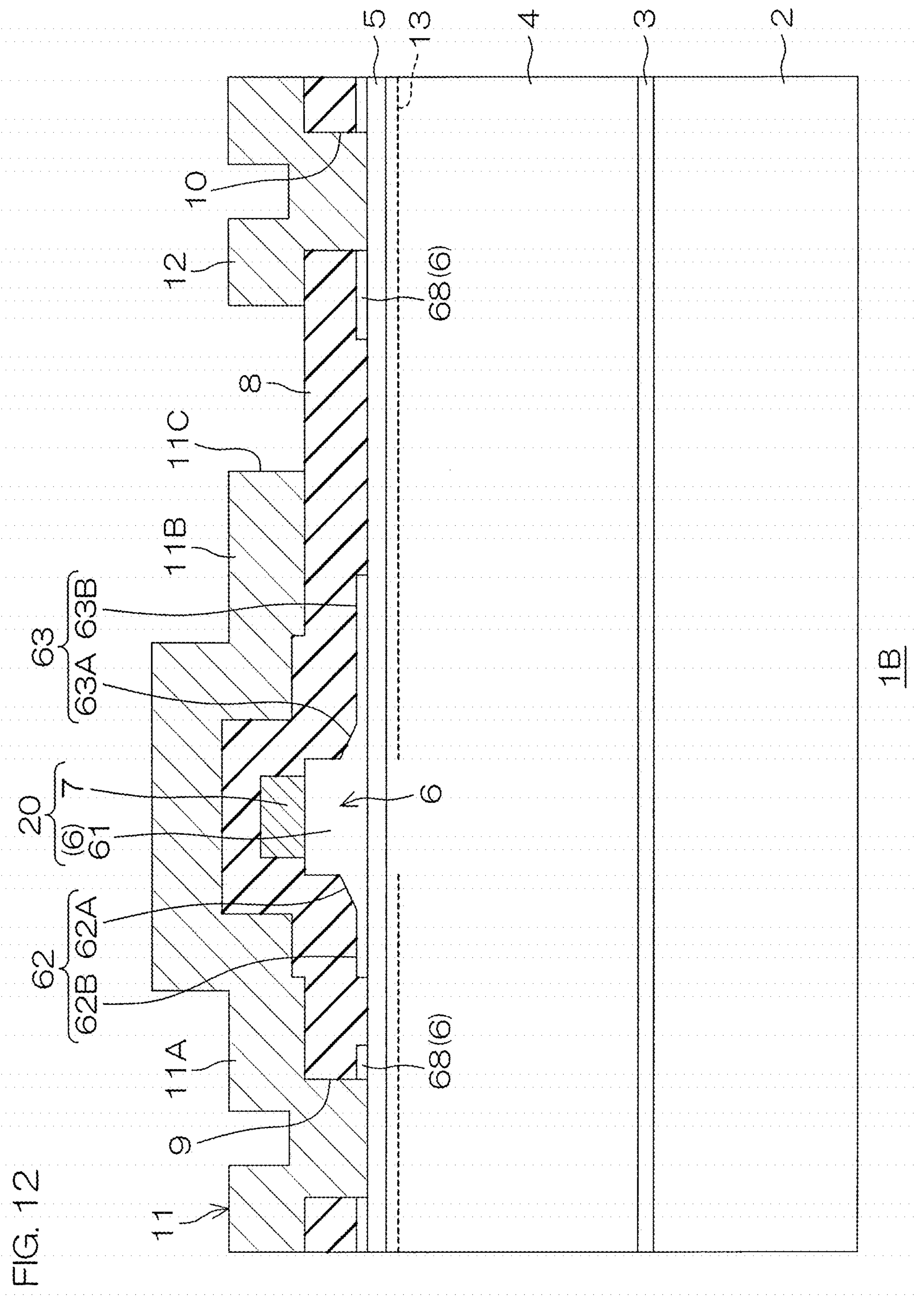
FIG. 12 is a sectional view for describing the arrangement of a nitride semiconductor device according to a third preferred embodiment of the present disclosure.

FIG. 12 is a sectional view for describing the arrangement of a nitride semiconductor device according to a third preferred embodiment of the present disclosure. In FIG. 12, portions corresponding to respective portions in FIG. 1 described above are indicated with the same reference signs attached as in FIG. 1.

With the nitride semiconductor device 1B according to the third preferred embodiment, the third nitride semiconductor layer 6 has a separated portion 68 that is disposed such as to sandwich the source electrode 11 (source contact hole 9) and a separated portion 68 that is disposed such as to sandwich the drain electrode 12 (drain contact hole 10). These separated portions 68 are not connected to the ridge portion 61 and have a film thickness that is thinner than the film thickness of the ridge portion 61. The separated portion 68 at the source electrode 11 side contacts the source electrode 11 and the separated portion 68 at the drain electrode 12 side contacts the drain electrode 12. In the example of FIG. 12, the film thickness of the separated portions 68 is substantially equal to the film thickness of the extension portions 62 and 63 (in detail, the flat portions 62B and 63B).

With the nitride semiconductor device 1B according to the third preferred embodiment, in regions in which the separated portions 68 are formed, the influence on the two-dimensional electron gas of the electrons trapped at the etched surface in the transistor-off state is reduced in comparison to the nitride semiconductor device 1 according to the first preferred embodiment. Electron collapse can thereby be suppressed more effectively in comparison to the nitride semiconductor device 1 according to the first preferred embodiment.

Figure 13:
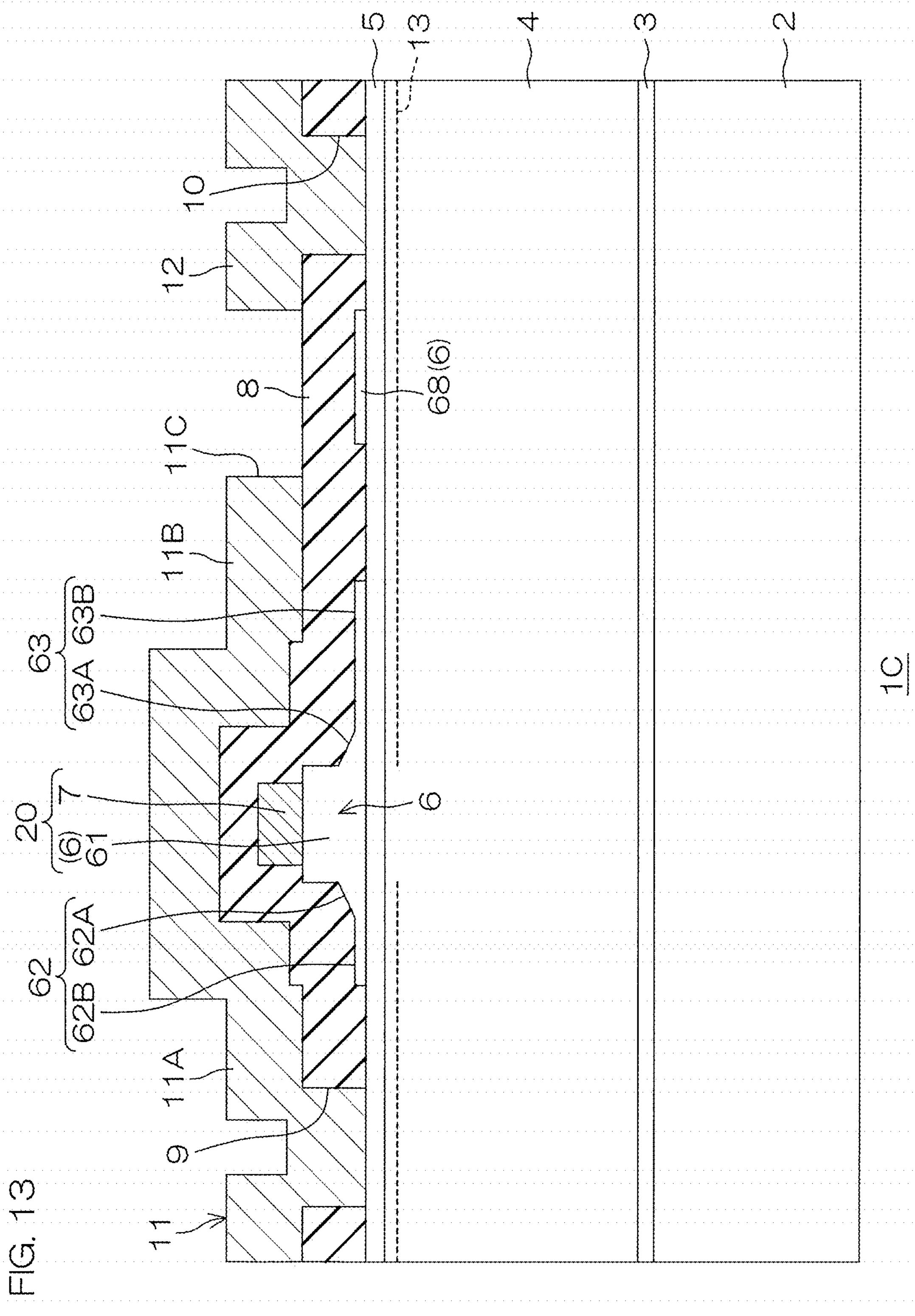
FIG. 13 is a sectional view for describing the arrangement of a nitride semiconductor device according to a fourth preferred embodiment of the present disclosure.

FIG. 13 is a sectional view for describing the arrangement of a nitride semiconductor device according to a fourth preferred embodiment of the present disclosure. In FIG. 13, portions corresponding to respective portions in FIG. 1 described above are indicated with the same reference signs attached as in FIG. 1.

With the nitride semiconductor device 1C according to the fourth preferred embodiment, the third nitride semiconductor layer 6 has a separated portion 68 that is disposed in a region between the drain side extension portion 63 and the drain contact hole 10. The separated portion 68 is not connected to the ridge portion 61 and has a film thickness that is thinner than the film thickness of the ridge portion 61. The film thickness of the separated portion 68 is substantially equal to the film thickness of the extension portions 62 and 63 (in detail, the flat portions 62B and 63B).

With the nitride semiconductor device 1C according to the fourth preferred embodiment, the same effects as the nitride semiconductor device 1B according to the third preferred embodiment are obtained.

Figure 14:
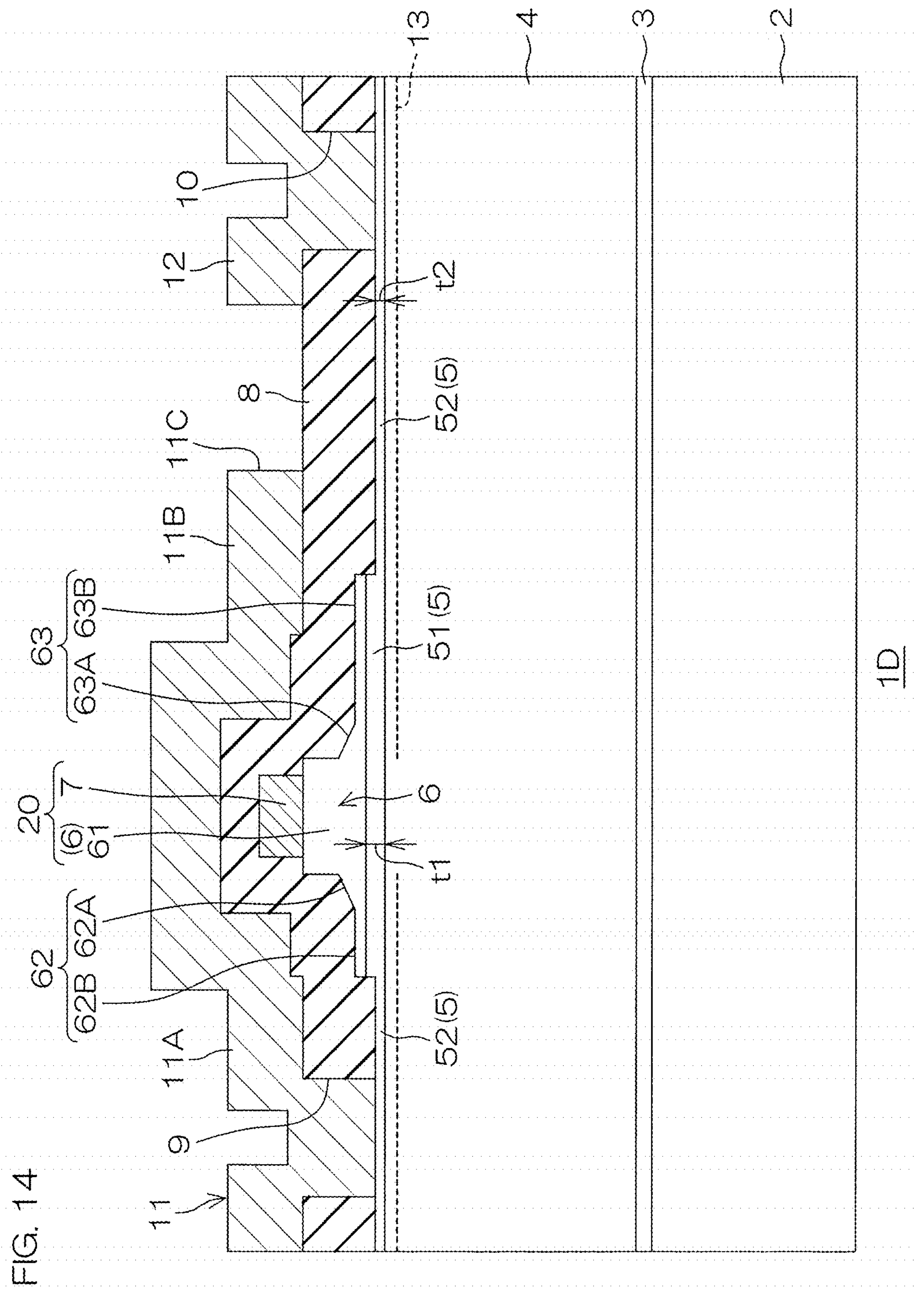
FIG. 14 is a sectional view for describing the arrangement of a nitride semiconductor device according to a fifth preferred embodiment of the present disclosure.

FIG. 14 is a sectional view for describing the arrangement of a nitride semiconductor device according to a fifth preferred embodiment of the present disclosure. In FIG. 14, portions corresponding to respective portions in FIG. 1 described above are indicated with the same reference signs attached as in FIG. 1.

With the nitride semiconductor device 1D according to the fifth preferred embodiment, a film thickness t1 of a first portion 51 of the second nitride semiconductor layer 5 above which the third nitride semiconductor layer 6 (in detail, the ridge portion 61 and the extension portions 62 and 63) is present and a film thickness t2 of a second portion 52 of the second nitride semiconductor layer 5 above which the third nitride semiconductor layer 6 is not present differ. Specifically, the film thickness t2 of the second portion 52 is thinner than the film thickness t1 of the first portion 51.

With the nitride semiconductor device 1D according to the fifth preferred embodiment, the film thickness t2 of the second nitride semiconductor layer 5 (second portion 52) below the drain electrode side end 11C of the source field plate portion 11B is thinner than the film thickness t1 of the first portion 51. However, in a vicinity of the gate electrode, the film thickness of the second nitride semiconductor layer 5 (first portion 51) is thicker than the film thickness of the second portion 52.

Therefore, in comparison to a case where the film thickness t2 of the second portion 52 and the film thickness t1 of the first portion 51 are the same, a density of the two-dimensional electron gas 13 below the drain electrode side end 11C of the source field plate portion 11B can be reduced. Thereby, the electric field concentration in the transistor-off state can be reduced and current collapse can be suppressed.

Figure 15:
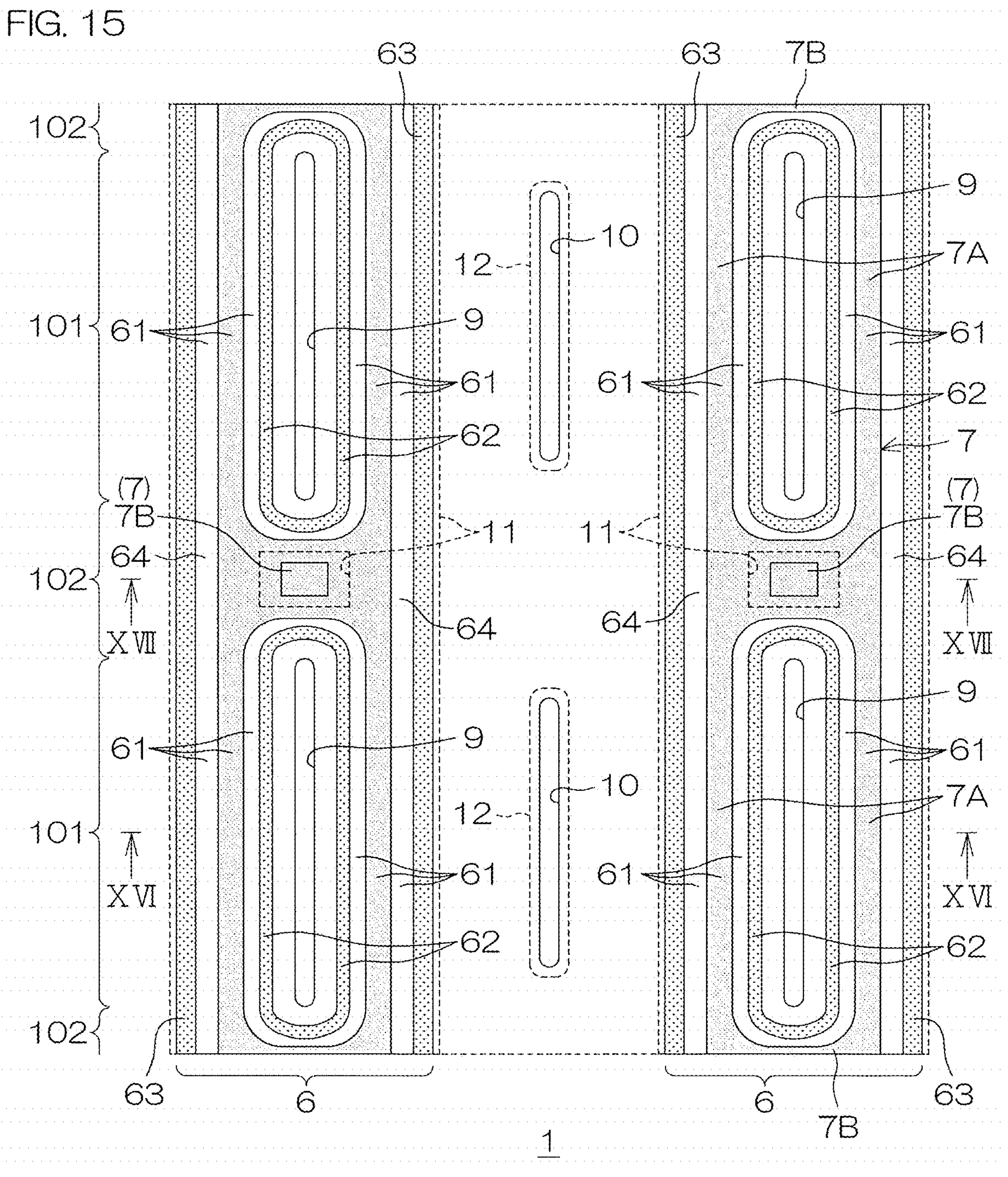
FIG. 15 is an illustrative plan view of an example of a planar pattern of gate electrodes, source electrodes, drain electrodes, and a third nitride semiconductor layer of the nitride semiconductor device of FIG. 1.
Figure 16:
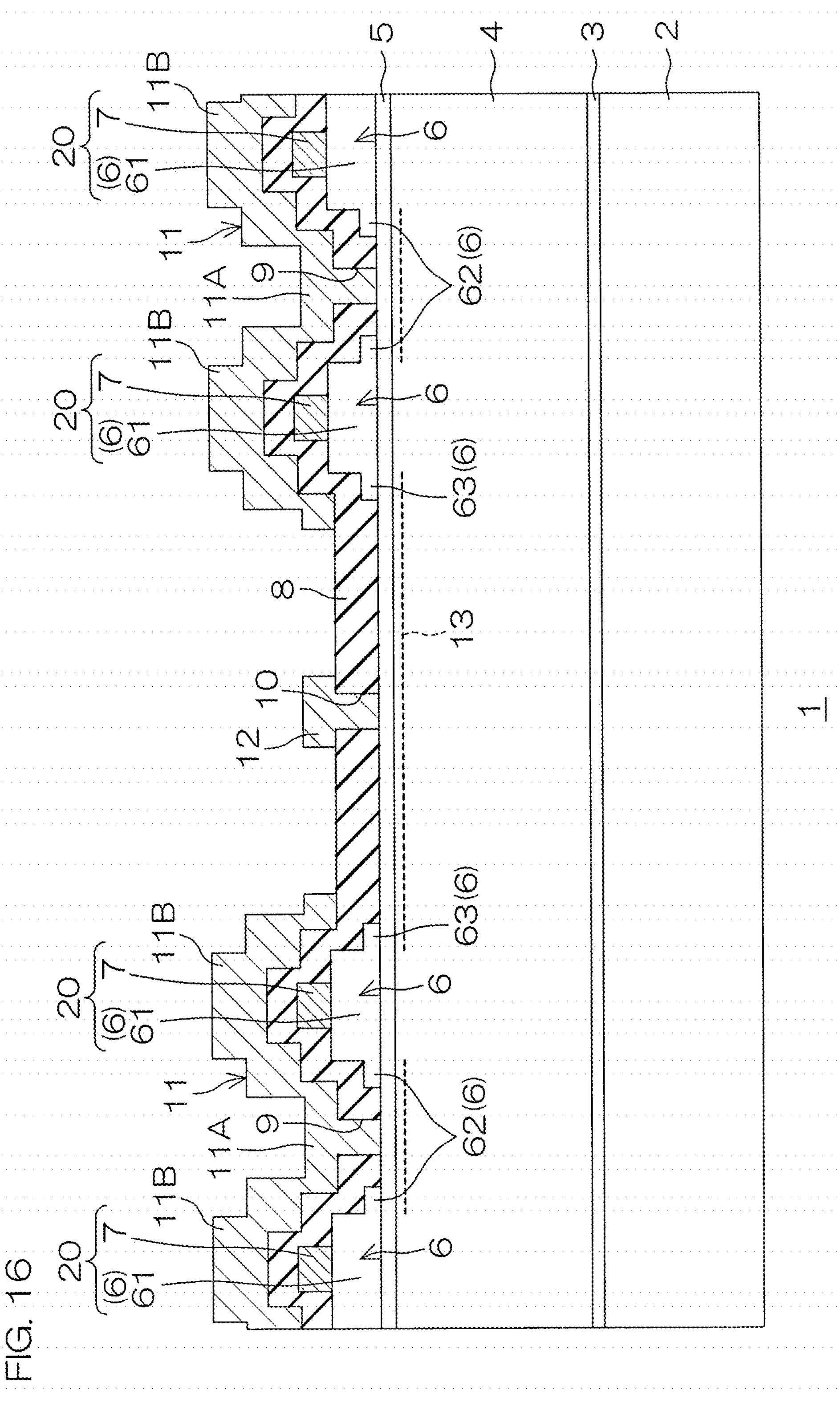
FIG. 16 is a sectional view taken along line XVI-XVI of FIG. 15.
Figure 17:
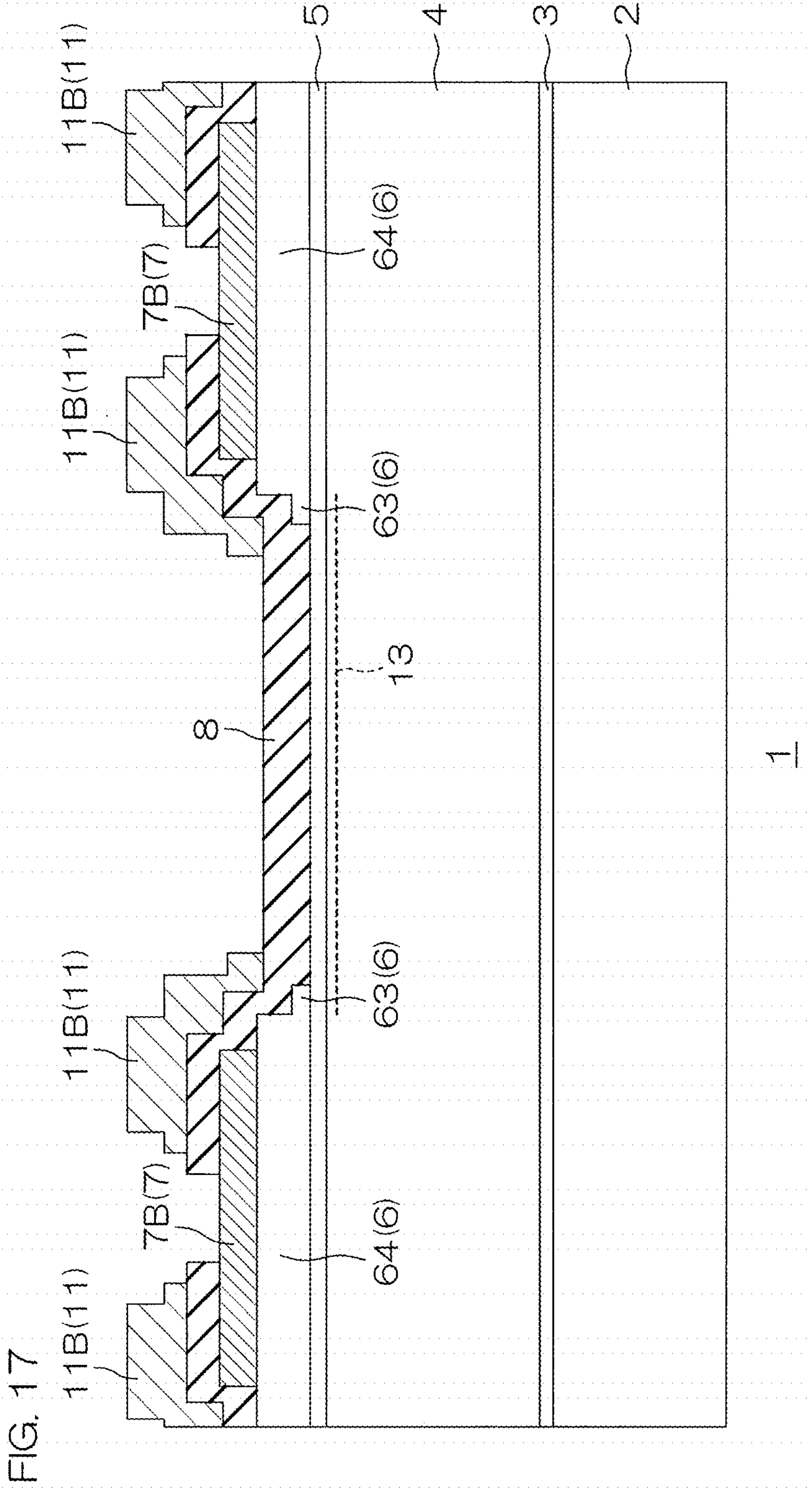
FIG. 17 is a sectional view taken along line XVII-XVII of FIG. 15.

FIG. 15 is an illustrative plan view of an example of a planar pattern of the gate electrodes, the source electrodes, the drain electrodes, and the third nitride semiconductor layer of the nitride semiconductor device 1 of FIG. 1. FIG. 16 is a sectional view taken along line XVI-XVI of FIG. 15. FIG. 17 is a sectional view taken along line XVII-XVII of FIG. 15. In FIG. 15 to FIG. 17, portions corresponding to respective portions in FIG. 1 described above are indicated with the same reference signs attached as in FIG. 1.

For convenience of description, in the following, a right/left direction of the sheet surface of FIG. 15 shall be referred to as the right/left direction and an up/down direction of the sheet surface of FIG. 15 shall be referred to as the front/rear direction in some cases. Also, a lower side of the sheet surface of FIG. 15 shall be referred to as the front and an upper side of the sheet surface of FIG. 15 shall be referred to as the rear in some cases. FIG. 15 shows in a cutout manner a region of a portion of the planar pattern of the gate electrodes, the source electrodes, the drain electrodes, and the third nitride semiconductor layer of the nitride semiconductor device 1 and in the nitride semiconductor device 1 as a whole, such a pattern continues further in the right/left direction and the front/rear direction. In the following, the region of rectangular shape in plan view that is illustrated in FIG. 15 shall be referred to as the “cutout region.”

The nitride semiconductor device 1 includes a laminated semiconductor structure and an electrode metal structure that is disposed on the laminated semiconductor structure. As shown in FIG. 16 and FIG. 17, the laminated semiconductor structure includes the substrate 2, the buffer layer 3 that is formed on the front surface of the substrate 2, the first nitride semiconductor layer 4 that is epitaxially grown on the buffer layer 3, the second nitride semiconductor layer 5 that is epitaxially grown on the first nitride semiconductor layer 4, and the third nitride semiconductor layer 6 that is epitaxially grown on the second nitride semiconductor layer 5.

The nitride semiconductor device 1 has, in the cutout region, a structure where a front half region and a rear half region are line symmetrical with respect to a straight line that passes through a front/rear center of the cutout region and extends to the right and left. The electrode metal structure of the front half region of the cutout region shall thus be described first.

As shown in FIG. 15, the electrode metal structure of the front half portion of the cutout region includes a plurality of the source electrodes 11, a plurality of the gate electrodes 7, and the drain electrode 12. The source electrodes 11 and the drain electrode 12 extend in the front/rear direction.

The gate electrodes 7 have a plurality of main gate electrode portions 7A that extend in parallel to each other in the front/rear direction and two base portions 7B that respectively couple corresponding end portions of the main gate electrode portions 7A. In FIG. 15, regions of the gate electrodes 7 are indicated by coloring in gray for clarification.

In plan view, a single source electrode 11 is constituted of a main source electrode portion 11A that is disposed between two adjacent main gate electrode portions 7A and a source field plate portion 11B in a periphery of the main source electrode portion 11A (see FIG. 16). As shown in FIG. 16, the source field plate portion 11B covers a pair of the main gate electrode portions 7A that are disposed at both sides of the main source electrode portion 11A.

Although just a single drain electrode 12 is illustrated in the front half region of the cutout region, with the nitride semiconductor device 1 as a whole, a drain electrode 12 is disposed at each of both sides of a single source electrode 11. A drain electrode 12 and a main source electrode portion 11A that are mutually adjacent oppose each other across a main gate electrode portion 7A in plan view. In this preferred embodiment, a length of the drain electrode 12 is shorter than a length of the main source electrode portion 11A and when viewed from the right/left direction, both ends of the drain electrode 12 are positioned more toward a length center side of the main source electrode portion 11A than corresponding ends of the main source electrode portion 11A.

The main source electrode portions 11A (S), the main gate electrode portions 7A (G), and the drain electrodes 12 (D) are disposed periodically in an order of GSGDGSGD in the right/left direction. Thereby, an element structure is arranged by the main source electrode portion 11A (S) and the drain electrode 12 (D) sandwiching the main gate electrode portion 7A (G).

The electrode metal structure of the rear half region of the cutout region is the same as electrode metal structure of the front half region of the cutout region. The base portion 7B at the rear side of the gate electrode 7 in the front half region of the cutout region and the base portion 7B at the front side of the gate electrode 7 in the rear half region of the cutout region are connected. In FIG. 15, these base portions 7B are treated as a single base portion 7B. That is, the gate electrode 7 in the front half region and the gate electrode 7 in the rear half region are formed integrally.

Also, a rear end portion of the source field plate portion 11B of the source electrode 11 in the front half region of the cutout region and a front end portion of the source field plate portion 3B of the source electrode 11 in the rear half region of the nitride semiconductor device 1 are connected. That is, the source electrode 11 in the front half region and the source electrode 11 in the rear half region are formed integrally.

A region of a front surface of the laminated semiconductor structure is constituted of active regions 101 that contribute to transistor operation and nonactive regions 102 that do not contribute to transistor operation. In this preferred embodiment, the active regions 101 shall refer to regions in each of which a current flows between the source and the drain when an on voltage is applied to the gate electrode 7.

The third nitride semiconductor layer 6 has substantially the same shape as the gate electrodes 7 in plan view. Specifically, the third nitride semiconductor layer 6 has a plurality of the ridge portions 61 that extend in parallel to each other in a longitudinal direction, two coupling portions 64 (see FIG. 17) that respectively couple corresponding end portions of the ridge portions 61, and the extension portions 62 and 63 that extend outward from the side surfaces of the ridge portions 61. The extension portions 62 and 63 include the source side extension portions 62 and the drain side extension portions 63. The gate electrodes 7 are formed on the ridge portions 61. In FIG. 15, regions of the extension portions 62 and 63 are indicated with dots added for clarification. In FIG. 16 and FIG. 17, the cross-sectional shapes of the extension portions 62 and 63 are drawn in simplified form and these are therefore drawn as being uniform in thickness. The same applies to FIG. 19 to be described later.

The coupling portion 64 at the rear side of the ridge portion 61 in the front half region of the cutout region and the coupling portion 64 at the front side of the ridge portion 61 in the rear half region of the cutout region are connected. In FIG. 15, these coupling portions 64 are handled as a single coupling portion 64.

As shown in FIG. 15, the extension portions 62 and 63 may be formed on the side surfaces of the ridge portions 61 even in the nonactive regions 102. Also, as shown in FIG. 15 and FIG. 17, the drain side extension portions 63 may be formed even on side surfaces of the coupling portions 64. The extension portions 62 and 63 formed in the nonactive regions 102 are an example of a "nonactive extension portion" of the present disclosure.

Figure 18:
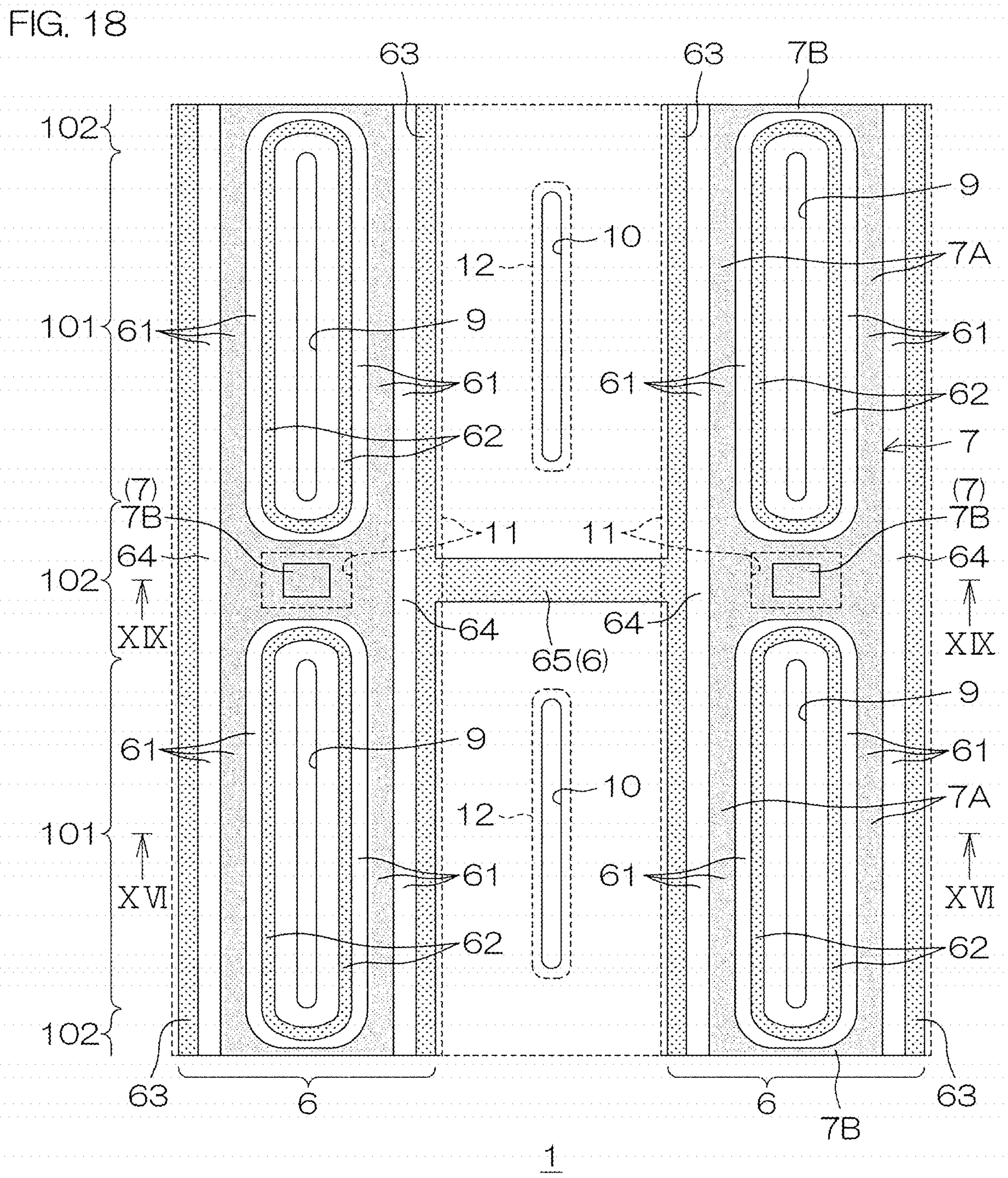
FIG. 18 is an illustrative plan view of another example of the planar pattern of the gate electrodes, the source electrodes, the drain electrodes, and the third nitride semiconductor layer of the nitride semiconductor device of FIG. 15.
Figure 19:
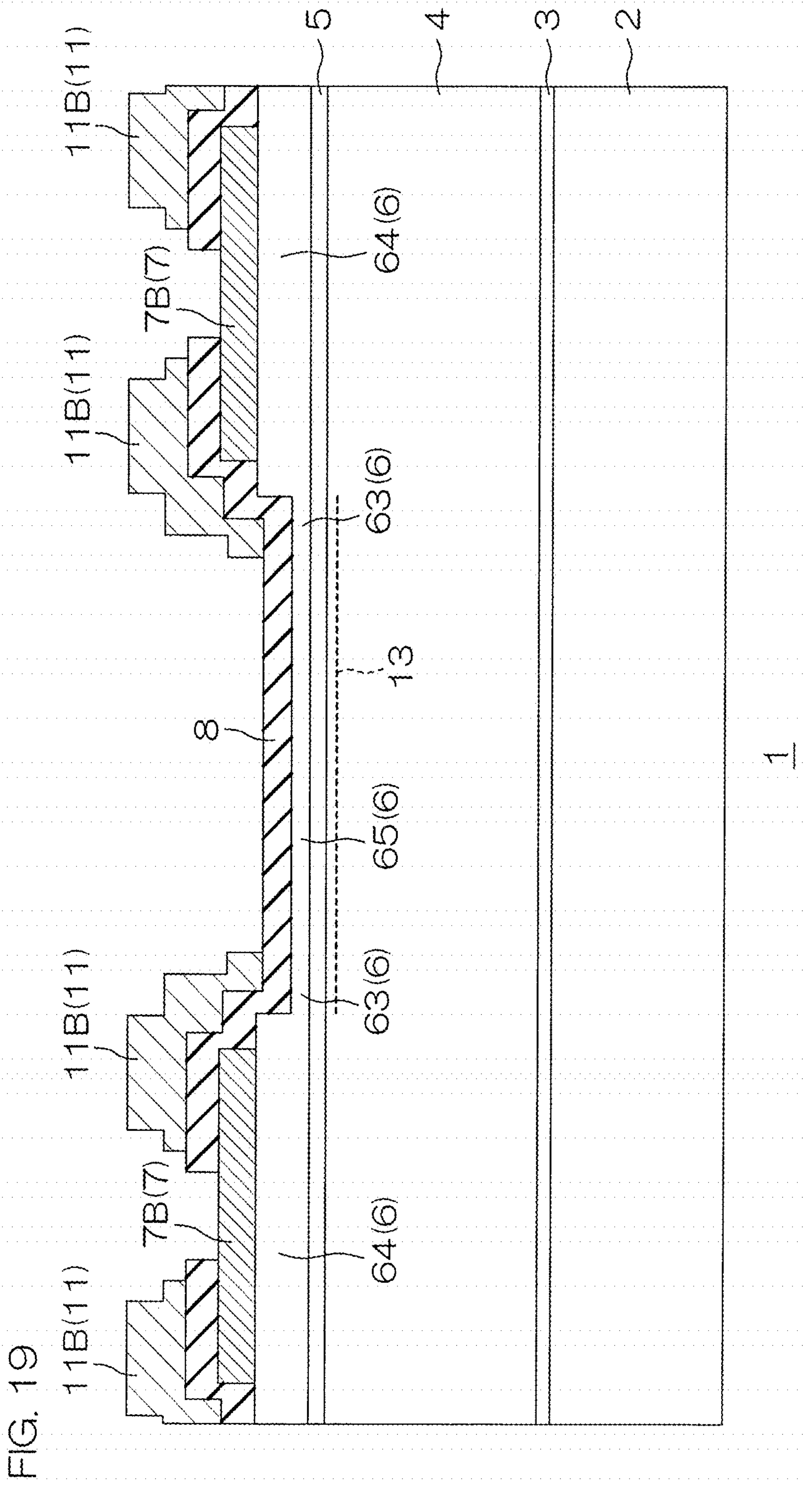
FIG. 19 is a sectional view taken along line XIX-XIX of FIG. 18.

FIG. 18 is an illustrative plan view of another example of the planar pattern of the gate electrodes, the source electrodes, the drain electrodes, and the third nitride semiconductor layer of the nitride semiconductor device 1 of FIG. 1. FIG. 19 is a sectional view taken along line XIX-XIX of FIG. 18. In FIG. 18, portions corresponding to respective portions in FIG. 15 described above are indicated with the same reference signs attached as in FIG. 15. In FIG. 19, portions corresponding to respective portions in FIG. 17 described above are indicated with the same reference signs attached as in FIG. 17. Also, FIG. 16 described above is a sectional view taken along line XVI-XVI of FIG. 18 as well.

The nitride semiconductor device 1 shown in FIG. 18, FIG. 16, and FIG. 19 differs from the nitride semiconductor device 1 shown in FIG. 15, FIG. 16, and FIG. 17 just in a point that the third nitride semiconductor layer 6 has a connecting extension portion 65 that connect the drain side extension portions 63 at the right and left in a nonactive region of front/rear central portion of the nitride semiconductor device 1. The connecting extension portion 65 is an example of the "nonactive extension portion" of the present disclosure.

With the nitride semiconductor device 1 shown in FIG. 18, a total surface area of the extension portions are increased in comparison to the nitride semiconductor device 1 shown in FIG. 15 and therefore, the density of the holes that accumulate at the interface between the third nitride semiconductor layer 6 and the second nitride semiconductor layer 5 (see FIG. 5) is decreased. Thereby, the gate leak current can be reduced further.

Each of FIG. 20, FIG. 21, FIG. 22, and FIG. 23 is an illustrative plan view of yet another modification example of the planar pattern of the third nitride semiconductor layer. FIG. 20, FIG. 21, FIG. 22, and FIG. 23 are plan views that show a region corresponding to a region of a left half of a front half of FIG. 15. However, for convenience of description, the widths of the extension portions 63 are drawn larger than in FIG. 15. In FIG. 20, FIG. 21, FIG. 22, and FIG. 23, portions corresponding to respective portions in FIG. 15 described above are indicated with the same reference signs attached as in FIG. 15.

Nitride semiconductor devices 1E, 1F, 1G, and 1H shown in FIG. 20, FIG. 21, FIG. 22, and FIG. 23 differ from the nitride semiconductor device 1 of FIG. 1 in a point that opening portions (notches 62E or 63E or holes 63F) that expose the second nitride semiconductor layer 5 are formed in at least either of the source side extension portions 62 and the drain side extension portions 63. The devices are the same as the nitride semiconductor device 1 of FIG. 1 in regard to other points.

Figure 20:
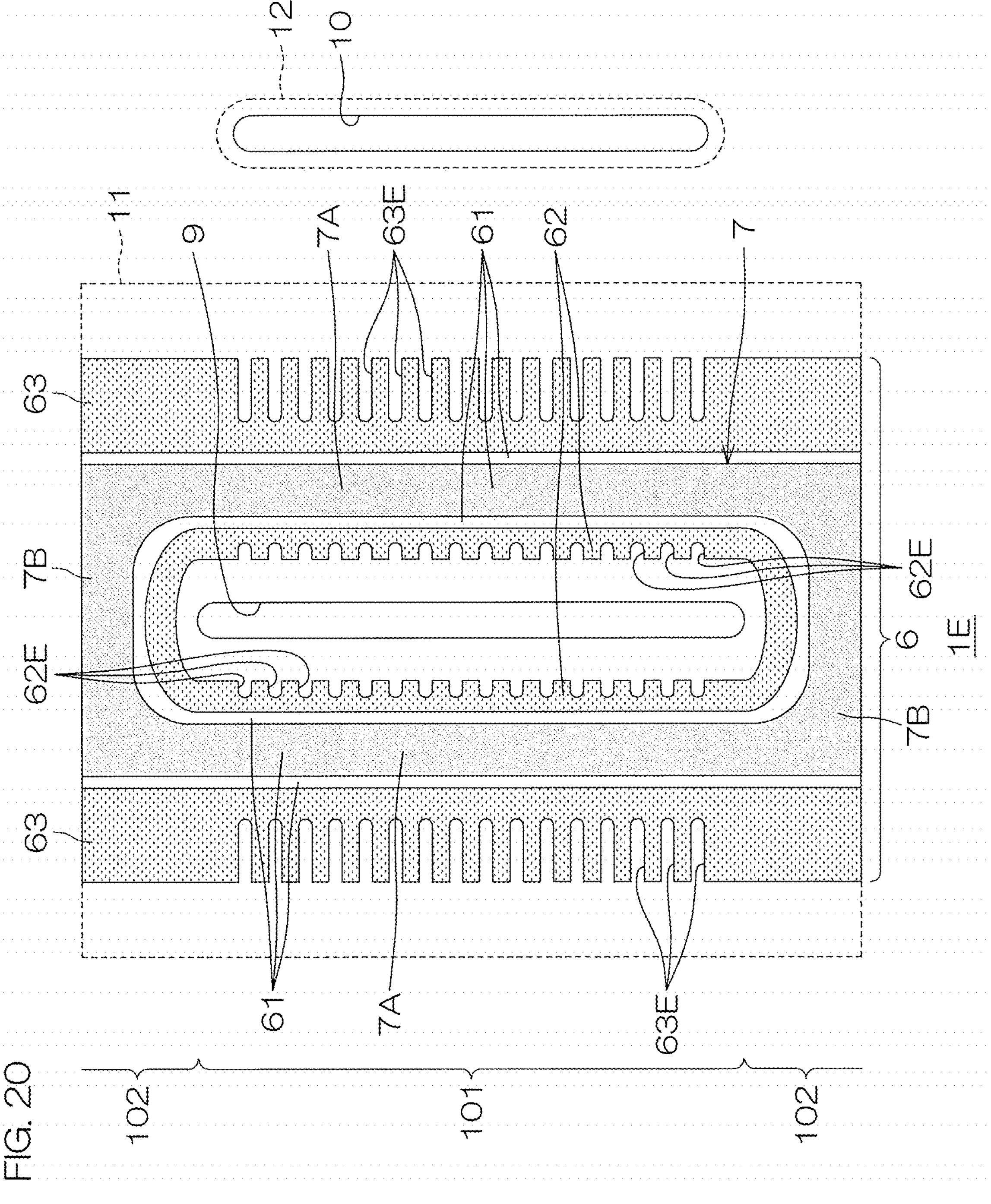
FIG. 20 is a plan view of yet another modification example of the planar pattern of the third nitride semiconductor layer.

With the nitride semiconductor device 1E shown in FIG. 20, in each source side extension portion 62, a plurality of the notches 62E that open at source contact hole 9 side edge portions are formed at intervals in the front/rear direction. That is, the source side extension portion 62 is formed to a comb shape having comb teeth that extend toward the source contact hole 9.

Also, in each drain side extension portion 63, a plurality of the notches 63E that open at a drain contact hole 10 side edge portion are formed at intervals in the front/rear direction. That is, the drain side extension portion 63 is formed to a comb shape having comb teeth that extend toward the drain contact hole 10.

Figure 21:
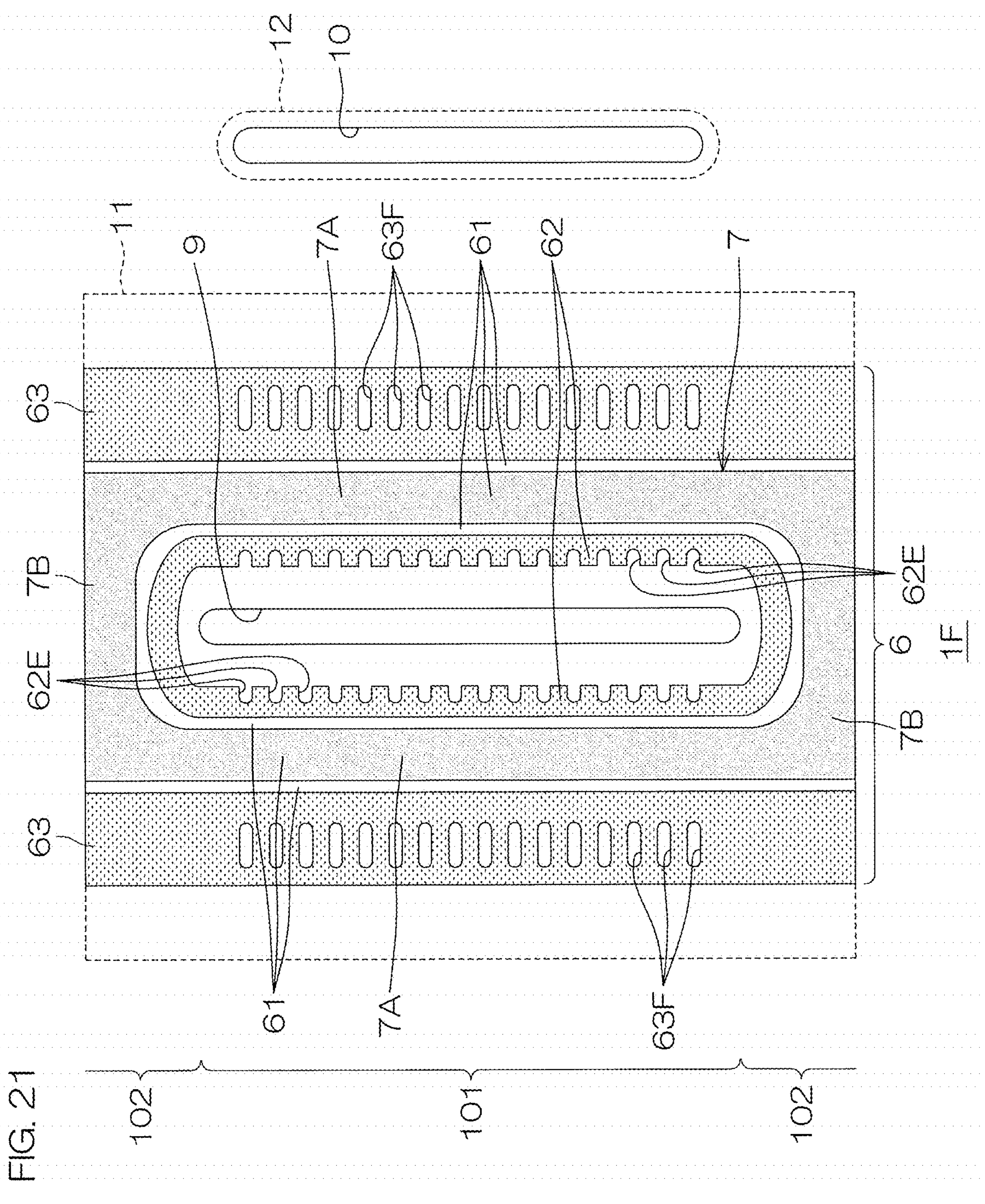
FIG. 21 is a plan view of yet another modification example of the planar pattern of the third nitride semiconductor layer.

With the nitride semiconductor device 1F shown in FIG. 21, as with the nitride semiconductor device 1E of FIG. 20, in each source side extension portion 62, the plurality of notches 62E that open at the source contact hole 9 side edge portions are formed at intervals in the front/rear direction.

On the other hand, in each drain side extension portion 63, the holes 63F that are long in the right/left direction are formed at intervals in the front rear direction.

Figure 22:
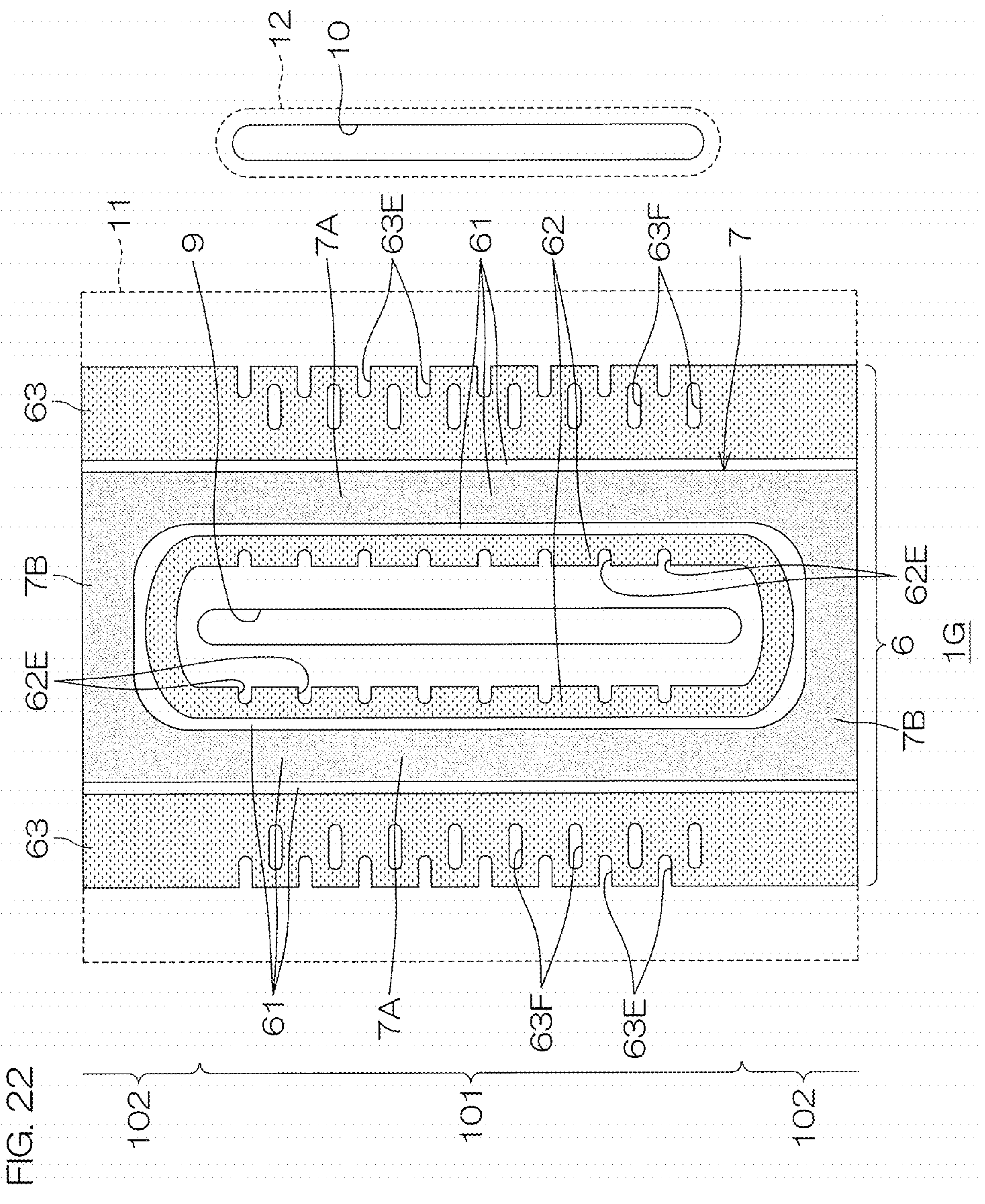
FIG. 22 is a plan view of yet another modification example of the planar pattern of the third nitride semiconductor layer.

With the nitride semiconductor device 1G shown in FIG. 22, as with the nitride semiconductor device 1E of FIG. 20, the pluralities of notches 62E and 63E are formed at intervals in the front/rear direction in the source side extension portions 62 and drain side extension portions 63, respectively. However, the interval between adjacent notches 62E and the interval between adjacent notches 63E are made wider in comparison to the nitride semiconductor device 1E shown in FIG. 20.

Further, in each drain side extension portion 63, the holes 63F that are long in the right/left direction are formed at positions between notches 63E that are adjacent in regard to front/rear direction position.

Figure 23:
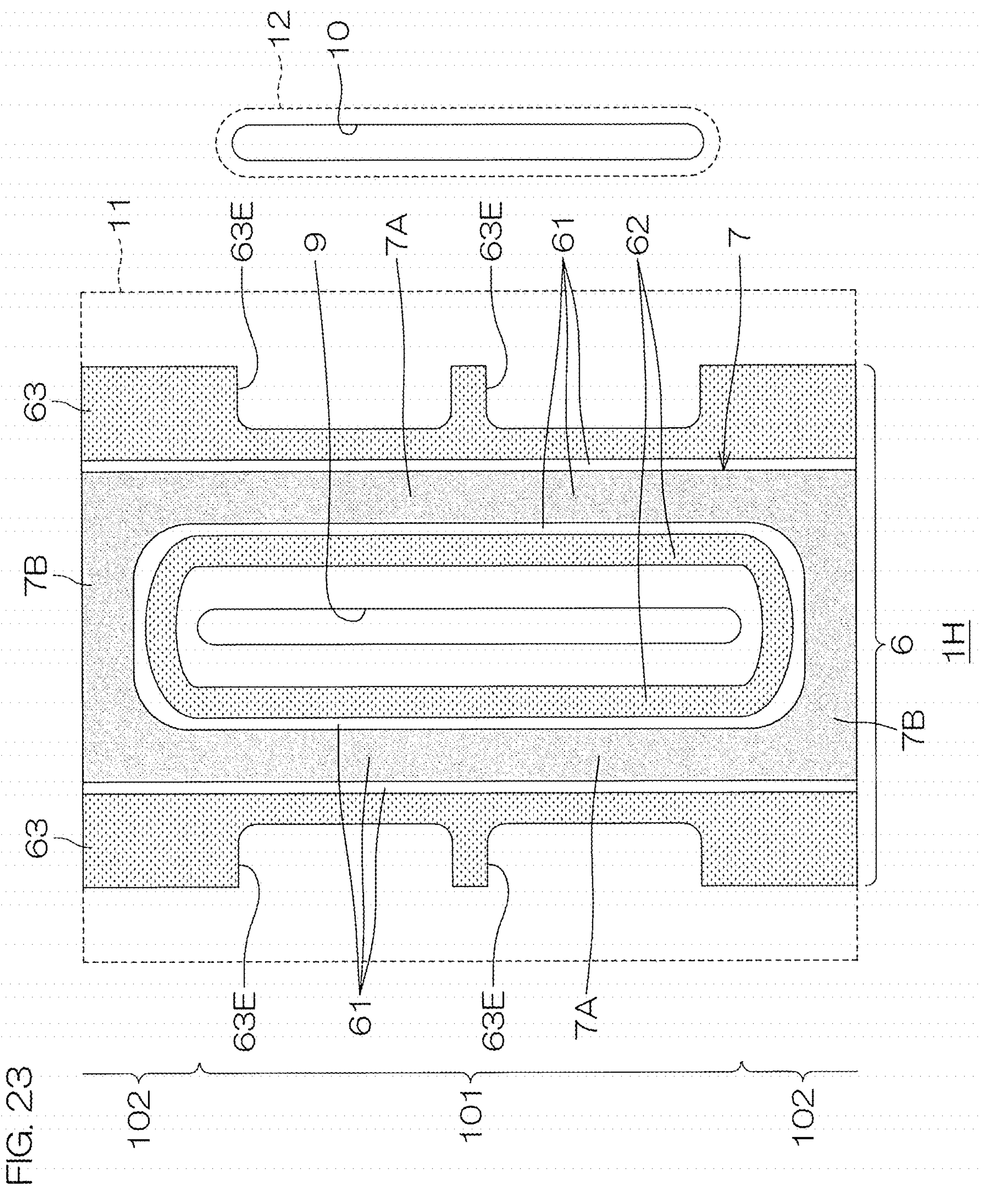
FIG. 23 is a plan view of yet another modification example of the planar pattern of the third nitride semiconductor layer.

With the nitride semiconductor device 1H shown in FIG. 23, the notches 62E are not formed in the source side extension portions 62. On the other hand, in each drain side extension portion 63, two notches 63E that open at the drain contact hole 10 side edge portion are formed at an interval in the front/rear direction. However, the notches 63E are formed such that a length in the front/rear direction is larger than a length in the front/rear direction of the notches 63E in the nitride semiconductor device 1E shown in FIG. 20.

With the nitride semiconductor devices 1E to 1H shown in FIG. 20 to FIG. 23, since opening portions are formed in at least either of the source side extension portions 62 and the drain side extension portions 63, there is an advantage over the nitride semiconductor device 1 shown in FIG. 1 and FIG. 15 that increase in on resistance can be suppressed even when the film thickness of the extension portions 62 and 63 become thicker than designed.

Figure 24:
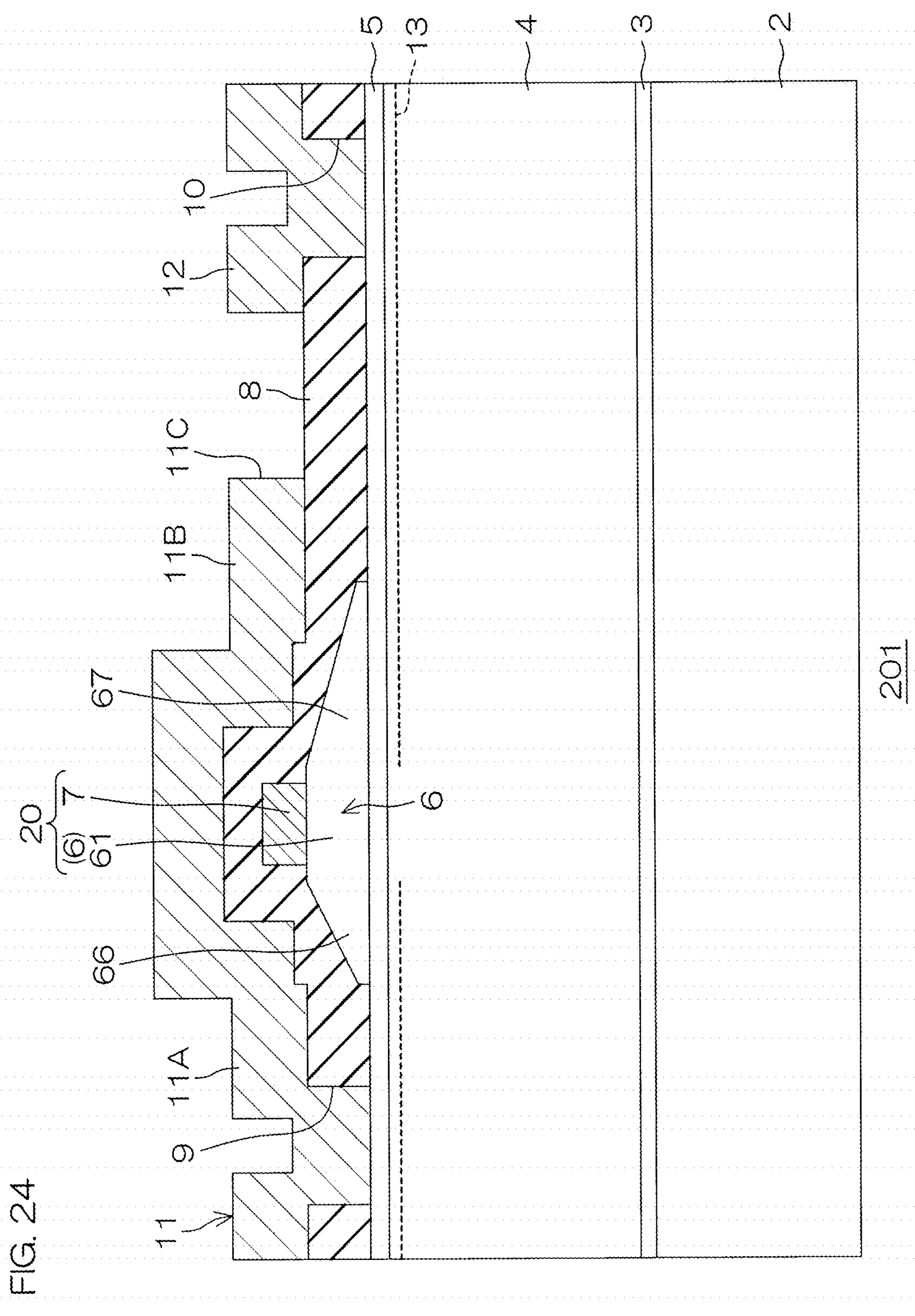
FIG. 24 is a sectional view of a first reference example.

FIG. 24 is a sectional view of an arrangement example (hereinafter referred to as "the first reference example") of a nitride semiconductor device by which the same effects as those of the preferred embodiments described above are obtained, although perhaps not as much as the preferred embodiments. In FIG. 24, portions corresponding to respective portions in FIG. 1 described above are indicated with the same reference signs attached as in FIG. 1.

With the nitride semiconductor device 201 according to the first reference example, the third nitride semiconductor layer 6 includes the ridge portion 61, a fourth extension portion 66 extending toward the source electrode side from one side at the source electrode 11 side of the ridge portion 61, and a fifth extension portion 67 extending toward the drain electrode side from one side at the drain electrode 12 side of the ridge portion 61. The fourth extension portion 66 has an inclined surface such that a film thickness gradually decreases toward the source electrode side from a side edge at the source electrode side of a front surface (upper surface) of the ridge portion 61. The fourth extension portion 67 has an inclined surface such that a film thickness gradually decreases toward the drain electrode side from a side edge at the drain electrode side of the front surface (upper surface) of the ridge portion 61. That is, the third nitride semiconductor layer 6 has a lateral cross section of trapezoidal shape.

Although perhaps not as much as the preferred embodiments, the nitride semiconductor device 201 exhibits the effects of enabling the suppression of current collapse, enabling the suppression of decrease in withstand voltage, and enabling the suppression of gate leak current by the same reason as the preferred embodiments.

Here, either of the fourth extension portion 66 and the fifth extension portion 67 of FIG. 24 may be omitted. In other words, it suffices that at least either of the fourth extension portion 66 and the fifth extension portion 67 be present.

Figure 25:
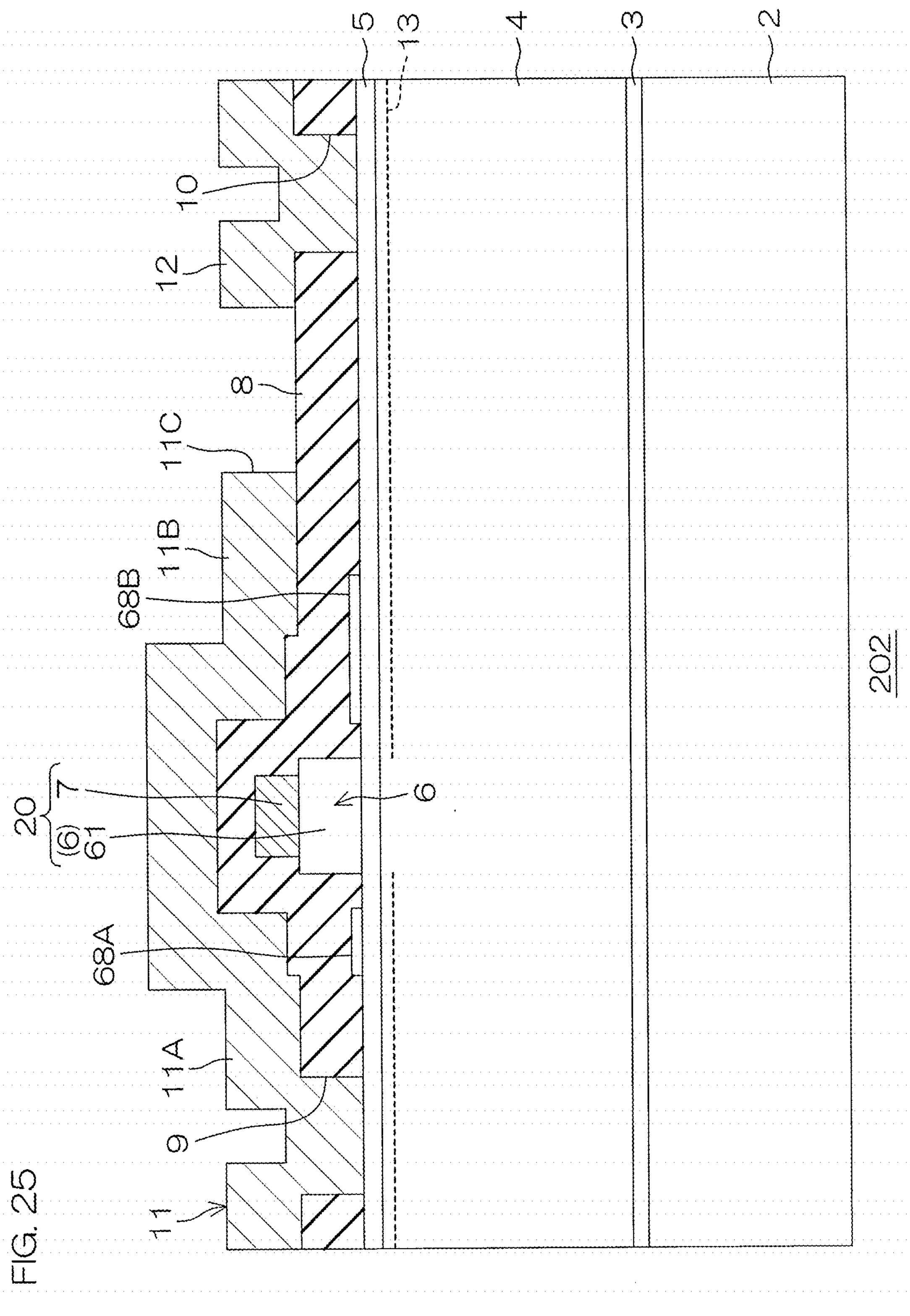
FIG. 25 is a sectional view of a second reference example.

FIG. 25 is a sectional view of another arrangement example (hereinafter referred to as "the second reference example") of a nitride semiconductor device by which the same effects as those of the preferred embodiments described above are obtained, although perhaps not as much as the preferred embodiments. In FIG. 25, portions corresponding to respective portions in FIG. 1 described above are indicated with the same reference signs attached as in FIG. 1.

With the nitride semiconductor device 202 according to the second reference example, the third nitride semiconductor layer 6 includes the ridge portion 61, a first separated portion 68A that is formed between the ridge portion 61 and the source contact hole 9 in plan view, and a second separated portion 68B that is formed between the ridge portion 61 and the drain electrode side end 11C of the source field plate portion 11B in plan view.

A film thickness of the first separated portion 68A is thinner than the film thickness of the ridge portion 61. With the example of FIG. 21, the film thickness of the first separated portion 68A and the second separated portion 68B is substantially equal to the film thickness of the extension portions 62 and 63 (in detail, the flat portions 62B and 63B) of FIG. 1.

Although perhaps not as much as the preferred embodiments, the nitride semiconductor device 202 exhibits the effects of enabling the suppression of current collapse, enabling the suppression of decrease in withstand voltage, and enabling the suppression of gate leak current by the same reason as the preferred embodiments.

Here, either of the first separated portion 68A and the second separated portion 68B of FIG. 25 may be omitted. In other words, it suffices that at least either of the first separated portion 68A and the second separated portion 68B be present.

Figure 27:
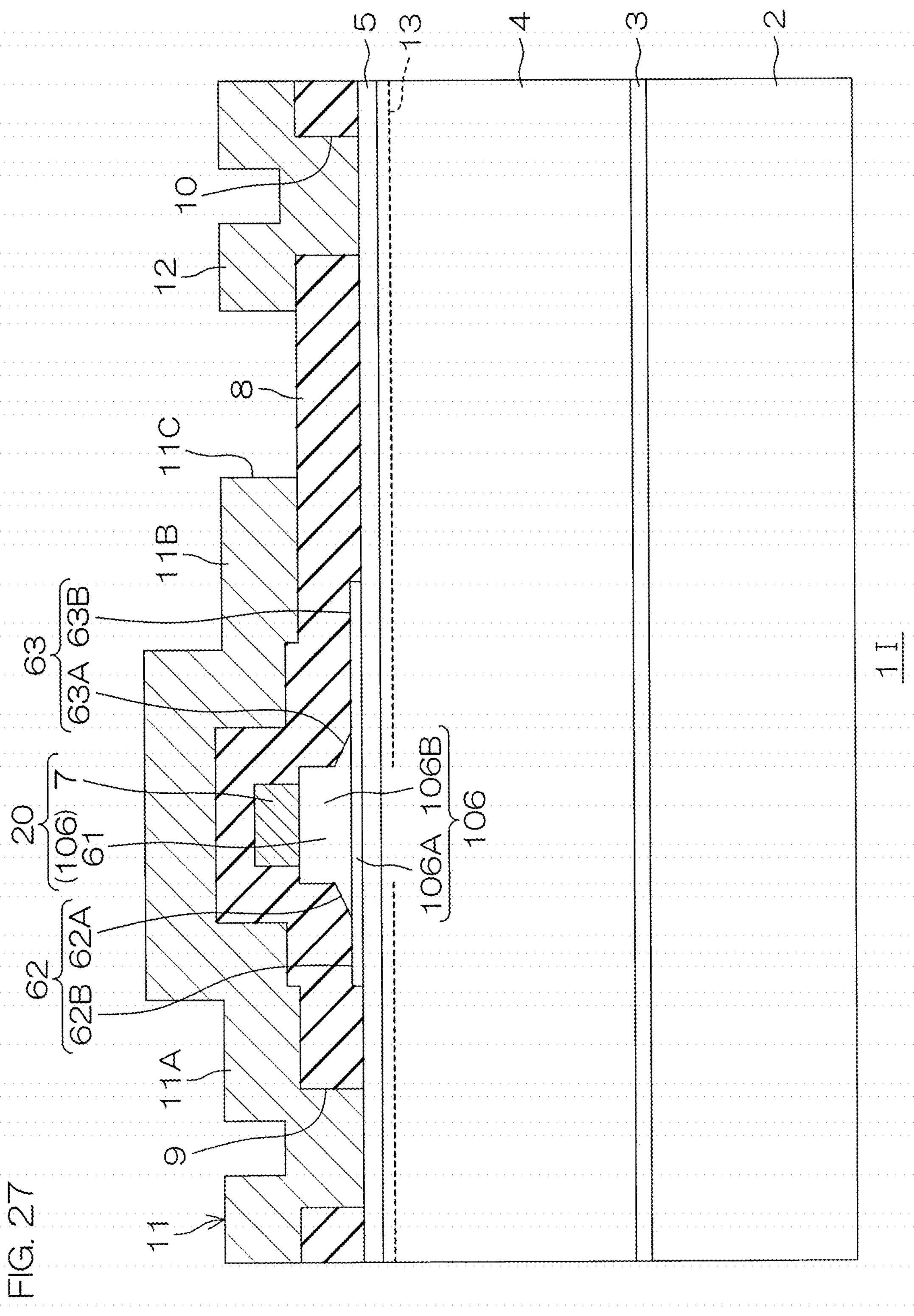
FIG. 27 is a sectional view for describing the arrangement of a nitride semiconductor device according to a sixth preferred embodiment of the present disclosure.

FIG. 27 is a sectional view for describing the arrangement of a nitride semiconductor device according to a sixth preferred embodiment of the present disclosure. In FIG. 27, portions corresponding to respective portions in FIG. 1 described above are indicated with the same reference signs attached as in FIG. 1.

With the nitride semiconductor device 1I according to the sixth preferred embodiment, a third nitride semiconductor layer 106 is constituted of a first semiconductor region 106A at a lower layer side and a second semiconductor region 106B at an upper layer side. A boundary between the first semiconductor region 106A and the second semiconductor region 106B may, in the sectional view of FIG. 27, be a straight line joining the front surface (upper surface) of the flat portion 62B and the front surface (upper surface) of the flat portion 63B (straight line joining a lower end of the front surface of the tapered portion 62A and a lower end of the front surface of the tapered portion 63A) or may be a straight line joining an upper end of the front surface of the tapered portion 62A and an upper end of the front surface of the tapered portion 63A.

Preferably, the first semiconductor region is constituted of $Al_vGa_{1-v}N$, the second semiconductor region is constituted of $Al_wGa_{1-w}N$, and $v>w\geq 0$. As one preferred embodiment, the first semiconductor region 106A is of $Al_{0.1}Ga_{0.9}N$ and the second semiconductor region 106B is GaN. Also, the second nitride semiconductor layer 5 is $Al_{0.2}Ga_{0.8}N$.

By arranging thus, the second semiconductor region 106B can be selectively etched with respect to the first semiconductor region 106A and the first semiconductor region 106A can be selectively etched with respect to the second nitride semiconductor layer 5. A chlorine-based gas is generally used in performing dry etching of a GaN-based material and by adding oxygen, an etching rate of AlGaN with respect to GaN is decreased. Also, as an Al composition of AlGaN increases, the etching rate decreases. By using the selective etching, the structure of the nitride semiconductor device 1I according to the sixth preferred embodiment can be realized comparatively easily and a yield in a manufacturing process is also increased. Further, by making the first semiconductor region 106A higher in Al composition than the second semiconductor region 106B, a bandgap at the interface with respect to the second nitride semiconductor layer 5 is increased and therefore, effects of increasing dielectric breakdown field and increasing gate withstand voltage are also provided.

Here, although an acceptor type impurity is contained in the second semiconductor region 106B, an acceptor type impurity does not have to be contained in the first semiconductor region 106A. If an acceptor type impurity is practically not contained in the first semiconductor region 106A, the decrease in the sheet carrier densities of the two-dimensional electron gas directly below the extension portions 62B and 63B in FIG. 27 can be suppressed and therefore, the threshold $V_{th}$ can be increased and the gate resistance can be increased without increasing the on resistance.

Also, a material of the separated portions 68 in FIG. 12 and the separated portion 68 in FIG. 13 can be made the same material as that of the first semiconductor region 106A in FIG. 27 (not shown). By arranging thus, a low contact resistance can be obtained with stability in the step of forming the source electrode 11 and the drain electrode 12. Regarding a reason for this, whereas ordinarily, the source contact hole 9 and the drain contact hole 10 are formed by dry etching the insulating film 8 by a fluorine-based gas, when fluorine enters into GaN and AlGaN, the materials become high in resistance and therefore, the contact resistance increases.

With the present arrangement, the same material as the first semiconductor region 106A that is present at locations at which the source electrode 11 and the drain electrode 12 are to be formed can be removed, even if fluorine was introduced thereinto, by etching using a gas system that does not use fluorine. Consequently, fluorine will not be introduced into the second nitride semiconductor layer 5 at the locations at which the source electrode 11 and the drain electrode 12 are to be formed. Low contact resistance can thus be obtained for the source electrode 11 and the drain electrode 12. The separated portions 68 shown in FIG. 12 are formed at peripheries of the source electrode 11 and the drain electrode 12.

Although the first to sixth preferred embodiments of the present disclosure have been described above, the present disclosure can be implemented in yet other preferred embodiments. With the first to sixth preferred embodiments described above, the third nitride semiconductor layer 6 has the source side extension portion 62 and the drain side extension portion 63. However, either of the source side extension portion 62 and the drain side extension portion 63 may be omitted. In other words, it suffices that at least either of the source side extension portion 62 and the drain side extension portion 63 be present.

Also, although the source side extension portion 62 and the drain side extension portion 63 have the tapered portion 62A and the tapered portion 63A, as with the flat portions 62B and 63B, the tapered portions 62A and 63A may be formed to flat portions of fixed thickness instead. In this case, an overall thickness of the tapered portions 62A and 63A may be substantially the same thickness as the flat portions 62B and 63B.

Also, with the preferred embodiments described above, the source electrode 11 and the drain electrode 12 are formed on the passivation film 8. However, a barriertal metal film may be formed on the passivation film 8 and the source electrode 11 and the drain electrode 12 may be formed on the barriertal metal film instead. In this case, a penetrating hole in communication with the source contact hole 9 and a penetrating hole in communication with the drain contact hole 10 are formed in the barriertal metal film. The barrier metal film is a barrier film for preventing a metal material constituting the source electrode 11 and the drain electrode 12 from diffusing into the passivation film 8.

Although with the preferred embodiments described above, silicon, etc., were given as material examples of the substrate 2, any substrate material besides the above, such as a sapphire substrate, a QST substrate, etc., can be applied instead.

While preferred embodiments of the present disclosure were described in detail above, these are merely specific examples used to clarify the technical contents of the present disclosure and the present disclosure should not be interpreted as being limited to these specific examples and the scope of the present disclosure is limited only by the appended claims.

REFERENCE SIGNS LIST

1, 1A, 1B, 1C, 1D, 1E, IF, 1G, 1H, 1I nitride semiconductor device
2 substrate
3 buffer layer
4 first nitride semiconductor layer
5 second nitride semiconductor layer
6 third nitride semiconductor layer
7 gate electrode
7A main gate electrode portion
7B base portion
8 passivation film
9 source contact hole (first opening portion)
10 drain contact hole (second opening portion)
11 source electrode
11A main source electrode portion
11B source field plate portion
11C drain electrode side end of source field plate portion
12 drain electrode
13 two-dimensional electron gas
20 gate portion
51 first portion
52 second portion
61 ridge portion
62 source side extension portion (first extension portion)
63 drain side extension portion (second extension portion)
62A, 62G, 63A, 63G tapered portion
62B, 63B flat portion
62C, 63C first flat portion
62D, 63D second flat portion
62E, 63E notch
63F hole
64 coupling portion

65 connecting extension portion
66 fourth extension portion
67 fifth extension portion
68 separated portion
68A, 68B separated portion
71 third semiconductor material film
72 gate electrode film
73 first insulating film
74, 77 second insulating film
75 third insulating film
76 source/drain electrode film
82 source side thin film portion
83 drain side thin film portion
82A, 83A tapered portion
82B, 83B flat portion
91 thick film portion
92 thin film portion
106 third nitride semiconductor layer
106A first semiconductor region
106B second semiconductor region

The invention claimed is:

1. A nitride semiconductor device comprising:

a first nitride semiconductor layer that constitutes an electron transit layer;

a second nitride semiconductor layer that is formed above the first nitride semiconductor layer, is greater in bandgap than the first nitride semiconductor layer, and constitutes an electron supply layer;

a third nitride semiconductor layer that is formed selectively above the second nitride semiconductor layer, the third nitride semiconductor layer having a ridge portion of a ridge shape that contains an acceptor type impurity;

a gate electrode that is formed above the ridge portion;

a passivation film that is disposed on the second nitride semiconductor layer, the third nitride semiconductor layer, and the gate electrode and has a first opening portion and a second opening portion that are disposed across the ridge portion from each other;

a source electrode that is in contact with the second nitride semiconductor layer via the first opening portion and with which a portion is formed above the passivation film; and a drain electrode that is in contact with the second nitride semiconductor layer via the second opening portion and with which a portion is formed above the passivation film such as to oppose the source electrode across the ridge portion; and wherein the third nitride semiconductor layer has, between the ridge portion side end of the first opening portion and the first opening portion side end of the ridge portion and/or between the ridge portion side end of the drain electrode and the second opening portion side end of the ridge portion, an extension portion that extends outward from a portion below a thickness intermediate position of at least one side surface of the ridge portion, and an upper portion of at least one of the first opening portion side end of the ridge portion and the second opening portion side end of the ridge portion is in contact with the passivation film, and a lower portion thereof is in contact with the extension portion.

2. The nitride semiconductor device according to claim 1, wherein the source electrode is formed above the passivation film such as to cover a portion of the gate electrode, the second opening portion side end of the source electrode is positioned between the ridge portion and the second opening portion in plan view, and the third nitride semiconductor layer has, between the ridge portion side end of the first opening portion and the second opening portion end of the source electrode, the extension portion that extends outward from the portion below the thickness intermediate position of at least one side surface of the ridge portion.

3. The nitride semiconductor device according to claim 1, wherein the extension portion includes a first extension portion that extends toward the first opening portion from a side surface of the ridge portion at the first opening portion side.

4. The nitride semiconductor device according to claim 1, wherein the extension portion includes a second extension portion that extends toward the second opening portion from a side surface of the ridge portion at the second opening portion side.

5. The nitride semiconductor device according to claim 1, wherein the extension portion includes a first extension portion that extends toward the first opening portion from a side surface of the ridge portion at the first opening portion side and a second extension portion that extends toward the second opening portion from a side surface of the ridge portion at the second opening portion side.

6. The nitride semiconductor device according to claim 1, wherein the third nitride semiconductor layer includes a pair of the ridge portions that are disposed opposite each other across the first opening portion and a coupling portion that couples corresponding end portions of the pair of ridge portions to each other and the extension portion includes, in a nonactive region, a nonactive extension portion that extends outward from a portion below a thickness intermediate position of a side surface of the pair of ridge portions or the coupling portion.

7. The nitride semiconductor device according to claim 3, wherein a length of the first extension portion is not less than 0.3 times and not more than 0.9 times a width of the ridge portion.

8. The nitride semiconductor device according to claim 4, wherein a length of the second extension portion is not less than 0.7 times and not more than 2.0 times a width of the ridge portion.

9. The nitride semiconductor device according to claim 4, wherein a length of the second extension portion is not less than 0.7 times and not more than 1.5 times a width of the ridge portion.

10. The nitride semiconductor device according to claim 5, wherein a length of the first extension portion is not less than 0.3 times and not more than 0.9 times a width of the ridge portion and a length of the second extension portion is not less than 0.7 times and not more than 2.0 times the width of the ridge portion.

11. The nitride semiconductor device according to claim 5, wherein lengths, in a width direction of a cross section of the ridge portion, of the first extension portion and the second extension portion differ from each other.

12. The nitride semiconductor device according to claim 11, wherein a length, in a width direction of a cross section of the ridge portion, of the second extension portion is longer than a length, in a width direction of a cross section of the ridge portion, of the first extension portion.

13. The nitride semiconductor device according to claim 1, wherein an average concentration of the acceptor type impurity in the extension portion is lower than an average concentration of the acceptor type impurity in the ridge portion.

14. The nitride semiconductor device according to claim 1, wherein the acceptor type impurity is practically not contained in the extension portion.

15. The nitride semiconductor device according to claim 1, wherein a film thickness of the extension portion is not more than 25 nm.

16. The nitride semiconductor device according to claim 1, wherein a film thickness of the extension portion is not more than 15 nm.

17. The nitride semiconductor device according to claim 15, wherein a film thickness of the extension portion is not less than 3 nm.

18. The nitride semiconductor device according to claim 1, wherein a film thickness of the extension portion is not more than ⅕ of a film thickness of the ridge portion.

19. The nitride semiconductor device according to claim 1, wherein a film thickness of the extension portion is not more than ⅐ of a film thickness of the ridge portion.

20. The nitride semiconductor device according to claim 5, wherein the first extension portion or the second extension portion has a first tapered portion at a junction portion with the ridge portion and a taper angle of the first tapered portion with respect to a front surface of the second nitride semiconductor layer is not more than 45 degrees.

21. The nitride semiconductor device according to claim 20, wherein the first extension portion or the second extension portion has a second tapered portion at a tip portion and a taper angle of the second tapered portion with respect to the front surface of the second nitride semiconductor layer is not less than 30 degrees and not more than 80 degrees.

22. The nitride semiconductor device according to claim 5, wherein the first extension portion or the second extension portion has a thick film portion that extends outward from a region below a thickness intermediate portion of a side surface of the ridge portion and a thin film portion that extends outward from a region below a thickness intermediate portion of a side surface of the thick film portion.

23. The nitride semiconductor device according to claim 1, wherein the third nitride semiconductor layer has a separated portion that is not in contact with the ridge portion and the extension portion and is substantially equal in film thickness to the extension portion.

24. The nitride semiconductor device according to claim 4, wherein the third nitride semiconductor layer has a separated portion that is not in contact with the ridge portion and the extension portion and is substantially equal in film thickness to the extension portion and the separated portion is present at least between the second extension portion and the second opening portion.

25. The nitride semiconductor device according to claim 23, wherein the separated portion includes a source side separated portion in contact with the source electrode and a drain side separated portion in contact with the drain electrode.

26. The nitride semiconductor device according to claim 1, wherein, in comparison to a film thickness of a first portion that is a portion of the second nitride semiconductor layer above which the third nitride semiconductor layer is present, a film thickness of a second portion of the second nitride semiconductor layer above which the third nitride semiconductor layer is not present is thinner.

27. The nitride semiconductor device according to claim 26, wherein a difference between the film thickness of the first portion and the film thickness of the second portion is not more than 3 nm.

28. The nitride semiconductor device according to claim 1, wherein a third opening portion that exposes a front surface of the second nitride semiconductor layer is formed in the extension portion.

29. The nitride semiconductor device according to claim 1, wherein the first nitride semiconductor layer is constituted of a GaN layer, the second nitride semiconductor layer is constituted of an $Al_xGa_{(1-x)}N$ (0.1>x>0.3) layer, the third nitride semiconductor layer is constituted of a p type GaN layer, and the acceptor type impurity is constituted of Mg or Zn.

30. The nitride semiconductor device according to claim 1, wherein, if a region up to a predetermined height upward from a lower surface of the third nitride semiconductor layer is a lower layer portion, a region from an upper surface of the third nitride semiconductor layer to an upper surface of the lower layer portion is an upper layer portion, a thickness of the lower layer portion is X nm and a thickness of the upper layer portion is Y nm, a first condition that an average acceptor concentration of the lower layer portion is not more than $1\times10^{19}$ $cm^{-3}$ and an average acceptor concentration of the upper layer portion is greater than $1\times10^{19}$ $cm^{-3}$ and a second condition that 5 nm≤X≤40 nm and 70 nm≤Y≤145 nm and 100 nm≤X+Y≤150 nm are satisfied.

31. The nitride semiconductor device according to claim 1, wherein the third nitride semiconductor layer is constituted of at least a first semiconductor region and a second semiconductor region that differ in bandgap and the extension portion includes the first semiconductor region.

32. The nitride semiconductor device according to claim 22, wherein the third nitride semiconductor layer is constituted of at least a first semiconductor region and a second semiconductor region that differ in bandgap and the extension portion is constituted of the first semiconductor region.

33. The nitride semiconductor device according to claim 23, wherein the third nitride semiconductor layer is constituted of at least a first semiconductor region and a second semiconductor region that differ in bandgap and the separated portion is constituted of the first semiconductor region.

34. The nitride semiconductor device according to claim 31, wherein the bandgap of the first semiconductor region is greater than the bandgap of the second semiconductor region.

35. The nitride semiconductor device according to claim 31, wherein the first semiconductor region is constituted of $Al_vGa_{1-v}N$, the second semiconductor region is constituted of $Al_wGa_{1-w}N$, and v>w≥0.

36. A nitride semiconductor device comprising:

a first nitride semiconductor layer that constitutes an electron transit layer;

a second nitride semiconductor layer that is formed above the first nitride semiconductor layer, is greater in bandgap than the first nitride semiconductor layer, and constitutes an electron supply layer;

a third nitride semiconductor layer that is formed selectively above the second nitride semiconductor layer, the third nitride semiconductor layer having a ridge portion of a ridge shape that contains an acceptor type impurity;

a gate electrode that is formed above the ridge portion;

a passivation film that is disposed on the second nitride semiconductor layer, the third nitride semiconductor layer, and the gate electrode and has a first opening portion and a second opening portion that are disposed across the ridge portion from each other;

a source electrode that is in contact with the second nitride semiconductor layer via the first opening portion and with which a portion is formed above the passivation film; and a drain electrode that is in contact with the second nitride semiconductor layer via the second opening portion and with which a portion is formed above the passivation film such as to oppose the source electrode across the ridge portion; and wherein the third nitride semiconductor layer has, between the ridge portion side end of the first opening portion and the first opening portion side end of the ridge portion and/or between the ridge portion side end of the drain electrode and the second opening portion side end of the ridge portion, an extension portion that extends outward from a portion below a thickness intermediate position of at least one side surface of the ridge portion, and a separated portion that is not in contact with the ridge portion and the extension portion and is substantially equal in film thickness to the extension portion.

37. A nitride semiconductor device comprising:

a first nitride semiconductor layer that constitutes an electron transit layer;

a second nitride semiconductor layer that is formed above the first nitride semiconductor layer, is greater in bandgap than the first nitride semiconductor layer, and constitutes an electron supply layer;

a third nitride semiconductor layer that is formed selectively above the second nitride semiconductor layer, the third nitride semiconductor layer having a ridge portion of a ridge shape that contains an acceptor type impurity;

a gate electrode that is formed above the ridge portion;

a passivation film that is disposed on the second nitride semiconductor layer, the third nitride semiconductor layer, and the gate electrode and has a first opening portion and a second opening portion that are disposed across the ridge portion from each other;

a source electrode that is in contact with the second nitride semiconductor layer via the first opening portion and with which a portion is formed above the passivation film; and a drain electrode that is in contact with the second nitride semiconductor layer via the second opening portion and with which a portion is formed above the passivation film such as to oppose the source electrode across the ridge portion; and wherein the third nitride semiconductor layer has, between the ridge portion side end of the first opening portion and the first opening portion side end of the ridge portion and/or between the ridge portion side end of the drain electrode and the second opening portion side end of the ridge portion, an extension portion that extends outward from a portion below a thickness intermediate position of at least one side surface of the ridge portion, and wherein the third nitride semiconductor layer is constituted of at least a first semiconductor region and a second semiconductor region that differ in bandgap and the extension portion includes the first semiconductor region.

* * * * *